US009240237B2

(12) United States Patent
Otsuka et al.

(10) Patent No.: US 9,240,237 B2

(45) Date of Patent: Jan. 19, 2016

(54) SEMICONDUCTOR DEVICE AND METHOD OF WRITING/READING ENTRY ADDRESS INTO/FROM SEMICONDUCTOR DEVICE

(71) Applicant: NAGASE & CO., LTD., Osaka (JP)

(72) Inventors: Kanji Otsuka, Tokyo (JP); Yoichi Sato, Saitama (JP); Yutaka Akiyama, Tokyo (JP); Fumiaki Fujii, Tokyo (JP); Tatsuya Nagasawa, Kanagawa (JP); Minoru Uwai, Kanagawa (JP)

(73) Assignee: NAGASE & CO., LTD., Osaka (JP)

( * ) Notice: Subject to any disclaimer, the term of this patent is extended or adjusted under 35 U.S.C. 154(b) by 0 days.

(21) Appl. No.: 14/364,826

(22) PCT Filed: Dec. 26, 2013

(86) PCT No.: PCT/JP2013/084908
§ 371 (c)(1),
(2) Date: Jun. 12, 2014

(87) PCT Pub. No.: WO2014/141566
PCT Pub. Date: Sep. 18, 2014

(65) Prior Publication Data

US 2015/0070957 A1 Mar. 12, 2015

(30) Foreign Application Priority Data

Mar. 13, 2013 (JP) ................................ 2013-051050

(51) Int. Cl.
*G11C 15/04* (2006.01)
*G06F 17/30* (2006.01)
(Continued)

(52) U.S. Cl.
CPC ........ *G11C 15/046* (2013.01); *G06F 17/30982* (2013.01); *G11C 8/12* (2013.01); *G11C 15/02* (2013.01); *G11C 15/04* (2013.01)

(58) Field of Classification Search
None
See application file for complete search history.

(56) References Cited

U.S. PATENT DOCUMENTS

2002/0152352 A1* 10/2002 Ikegai et al. .................. 711/108
2004/0103236 A1 5/2004 Yoneda
2009/0006782 A1* 1/2009 Buchmann et al. ........... 711/154

FOREIGN PATENT DOCUMENTS

JP 54-068124 6/1979
JP 58-47798 10/1983

(Continued)

OTHER PUBLICATIONS

Japan Office action, dated Jun. 24, 2014 along with an English translation thereof.

(Continued)

*Primary Examiner* — Denise Tran
(74) *Attorney, Agent, or Firm* — Greenblum & Bernstein, P.L.C.

(57) ABSTRACT

The semiconductor device of the present invention includes a search memory mat having a configuration in which a location with which an entry address is registered is allocated in a y-axis direction, and key data is allocated in an x-axis direction and a control circuit connected to the search memory mat. In the search memory mat, a plurality of separate memories is formed such that a region to which the key data is allocated is separated into a plurality of regions along the y-axis direction. The control circuit includes an input unit to which the key data is input, a division unit which divides the key data input to the input unit into a plurality of pieces of key data, and a writing unit which allocates each piece of divided key data by the division unit into the separate memory using the divided key data as an address.

9 Claims, 45 Drawing Sheets

(51) Int. Cl.
*G11C 8/12* (2006.01)
*G11C 15/02* (2006.01)

(56) References Cited

FOREIGN PATENT DOCUMENTS

| | | |
|---|---|---|
| JP | 03-105444 | 5/1991 |
| JP | 03-058743 | 6/1991 |
| JP | 08-212790 | 8/1996 |
| JP | 10-197550 | 7/1998 |
| JP | 11-353322 | 12/1999 |
| JP | 2004-185792 | 7/2004 |

OTHER PUBLICATIONS

Japan Office action, dated Apr. 8, 2014 along with an English translation thereof.

* cited by examiner

ADDRESS DATA
102
102a
102b
102c
102d
102e
102f
104
EA
KD
2699
3779
1859
1440
101010001011
111011000011
011101000011
010110100000

Figure 15:
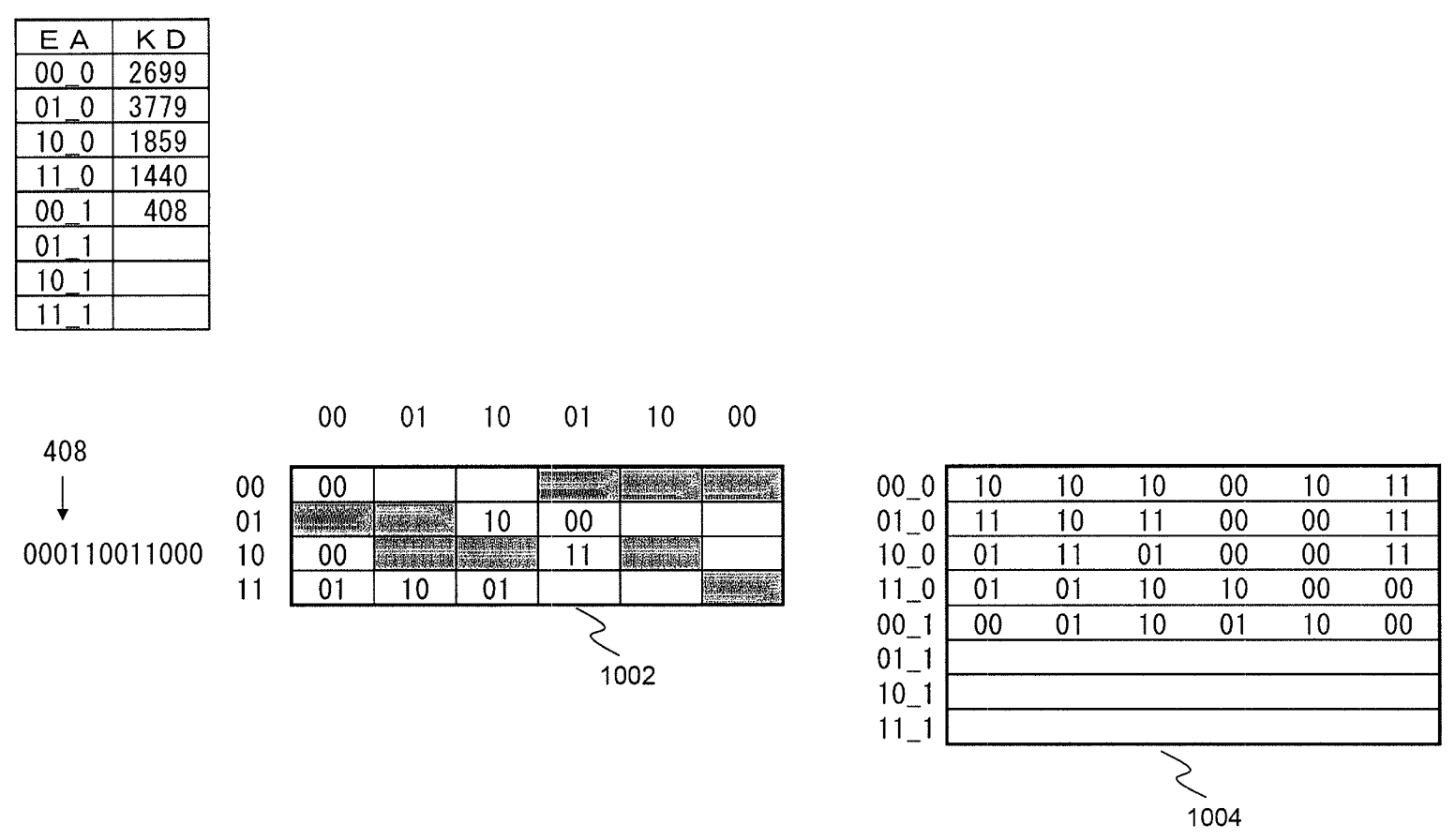

| E A | K D |
|---|---|
| 00_0 | 2699 |
| 01_0 | 3779 |
| 10_0 | 1859 |
| 11_0 | 1440 |
| 00_1 | 408 |
| 01_1 | |
| 10_1 | |
| 11_1 | |

408 → 000110011000

| | 00 | 01 | 10 | 01 | 10 | 00 |
|---|---|---|---|---|---|---|
| 00 | 00 | | | | | |
| 01 | | | 10 | 00 | | |
| 10 | 00 | | | 11 | | |
| 11 | 01 | 10 | 01 | | | |

1002

| | | | | | | |
|---|---|---|---|---|---|---|
| 00_0 | 10 | 10 | 10 | 00 | 10 | 11 |
| 01_0 | 11 | 10 | 11 | 00 | 00 | 11 |
| 10_0 | 01 | 11 | 01 | 00 | 00 | 11 |
| 11_0 | 01 | 01 | 10 | 10 | 00 | 00 |
| 00_1 | 00 | 01 | 10 | 01 | 10 | 00 |
| 01_1 | | | | | | |
| 10_1 | | | | | | |
| 11_1 | | | | | | |

| EA | KD |
|---|---|
| m, n, p | A |
| q | B |
| ... | ..., |

| EA | KD |
|---|---|
| m | A |

→

| q | B |
| ... | ..., |

| | DATA 0 | DATA 1 | DATA 1 |
|---|---|---|---|
| m | on_1 | n | X0 |
| n | on_0 | p | X1 |
| p | off_0 | 0 | X2 |
| q | off_0 | 0 | X2 |

| ORIGINAL INFORMATION (bit) | ENCODED BITS (bit) | TOTAL NUMBER OF BITS (bit) | CODE GENERATION PARAMETER (bit) | REMARKS |
|---|---|---|---|---|
| 28 | 6 | 34 | 1 | GF $(2^6)$ CODE |
| 28 | 12 | 40 | 2 | |
| 28 | 18 | 46 | 3 | |
| 28 | 24 | 52 | 4 | |
| 28 | 27 | 55 | 5 | |
| 28 | 33 | 61 | 6 | |
| 28 | 49 | 77 | 7 | GF $(2^7)$ CODE |
| 28 | 56 | 84 | 8 | |
| 28 | 56 | 84 | 9 | |
| 28 | 63 | 91 | 10 | |
| 28 | 70 | 98 | 11 | |
| 28 | 77 | 105 | 12 | |

FIG.30

| ITEM | CODEWORD OUTPUT |
|---|---|
| ORIGINAL INFORMATION | $a_6$ |
| | $a_5$ |
| | $a_4$ |
| | $a_3$ |
| | $a_2$ |
| | $a_1$ |
| | $a_0$ |
| ENCODED BITS | $a_6+a_2+a_0$ |
| | $a_6+a_5+a_2+a_1+a_0$ |
| | $a_6+a_5+a_4+a_2+a_1$ |
| | $a_5+a_4+a_3+a_1+a_0$ |
| | $a_6+a_4+a_3$ |
| | $a_5+a_3+a_2$ |
| | $a_4+a_2+a_1$ |
| | $a_3+a_1+a_0$ |

| ITEM | CODEWORD OUTPUT |
|---|---|
| ORIGINAL INFORMATION | a7 |
| | a6 |
| | a5 |
| | a4 |
| | a3 |
| | a2 |
| | a1 |
| | a0 |
| ENCODED BITS | c19 : a1+a2+a3 |
| | c18 : a0+a1+a2 |
| | c17 : a0+a2+a3+a6+a7 |
| | c16 : a3+a5 |
| | c15 : a2+a4+a7 |
| | c14 : a1+a3+a6+a7 |
| | c13 : a0+a2+a5+a6 |
| | c12 : a2+a3+a4+a5+a6 |
| | c11 : a1+a2+a3+a4+a5+a7 |
| | c10 : a0+a1+a2+a3+a4+a6+a7 |
| | c9 : a0+a5 |
| | c8 : a1+a2+a3+a4+a6+a7 |
| | c7 : a0+a1+a2+a3+a5+a6 |
| | c6 : a0+a3+a4+a5+a6 |
| | c5 : a1+a4+a5+a6 |
| | c4 : a0+a3+a4+a5+a6 |
| | c3 : a1+a4+a6+a7 |
| | c2 : a0+a3+a5+a6+a7 |
| | c1 : a1+a3+a4+a5 |
| | c0 : a0+a2+a3+a4+a7 |

ADDRESS DATA
102
104
E A
K D
2699 (167)
3779 (235)
1859 (116)
1440 (90)

FIG.39 (a)

| EA | ① | ② | ③ | ④ | ⑤ | ⑥ |
|---|---|---|---|---|---|---|
| 0 | 4 | 1 | 13 | 14 | 11 | 5 |
| 1 | 4 | 1 | 13 | 6 | 5 | 5 |
| 2 | 4 | 1 | 13 | 13 | 5 | 6 |
| 3 | 4 | 1 | 13 | 13 | 1 | 10 |
| 4 | 4 | 1 | 13 | 0 | 3 | 3 |
| 5 | 4 | 1 | 13 | 14 | 5 | 13 |
| 6 | 4 | 1 | 13 | 4 | 12 | 15 |
| 7 | 4 | 1 | 13 | 6 | 13 | 12 |
| 8 | 4 | 1 | 13 | 5 | 14 | 14 |
| 9 | 4 | 1 | 13 | 2 | 5 | 12 |
| 10 | 4 | 1 | 13 | 3 | 12 | 5 |
| 11 | 4 | 1 | 13 | 3 | 13 | 15 |
| 12 | 4 | 1 | 13 | 4 | 7 | 8 |
| 13 | 4 | 1 | 13 | 11 | 4 | 14 |
| 14 | 4 | 1 | 13 | 12 | 13 | 5 |
| 15 | 4 | 1 | 13 | 7 | 12 | 5 |

FIG.39 (b)

| EA | ② | ⑤ | ⑥ | ③ | ① | ④ |
|---|---|---|---|---|---|---|
| 0 | 1 | 11 | 5 | 13 | 4 | 14 |
| 1 | 1 | 5 | 5 | 13 | 4 | 6 |
| 2 | 1 | 5 | 6 | 13 | 4 | 13 |
| 3 | 1 | 1 | 10 | 13 | 4 | 13 |
| 4 | 1 | 3 | 3 | 13 | 4 | 0 |
| 5 | 1 | 5 | 13 | 13 | 4 | 14 |
| 6 | 1 | 12 | 15 | 13 | 4 | 4 |
| 7 | 1 | 13 | 12 | 13 | 4 | 6 |
| 8 | 1 | 14 | 14 | 13 | 4 | 5 |
| 9 | 1 | 5 | 12 | 13 | 4 | 2 |
| 10 | 1 | 12 | 5 | 13 | 4 | 3 |
| 11 | 1 | 13 | 15 | 13 | 4 | 3 |
| 12 | 1 | 7 | 8 | 13 | 4 | 4 |
| 13 | 1 | 4 | 14 | 13 | 4 | 11 |
| 14 | 1 | 13 | 5 | 13 | 4 | 12 |
| 15 | 1 | 12 | 5 | 13 | 4 | 7 |

FIG.39 (c)

| EA | ② | ⑤ | ⑥ | ③ | ① | ④ |
|---|---|---|---|---|---|---|
| 0 | 1 | 7 | 1 | 10 | 6 | 12 |
| 1 | 12 | 5 | 1 | 10 | 0 | 13 |
| 2 | 12 | 5 | 8 | 7 | 13 | 8 |
| 3 | 1 | 8 | 9 | 14 | 13 | 8 |
| 4 | 7 | 6 | 15 | 11 | 11 | 14 |
| 5 | 12 | 5 | 11 | 13 | 6 | 12 |
| 6 | 7 | 14 | 14 | 2 | 6 | 3 |
| 7 | 10 | 4 | 7 | 15 | 0 | 13 |
| 8 | 1 | 0 | 2 | 0 | 11 | 9 |
| 9 | 12 | 5 | 7 | 15 | 13 | 0 |
| 10 | 7 | 14 | 1 | 10 | 0 | 10 |
| 11 | 10 | 4 | 14 | 2 | 0 | 10 |
| 12 | 10 | 11 | 12 | 1 | 6 | 3 |
| 13 | 1 | 15 | 2 | 0 | 6 | 11 |
| 14 | 10 | 4 | 1 | 10 | 0 | 2 |
| 15 | 7 | 14 | 1 | 10 | 13 | 7 |

| EA | KD |
|---|---|
| 00 | 2699 |
| 01 | 2691 |
| 10 | 1859 |
| 11 | 1440 |
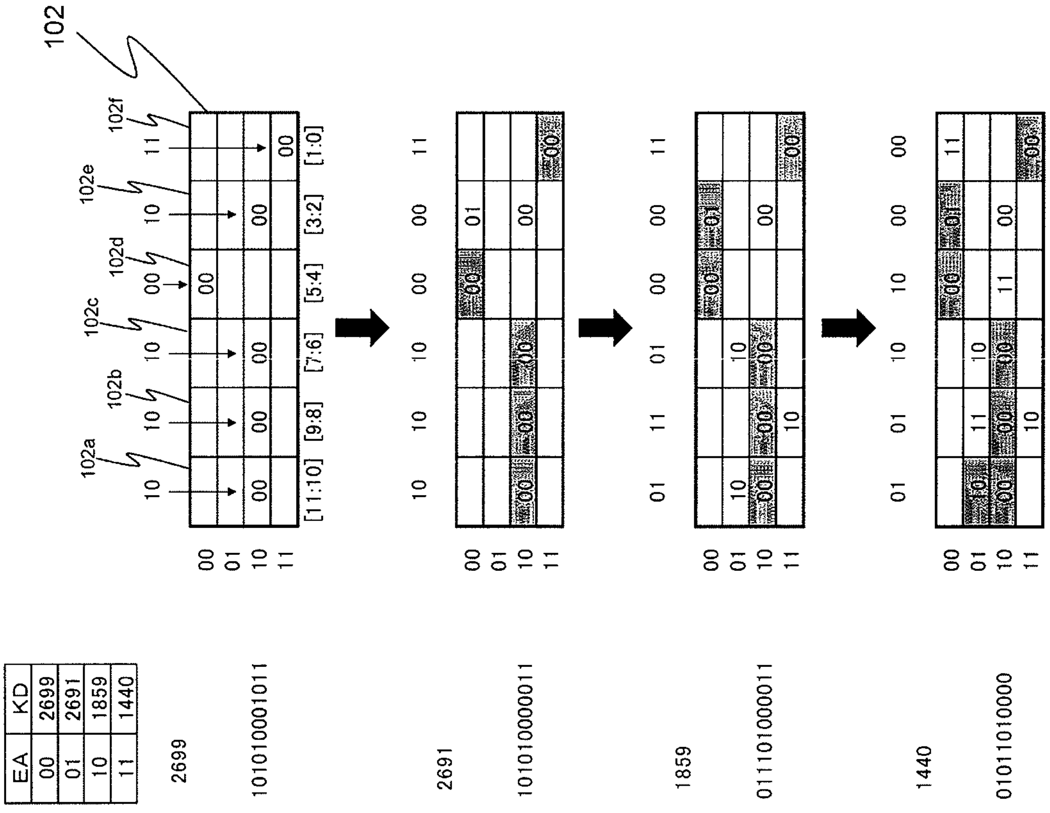
FIG.42 (a)
FIG.42 (b)
FIG.42 (c)
FIG.42 (d)
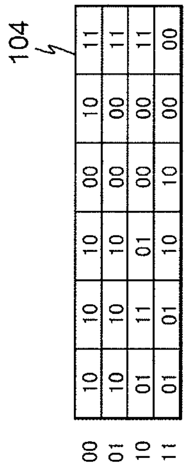
FIG.42(e)

2699
1010100001011
102
102a
102b
102c
102d
102e
102f 1859
0111010000011

2691
1010100000011
「00」
「01」

104

SEMICONDUCTOR DEVICE AND METHOD OF WRITING/READING ENTRY ADDRESS INTO/FROM SEMICONDUCTOR DEVICE

TECHNICAL FIELD

The present invention relates to a semiconductor device and a method of writing/reading an entry address into/from the semiconductor device. Specifically describing, the present invention relates to a content addressable memory (CAM) that realizes reduction in power consumption at the time of search of data by separating a search memory mat.

BACKGROUND ART

In recent years, with the advent of the era of cloud computing, high performance of Internet switches and routers and reduction in power consumption are urgent needs. Further, as a search engine of the Internet, one capable of reliably performing a search operation at a high speed with low power consumption has been sought. To respond to the request, in recent years, Internet switches and search engines using the CAM have been increased.

Here, in a typical CAM, search data called key data is input to a typical CAM when search of data stored in the CAM is performed. When the same data as the key data is stored in a memory, the CAM outputs an address called an entry address in which the key data is stored. Typically, to realize such a search function, an access to all memory spaces in the CAM is required, and thus, there has been a problem of not only complication of a circuit configuration but also an increase in the power consumption. Especially, the problem of an increase in the power consumption becomes increased with an increase in the scale of the CAM. Therefore, currently, it has become a serious problem.

To address the problem, Patent Literature 1 proposes a data search device for achieving low power consumption while making the most of a high-speed search performance of the CAM. The data search device of Patent Literature 1 newly orders a plurality of pieces of rule data in which priorities have been determined according to the order of size, and allocates the rule data to a plurality of memory blocks according to the order. Further, the search device designates one memory block to be searched and executes search processing when searching data. As described above, the data search device of Patent Literature 1 activates only the one designated block and does not need to activate other blocks when performing the search processing. Therefore, the data search device can reduce the power consumption to that extent at the time of search, compared with a normal CAM.

CITATION LIST

Patent Literature

Patent Literature 1: JP 2004-185792 A

SUMMARY OF INVENTION

Technical Problem

However, while the data search device disclosed in Patent Literature 1 can reduce the power consumption at the time of search, compared with a normal memory, the data search device needs to access the entire memory space in a block all at once in order to execute the search processing. Therefore, a conventional data search device has a problem of complication of a circuit configuration and large power consumption at the time of search. As described above, the technology of Patent Literature 1 does not present fundamental solution to the current problem.

Therefore, currently, a novel semiconductor device capable of reducing the power consumption at the time of search processing while maintaining high-speed search performance of the CAM has been continuously sought.

Solution to Problem

Therefore, the inventors of the present invention have diligently discussed a means to solve the above problem. As a result, the present inventors have obtained new findings of separating a search memory mat into a plurality of search memory mats, dividing key data into a plurality of pieces of key data, and writing entry addresses corresponding to the divided key data into the separate search memory mats. As described above, dividing key data into a plurality of pieces of key data and writing the divided key data into the search memory mats enables partially activating the search memory mat and performing data search when search of the key data is performed. As a result, the present invention can realize substantially lower power consumption than a conventional CAM. The present inventors now have reached solution to the problem of the conventional technology based on the findings, and have completed the present invention.

A first aspect of the present invention relates to a semiconductor device. Here, first, processing of writing data into the semiconductor device will be described.

The semiconductor device of the present invention includes a search memory mat 102 and a control circuit 105.

In the search memory mat 102, a location with which an entry address is registered is allocated into a y-axis direction (column direction), and key data is allocated into an x-axis direction (row direction).

Here, in the search memory mat 102, a plurality of separate memories 102_a_, 102_b_, . . . is formed such that a region to which the key data is allocated is separated into a plurality of regions along the x-axis direction.

Further, the control circuit 105 is connected to the search memory mat. Here, the control circuit 105 includes an input unit 1051, a division unit 1052, and a writing unit 1053.

Key data (input data) is input to the input unit 1051.

The division unit 1052 divides the key data (input data) input to the input unit into a plurality of pieces of key data.

The writing unit 1053 allocates each of the divided key data by the division unit to the separate memory using the divided key data as an address, and writes an entry address corresponding to each of the divided key data into the separate memory.

As described in the above configuration, in the semiconductor device of the present invention, first, a region of the search memory mat 102, to which the key data is allocated, is separated into a plurality of regions. Accordingly, the search memory mat 102 is separate into a plurality of separate memories 102_a_, 102_b_, . . . . Here, the present invention stores the key data by writing an entry address corresponding to the key data into the plurality of separate memories 102_a_, 102_b_, . . . . That is, the present invention divides the key data into a plurality of pieces of key data when the key data is input to the control circuit 105. Then, the control circuit 105 writes an entry address allocated to the key data into the separate memories 102_a_, 102_b_, . . . for each of the divided key data. In addition, at that time, when writing an entry address into the separate memory, the control circuit 105 writes an entry address corresponding into the divided key data in the location indicated by the divided key data using the location with which an entry address is registered allocated to the y axis of the search memory mat 102 as the content (binary data) of the divided key data.

As described above, the semiconductor device of the present invention separates the search memory mat 102 into a plurality of mats, and writes entry addresses corresponding to a plurality of the divided key data into the plurality of mats. By performing such writing processing, the processing of reading the key data can be performed at a high speed with lower power consumption. That is, as described above, in the present invention, the key data is divided into a plurality of pieces of key data, and an entry address of each of the divided key data is stored in the separate memory. Therefore, when the entry address is searched, it is not necessary to activate the entire search memory mat 102 all at once, and it becomes possible to partially activate the search memory mat 102 by each of the separate memories 102*a*, 102*b*, . . . , to perform search. Therefore, according to the present invention, the data search can be executed with extremely lower power consumption than a conventional CAM while realizing high-speed data search similarly to the conventional CAM.

Further, in the semiconductor device of the present invention, the control circuit 105 favorably includes a collision information storage unit 1054.

The collision information storage unit 1054 writes information indicating a collision of the entry addresses into the separate memory when a plurality of entry addresses is written into the same separate memory by the writing unit.

In the semiconductor device of the present invention, the writing unit 1053 of the control circuit 105 writes an entry address corresponding to the divided key data into the separate memory using each of the plurality of divided key data as an address. Therefore, there is a possibility that a plurality of entry addresses be written into the same address of the same separate memory. A phenomenon that the plurality of entry addresses is written into the same address is expressed as "collision" in the specification of the present application. Here, when the "collision" is caused when the processing of writing the entry address is performed, the semiconductor device of the present invention registers information (flag or the like) indicating the collision with the colliding address, and continues the writing processing as is. Accordingly, the processing of writing an entry address can be speeded up. Further, even if an entry address collides with others, the present invention performs, instead of avoiding the collision, the writing processing without any concern for the collision. Therefore, the present invention simplifies algorithms in the writing/reading processing, and realizes both of the high-speed data search and the low power consumption in the data search.

Next, processing of reading data from a semiconductor device will be described.

In the semiconductor device of the present invention, the control circuit 105 further includes a reading unit 1055.

The reading unit 1055 functions when key data as data to be searched is input to the input unit. That is, in the present invention, when the key data as the data to be searched is input to the input unit, the division unit divides the key data into a plurality of pieces of key data. Following that, the reading unit 1055 accesses the separate memory using each of the divided key data by the division unit as an address, and reads an entry address corresponding to each of the divided key data from the separate memory.

As described above, in the semiconductor device of the present invention, the key data is divided into a plurality of pieces of key data, and the entry address of each of the divided key data is stored in the separate memory. Therefore, in the processing of searching the entry address, it is not necessary to activate the entire search memory mat 102 all at once, and it becomes possible to partially activate the search memory mat 102 by each of the separate memories 102*a*, 102*b*, . . . . Therefore, according to the present invention, the data search can be executed with extremely lower power consumption than a conventional CAM while realizing high-speed data search similarly to the conventional CAM.

In the semiconductor device of the present invention, in a case where the information indicating a collision has been written into the separate memory when the reading unit 1055 accesses the separate memory using the divided key data by the division unit as an address, the reading unit 1055 does not read an entry address corresponding to the divided key data, and processes the divided key data as data not to be considered.

As described above, when searching the search memory mat 102 using the divided key data as an address, in a case where a collision of a plurality of entry addresses has been caused in the same address, the semiconductor device of the present invention excludes the divided key data from the data to be searched, and treats the data as data "not to be considered (don't care)". The present invention searches the search memory mat 102 after dividing one key data as the data to be searched into a plurality of pieces of key data. Therefore, even in a case where some of the divided key data are treated as data "not to be considered (don't care)", if the entry address can be read by at least one of the divided key data, whether or not the key data corresponding to the entry address is consistent with the key data as the data to be searched can be confirmed. Therefore, the entry address is not forcibly read but treated as an address not to be considered if a collision is caused, and the processing is continued as is. Accordingly, the reading processing can be speeded up.

However, if a collision of entry addresses exists when processing of reading data is performed, the accuracy of the data search may be decreased in theory. Therefore, next, an example of a technique to enhance a possibility that accurate data search can be performed even if a collision of entry addresses is caused will be described.

As a first example of countermeasures against the collision, it is favorable that the semiconductor device includes a verification memory mat 104. The verification memory mat 104 stores each entry address and each of key data in association with each other.

Further, in this case, it is favorable that the control circuit 105 includes a verification unit 1056. The verification unit 1056 reads key data corresponding to an entry address read by the reading unit 1055 from the verification memory mat, and confirms whether or not the key data is consistent with the key data as data to be searched input to the input unit.

As the configuration describe above, the semiconductor device of the present invention includes a storage region that builds the verification memory mat 104, and can store correspondence between the entry address and the key data. For example, when new key data is input, the semiconductor device allocates an entry address to the new key data, and may store the correspondence between the new key data and the entry address in the verification memory mat 104. Thus, when an entry address is read in the reading processing described above, whether or not the entry address corresponds to the key data input as the data to be searched can be confirmed by reference to the verification memory mat 104. Especially, when a collision of entry addresses is caused in the search memory mat 102, and the "not-considering (don't care)" processing is performed by the reading unit, it is effective to confirm whether or not the read entry address is appropriate using the verification memory mat 102. In this way, according to the present invention, even if a collision of entry addresses is caused, the possibility that accurate data search can be performed can be increased.

As a second example of countermeasures against the collision, it is favorable that the semiconductor device includes an encoding circuit 106. The encoding circuit 106 is a circuit arranged at a front stage of the input unit 1051 of the control circuit 105. That is, the encoding circuit 106 encodes key data according to predetermined processing, and outputs the encoded key data to the input unit of the control circuit.

The semiconductor device of the present invention writes an entry address corresponding into the divided key data in the separate memories 102*a*, 102*b*, . . . of the search memory mat 102, and registers collision information when a plurality of entry addresses is written into the same address of the separate memory. Here, if there is deviation in the key data input to be written into the memory, there are problems that the collision frequency of data is increased, and data columns that cannot be searched are increased. That is, the deviation of data occurs when a plurality of almost the same data is continuously registered, such as a case where ID numbers are registered in descending order. When data having almost the same content is continuously registered, the data is not uniformly distributed in the search memory mat 102, and is concentrated in almost the same address of the search memory mat 102 and unevenly registered therewith. Thus, a possibility of occurrence of the collision of entry addresses is increased in the search memory mat 102. Therefore, as the configuration described above, the key data is encoded by the encoding circuit 106 before being input to the input unit 1051 of the control circuit 105. The encoding here includes distribution of the key data according to a predetermined algorithm and rearrangement of the order of the key data (binary data). In this way, even if almost the same key data is continuously input, the deviation of the data can be eliminated by encoding of the key data. If the data deviation can be eliminated, the possibility that the collision is caused in the search memory mat 102 can be decreased. As a result, the possibility that the data search can be accurately performed can be increased.

As a third example of countermeasures against the collision, a case in which information indicating a collision has been written into all of the separate memories accessed by the reading unit 1055 of the control circuit 105 will be described. The possibility that a collision is caused in all separate memories is quite low, but theoretically, it may be caused.

Therefore, it is favorable that in a case where the information indicating a collision has been written into the all separate memories when the reading unit 1055 accesses the separate memories using each of the divided key data by the division unit as an address, the reading unit 1055 reads entry addresses already written into the all separate memories.

Further, in such a case, it is favorable that the verification unit 1056 sequentially refers to the verification memory mat using the entry addresses read by the reading unit, and after extracting a key address consistent with the key data as data to be searched from the verification memory mat, outputs an entry address corresponding to the extracted key data.

As described above, even if all of the outputs from the search memory mat 102 are in a search neglect state, the present invention reads the already-written entry addresses from the all of the addresses hit by the search, and sequentially refers to the verification memory mat with each of the entry addresses. Accordingly, even if all of the outputs from the search memory mat 102 are in a search neglect state, there is a possibility that a correct answer can be derived in the data search. As a result, the possibility that the data search can be accurately performed is increased.

A second aspect of the present invention relates to a method of writing/reading an entry address into/from a semiconductor device. First, a method of writing an entry address into a semiconductor device will be described.

The method according to the present invention relates to a method of writing an entry address corresponding to key data into a semiconductor device. The semiconductor device includes a search memory mat 102 having a configuration in which a location with which an entry address is registered is allocated in a y-axis direction, and key data is allocated in an x-axis direction, and a control circuit 105 connected to the search memory mat 102.

In the search memory mat 102, a plurality of separate memories 102*a*, 102*b*, . . . is formed such that a region to which the key data is allocated is separated into a plurality of regions along the x-axis direction.

Here, in the method of the present invention, first, key data is input to the control circuit 105 of the semiconductor device. Then, the control circuit divides the input key data into a plurality of pieces of key data. Then, the control circuit allocates each of the divided key data to the separate memory using the divided key data as an address, and writes an entry address corresponding to each of the divided key data into the separate memory.

Next, a method of reading the entry address written into the semiconductor device by the above described writing processing will be described.

In the reading processing, first, key data as data to be searched is input to the control circuit. Following that, the control circuit divides the input key data as data to be searched into a plurality of pieces of data. The control circuit then accesses the separate memory using each of the divided key data as an address, and reads an entry address corresponding to each of the divided key data from the separate memory.

The writing/reading of an entry address is performed with respect to the semiconductor device according to the above steps, so that the data search can be performed at a high speed, and the power consumption at the time of data search can be suppressed.

Advantageous Effects of Invention

According to the present invention, processing of searching data can be performed at a high speed with low power consumption.

Further, according to the present invention, an automatic switch that can be subjected to a dynamic hardware rebuilding can be realized. Further, in the present invention, if a basic input information group is input by burst transfer, basically, it is sufficient that there is only a microcode in performing search processing, and thus programs become unnecessary. Apparently, image compression and encryption are also possible by the same method.

Further, in normal image processing or fuzzy processing, programs having a large number of steps are required because the processing is performed in a large amount of database. In contrast, according to the present invention, basically, the number of steps of the program can be reduced, and the program can be simplified.

Further, according to the present invention, deviation of input data (search data) can be eliminated, and the collision frequency of data can be decreased. Further, the present invention can realize a semiconductor device that can handle a collision of data even if the collision is caused.

Further, according to the present invention, a semiconductor device can be realized, which enables an output of a search result even if a collision state is caused in all columns of search data, which is input at the time of search.

Further, according to the present invention, by an increase in the number of separations of a search memory mat, a semiconductor device that enables a decrease in the collision frequency can be realized.

BRIEF DESCRIPTION OF DRAWINGS

FIG. 15 is a diagram illustrating a writing operation in FIG. 14.

FIG. 30 is a diagram describing the degree of scattering of coded bits and data.

FIG. 31 is a diagram illustrating original information and a coded bit output by an encoding circuit of the SRAM-CAM illustrating the fourth example of the present invention.

FIG. 32 is a diagram illustrating another original information and a coded bit output by the encoding circuit of the SRAM-CAM illustrating the fourth example of the present invention.

FIGS. 39(*a*) to 39(*c*) are diagrams illustrating changes of three types of data: key data that is the original information input to the SRAM-CAM, key data grouped by four bits and subjected to an array change of the groups, and key data encoded in a unit of 8 bits.

FIGS. 42(*a*) to 42(*e*) are diagrams illustrating a writing operation of the SRAM-CAM illustrating a fifth example of the present invention.

DESCRIPTION OF EMBODIMENTS

Hereinafter, embodiments for implementing the present invention will be described with reference to the drawings. The present invention is not limited to the embodiments described below, and includes embodiments appropriately modified by a person skilled in the art from the following embodiments within an obvious scope.

Note that in the present invention, the term "writing/reading" is used as a term meaning "both or any one of writing and reading" in the present specification.

The present invention relates to a semiconductor device and a method of writing/reading an entry address with respect to a semiconductor device. Elements of basic points of view of the present invention are as follows:

(1) a control circuit of the semiconductor device divides data to be searched, that is, key data, into a plurality of pieces of data (n divisions), and accesses a memory circuit (search memory mat) using the divided key data as an address;

(2) the control circuit registers an entry address corresponding to the divided key data with an address of the accessed memory circuit;

(3) the processing of registering an entry address is performed with respect to all of the memory circuits corresponding to the number of divisions (n) of the key data;

(4) when the key data as data to be searched is input to the control circuit after the registration of an entry address, the control circuit divides the input key data into a plurality of pieces of data (n divisions). The control circuit then accesses the memory circuit using the divided key data as an address, and outputs the entry address registered with the memory circuit.

Note that, desirably, (5) the control circuit employs the entry address as an entry address in seek when all of the output entry addresses are consistent with each other. On the other hand, the control circuit determines that no data consistent with the data to be searched has been registered if there is inconsistency among the output entry addresses.

The above is the basic points of view in the present invention. Note that, when the present invention is implemented in a product that can actually realize the functions, various problems to be solved remain. However, methods of solving the problems will be described in detail in the following examples.

First, an outline of the present invention will be described with reference to FIGS. 1 to 5.

Figure 1:
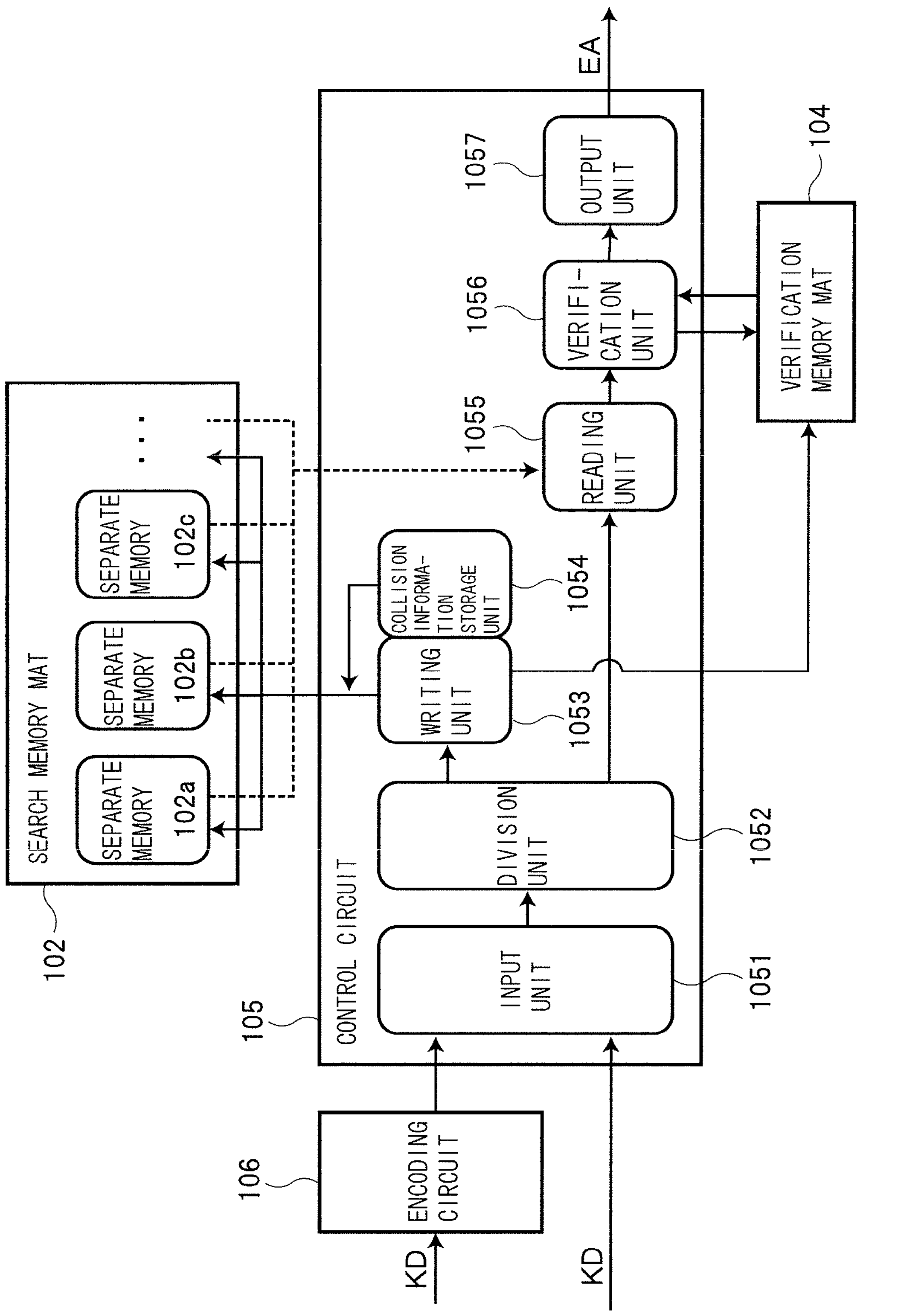
FIG. 1 is a function block diagram illustrating a principal configuration of a semiconductor device according to an embodiment of the present invention.

FIG. 1 is a function block diagram illustrating a principal configuration of a semiconductor device according to the present invention.

As illustrated in FIG. 1, the semiconductor device of the present invention includes a search memory mat 102 and a control circuit 105. Further, as illustrated in FIG. 1, the semiconductor device of the present invention favorably includes a verification memory mat 104 and an encoding circuit 106. The control circuit 105 is connected with each of the search memory mat 102, the verification memory mat 104, and the encoding circuit 106, and serves a function to comprehensively control information processing in the semiconductor device.

The search memory mat 102 illustrated in FIG. 1 has a configuration in which a location with which an entry address is registered is allocated in a y-axis direction, and key data is allocated in an x-axis direction. The "y-axis direction" here means one of a column direction (vertical direction) and a row direction (lateral direction) in an array made of a matrix, and the "x-axis direction" means the other of the column direction (vertical direction) and the row direction (lateral direction). That is, one key data is stored in association with one entry address in the search memory mat 102. As described above, the search memory mat 102 is based on a configuration in which locations with which a plurality of entry addresses is registered are allocated in the y-axis direction, and one key data can be allocated to each of the entry addresses in the x-axis direction.

Further, a content addressable memory (CAM) that can be realized by the semiconductor device of the present invention has typically a function to search a plurality of key data registered with a search memory mat and to find key data designated by a user among the plurality of key data, and to provide the user with an entry address in the location where the key data has been found out. That is, the "key data" means desired information registered with the search memory mat. Further, the "entry address" means meta information indicating a location (an address) within the search memory mat with which the key data is registered.

Figures 8, 8E:
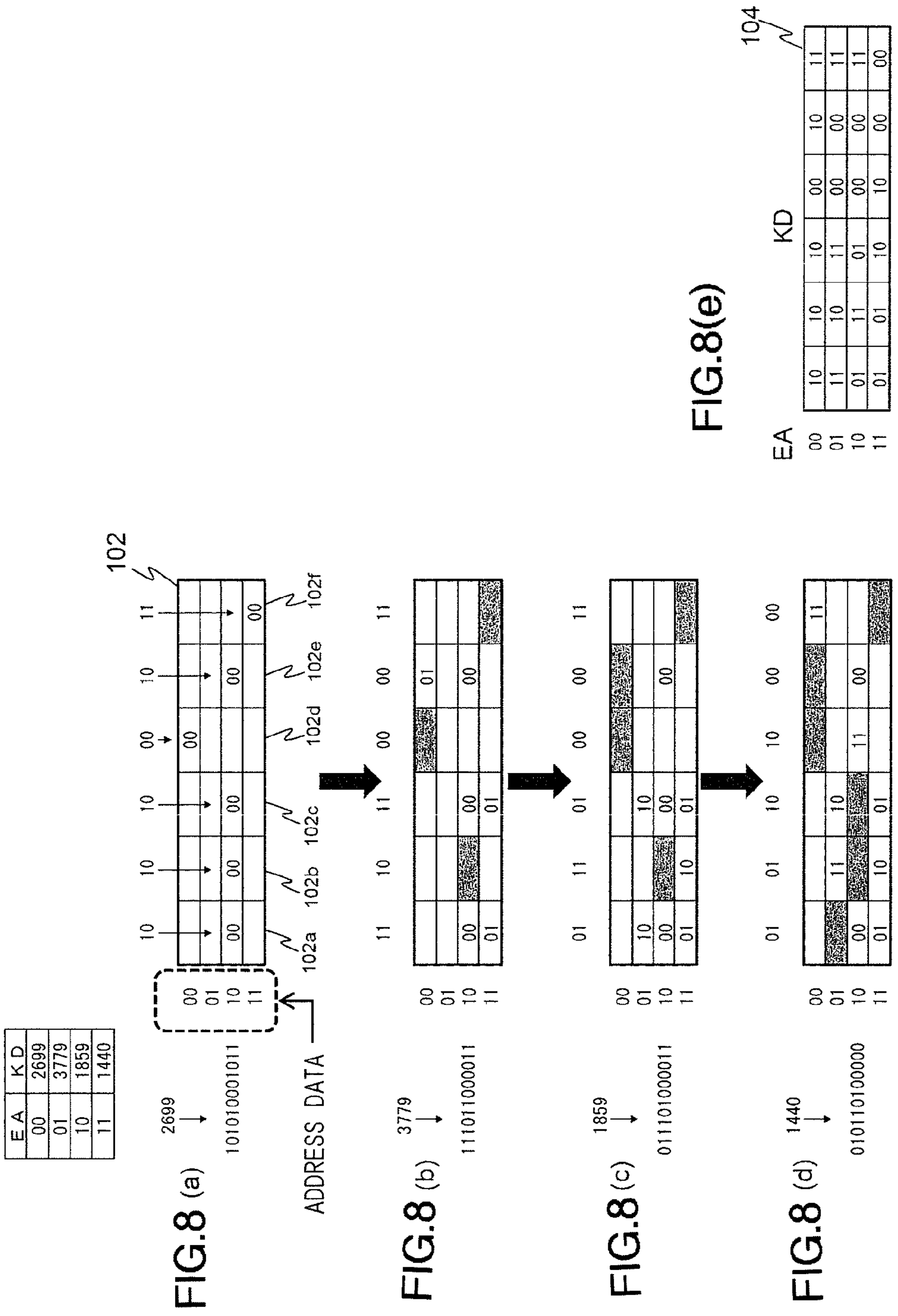
FIGS. 8(*a*) to 8(*e*) are diagrams illustrating a writing operation of an SRAM-CAM illustrating an example of the present invention.

Further, as illustrated in FIGS. 8(*a*) to 8(*e*) and the like described below, address data for identifying its location is provided to each of the "locations with which an entry address is registered" allocated in the y-axis direction of the search memory mat 102. For example, in the example illustrated in FIGS. 8(*a*) to 8(*e*), four "locations with which an entry address is registered" each exist in the y-axis direction. An address of each of the "locations with which an entry address is registered" is identified by two-bit data, for example. For example, address data of "00", "01", "10", and "11" is respectively provided to the four "locations with which an entry address is registered". The address data is data for identifying the addresses of the "locations with which an entry address is registered" in the memory space of the search memory mat 102. Note that eight or more "locations with which an entry address is registered" may exist. The address data for identifying the "locations with which an entry address is registered" may be data having three bits or more. For example, the address data for identifying the "locations with which an entry address is registered" may be data having two to six bits or three to five bits.

Further, in the semiconductor device of the present invention, the key data having a desired number of bits can be written or read. Further, the entry address is favorably defined in two bits or more. For example, the entry address can be two to six bits, or may be three to five bits.

Further, as illustrated in FIG. 1, the search memory mat 102 is built by a plurality of separate memories 102*a*, 102*b*, 102*c*, . . . . The plurality of separate memories are obtained such that the region in the x-axis direction to which the key data is allocated in a storage space of the search memory mat 102 is separated into a plurality of regions along the y-axis direction. That is, the search memory mat 102 is separated into the plurality of separate memories 102*a*, 102*b*, 102*c*, and built, so that the region to which the key data is allocated is separated into a plurality of regions. Each separate memory can be configured using a storage device such as an SRAM. In this sense, the present invention can be said to be a CAM that is realized using a plurality of SRAMs. In the present specification, the CAM realized using the SRAMs is called SRAM-CAM. For example, although to be described below, the search memory mat 102 in which a region to which the key data is allocated is separated into a plurality of regions has a configuration as illustrated in FIGS. 8(*a*) to 8(*e*).

As described above, the region of the search memory mat 102 in the x-axis direction to which the key data is allocated is separated into a plurality of regions, so that the storage spaces in the x-axis direction and in the y-axis direction of the search memory mat 102 are respectively separated into a plurality of storage spaces. In this way, the sectioned storage spaces (cells) identified by the y axis and the x axis are expressed as locations and addresses of the search memory mat 102 in the specification of the present application.

For example, assuming that the total number of entries of the search memory mat 102 is set to be 4096 entries, the size of an address that can identify the 4096 entries becomes 12 bits. Further, assuming that the size of the key data input to the search memory mat 102 is 144 bits, 144 bits divided by the 12 bits becomes 12. That is, in such a case, at least 12 or more separate memories are required.

Considering such a condition, the minimum necessary number of separations N of the search memory mat 102 can be obtained by the following expression:

(Expression)

$$N=L/\log_2 \cdot M$$

L: key data length

M: Total number of entries

N: The number of separations of the search memory mat (the minimum number of the separate memories).

Meanwhile, as illustrated in FIG. 1, the control circuit 105 basically includes an input unit 1051, a division unit 1052, a writing unit 1053, a reading unit 1055, and an output unit 1057. The control circuit 105 further favorably includes a collision information storage unit 1054 and a verification unit 1056. These elements 1051 to 1056 are conceptual classification of the function of the control circuit 105. That is, the control circuit 105 performs processing of writing an entry address into the search memory mat 102, and of reading the entry address registered with the search memory mat, using the elements 1051 to 1056.

Hereinafter, basic processing executed by the control circuit 105 will be described with reference to the flowcharts of FIGS. 2 to 5.

First, the processing of writing an entry address performed by the control circuit 105 will be described.

Figure 2:
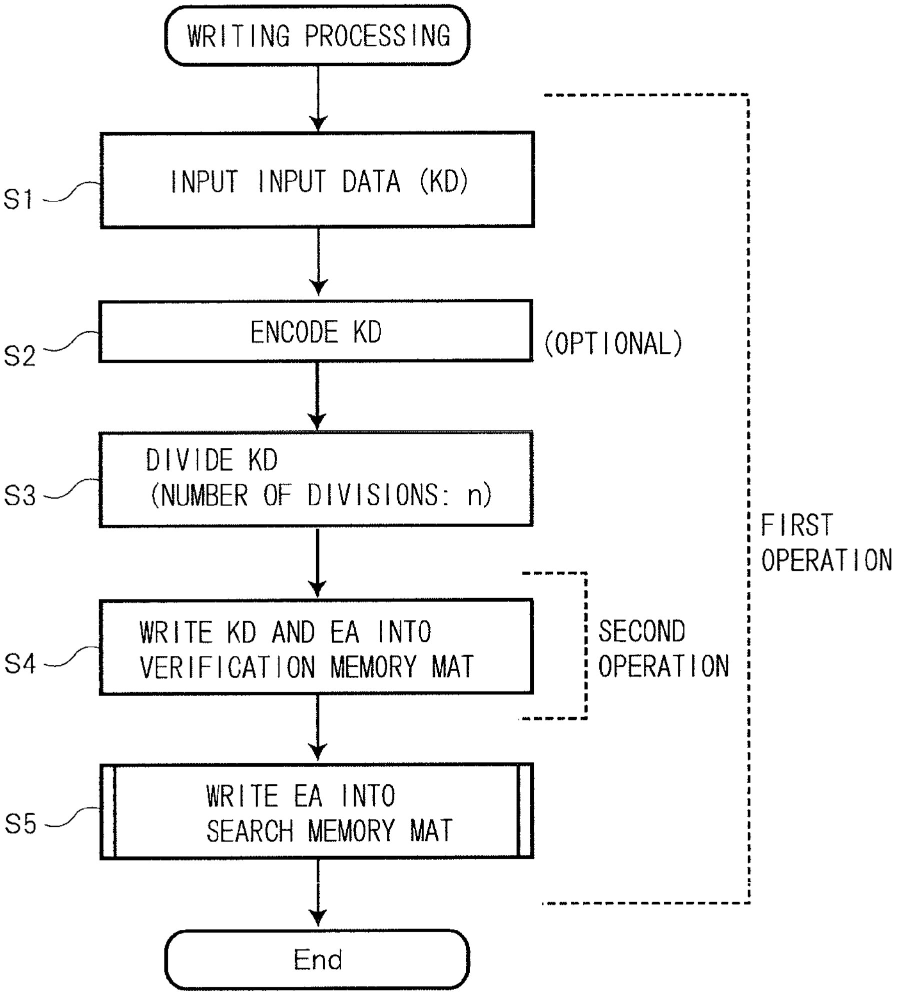
FIG. 2 is a flowchart illustrating a main flow of a writing method according to an embodiment of the present invention.
Figure 3:
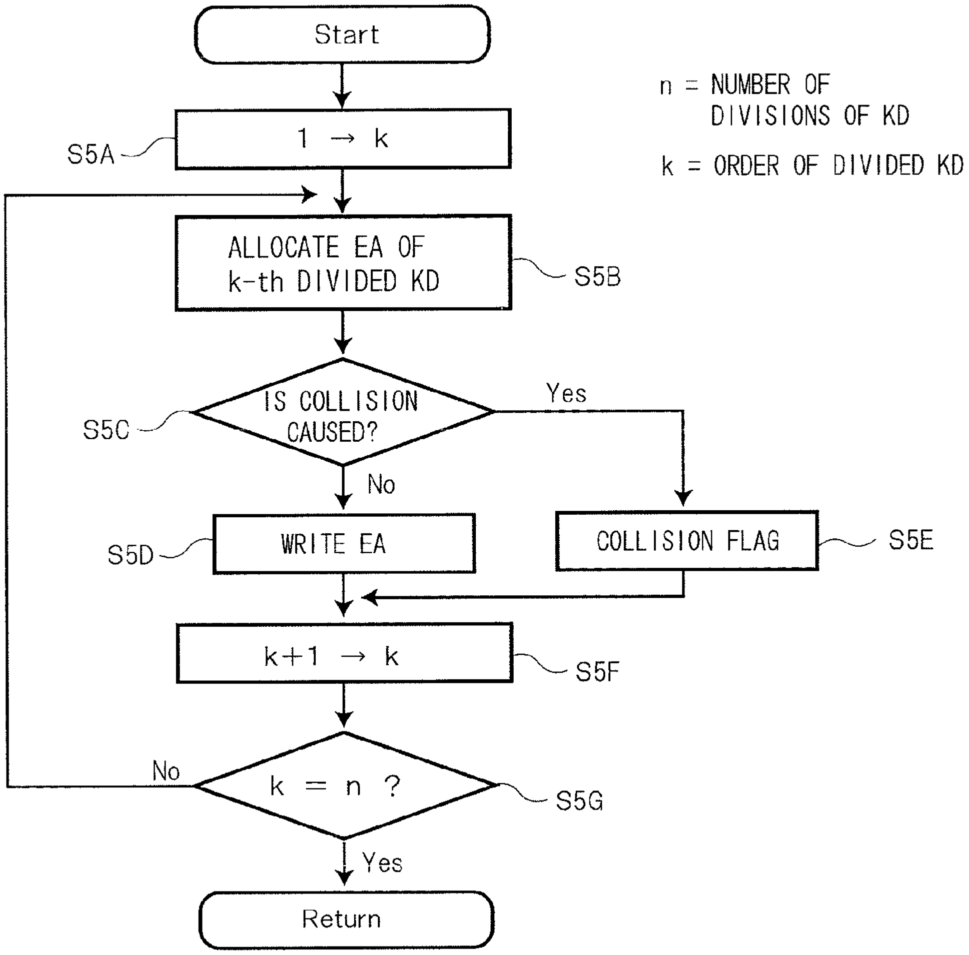
FIG. 3 is a flowchart illustrating a sub-flow of the writing method according to an embodiment of the present invention.

Here, FIGS. 2 and 3 are flowcharts illustrating the writing processing performed by the control circuit 105. The writing processing here is processing of writing an entry address corresponding to new key data (input data) into the search memory mat when the new key data is stored.

As illustrated in FIG. 2, in the writing processing, first, key data (input data) for being newly registered with the search memory mat is input to the semiconductor device (step S1). Here, the key data as the input data may be, as illustrated in FIG. 1, directly input to the input unit 1051 of the control circuit 105, or may be input to the input unit 1051 of the control circuit 105 through the encoding circuit 106.

Here, when the key data is input to the encoding circuit 106, encoding processing of the key data is performed by the encoding circuit 106 (step S2). Note that the encoding processing performed here will be described in detail in the following [Example 4].

Meanwhile, when the key data as the input data is directly input to the input unit 1051 of the control circuit 105, the input unit 1051 sends the key data to the division unit 1052. That is, the input unit 1051 is an input interface in the control circuit 105.

Following that, the division unit 1052 divides the key data as the input data into a plurality of pieces of data (step S3). That is, the division unit 1052 divides binary data (binary format data that can be treated by a computer) of the input key data into a plurality of pieces of data. For example, the division unit 1052 favorably divides the key data by the number equal to the number of the separate memories 102*a*, 102*b*, 102*c*, . . . that build the search memory mat 102. In short, the number of divisions n by which the division unit 1052 divides the key data is favorably the number N of the separate memories that build the search memory mat 102. Accordingly, all of the plurality of pieces of key data divided by the division unit 1052 (may also be called "divided key data") can be respectively registered with the plurality of separate memories in a sequential manner.

Further, favorably, the division unit 1052 divides binary data of the key data by predetermined bits when dividing the binary data of the key data. For example, in a case where "2699" is input as the key data, when the key data "2699" is expressed in binary, it becomes "101010001011". For example, the division unit 1052 may divide the key data by two bits such as "10" "10""10""00""10""11". Further, the division unit 1052 may divide the key data by three bits or four bits. For example, the number of bits for division just has to be 2 to 10 bits.

Specifically, the number of bits ($\alpha$) of the divided key data by the division unit 1052 is favorably equal to the number of bits ($\beta$) of the address data for identifying the "location with which an entry address is registered" allocated in the y-axis direction of the search memory mat 102 ($\alpha=\beta$). For example, when the address data for identifying the "location with which an entry address is registered" in the search memory mat 102 is expressed by two bits, the division unit 1052 favorably divides the input key data into a plurality of pieces of data by two bits. Similarly, when the location with which an entry address is registered allocated to the search memory mat 102 is identified with the three-bit address data, the division unit 1052 favorably divides the input key data into a plurality of pieces of data by three bits. Accordingly, each of the divided key data by the division unit 1052 can be appropriately allocated to the separate memory that builds the search memory mat 102 using each of the divided key data as an address in the following processing.

As illustrated in FIG. 1, in the writing processing, the division unit 1052 sends the divided key data as described above to the writing unit 1053.

Next, the writing unit 1053 performs processing of allocating a unique entry address to the key data received from the division unit 1052 and writing the key data into the verification memory mat 104 (step S4). That is, in step S4, when new key data is newly registered with the search memory mat 102, one entry address is allocated to the new key data, and the correspondence between the new key data and the entry address is stored in the verification memory mat 104. An example of a data structure of the verification memory mat 104 is shown in the lower right of FIGS. 8(*a*) to 8(*e*). As described above, the verification memory mat 104 can also function as a database for storing the correspondence between the key data and the entry address. In addition, the verification memory mat 104 is used when final confirmation of whether or not an entry address read by the control circuit is a correct address is performed in reading processing, as described below. Note that the verification memory mat 104 just has to be configured with a storage device such as an SRAM.

Following that, the writing unit 1053 performs processing of respectively writing the plurality of divided key data by the division unit 1052 into the separate memories 102*a*, 102*b*, 102*c*, . . . of the search memory mat 102 (step S5). The processing in step S5 is described in detail in FIG. 3.

The flowchart of FIG. 3 illustrates a case in which the binary data of key data (KD) is divided into n pieces of divided key data, and the order of the divided key data is defined to be the k-th.

That is, as illustrated in FIG. 3, first, "l" is substituted for "k", and processing of first divided key data among the n pieces of divided key data is started (step S5A).

Next, the writing unit 1053 allocates the entry address of the first (k-th) divided key data to the search memory mat 102 (step S5B). To be specific, the writing unit 1053 accesses the search memory mat 102 using the binary data that expresses the first (k-th) divided key data as an address while referring to the address data for identifying the "location with which an entry address (EA) is registered" allocated to the y axis of the search memory mat 102, and allocates the entry address (EA) associated with the divided key data to the location accessed here (address) of the search memory mat 102. The processing here will be described later in detail with reference to FIGS. 8(*a*) to 8(*e*) and the like.

In short, the writing unit 1053 allocates the entry address (EA) associated with the first (k-th) divided key data to an appropriate location (address) of the search memory mat 102. The appropriate location (address) of the search memory mat 102 can be identified by the order (k-th) of the divided key data, currently being in processing, and the binary data of the divided key data. That is, first, the order of the divided key data (k-th) is referred to, and the region of the search memory mat 102 in the x-axis direction into which the entry address of the divided key data is written is identified. For example, the entry address of the first divided key data is written into the first separate memory 102*a* among the plurality of separate memories 102*a*, 102*b*, 102*c*, . . . that builds the search memory mat 102. Next, the binary data of the divided key data is referred to, and the region of the search memory mat 102 in the y-axis direction into which the entry address of the divided key data is written is identified. That is, the entry address of the divided key data is written into the region in the y-axis direction in which the binary data that indicates the divided key data is consistent with the address data for identifying the "location with which the entry address (EA) is registered" allocated in the y-axis direction of the search memory mat 102. For example, a case is assumed in which four pieces of address data of "00""01""10""11" are allocated in the y-axis direction of the search memory mat 102, the binary data of the divided key data is "10", and the entry address corresponding to the divided key data is "00". In this case, the entry address "00" of the divided key data is written into the region (location with which the entry address (EA) is registered) in the y-axis direction to which the address data of "10" is allocated in the search memory mat 102. As described above, the appropriate location (address) of the search memory mat 102 to which the entry address of the divided key data is allocated can be obtained based on the order (k-th) of the divided key data, currently being in processing, and the binary data of the divided key data.

Following that, the writing unit 1053 confirms whether or not another entry address has already been written into the location (address) to which the entry address (EA) of the first (k-th) divided key data has been allocated, and a collision of entry addresses is caused (step SSC). For example, when another key data has been already written into the search memory mat 102 before the key data that is currently being in writing processing, the collision of entry addresses may be caused.

First, in step S5C, when the writing unit 1053 determines that the collision of entry addresses has not been caused, the writing unit 1053 writes the entry address corresponding to the first (k-th) divided key data into the appropriate location (address) of the search memory mat 102, as it is (step S5D).

Meanwhile, in step S5C, when the writing unit 1053 determines that the collision of entry addresses has been caused, the collision information storage unit 1054 writes information indicating the collision into the location (address) of the search memory mat 102 where the collision is caused (step S5E). For example, the collision information storage unit 1054 just has to record the fact of the collision by adding a flag bit or the like to the location (address) where the collision has been caused.

When the processing of either step S5D or step S5E above has been terminated, the writing unit 1053 adds "l" to "k", and substitutes a value of "k+l" for "k" (step S5F). Then, the writing unit 1053 confirms whether or not a value of "k" obtained through step S5G becomes equal to "n (the number of divisions of the key data)" (step S5G). When k is less than n (k<n), the writing unit 1053 returns to step S5B. For example, when the processing of the first (k-th) divided key data has been completed, processing of the second (k+first) divided key data is continuously performed. Meanwhile, when k becomes equal to n (k=n), the writing unit 1053 terminates the sub-flow illustrated in FIG. 3, and returns to the main flow illustrated in FIG. 2.

With each step above (S1 to S5), the writing unit 1053 writes entry addresses corresponding to all of the plurality of divided key data into appropriate locations (addresses) of the search memory mat 102. When having terminated the writing of the entry addresses of all of the divided key data, the writing unit 1053 terminates the writing processing.

Following that, the reading processing of an entry address performed by the control circuit 105 will be described.

Figure 4:
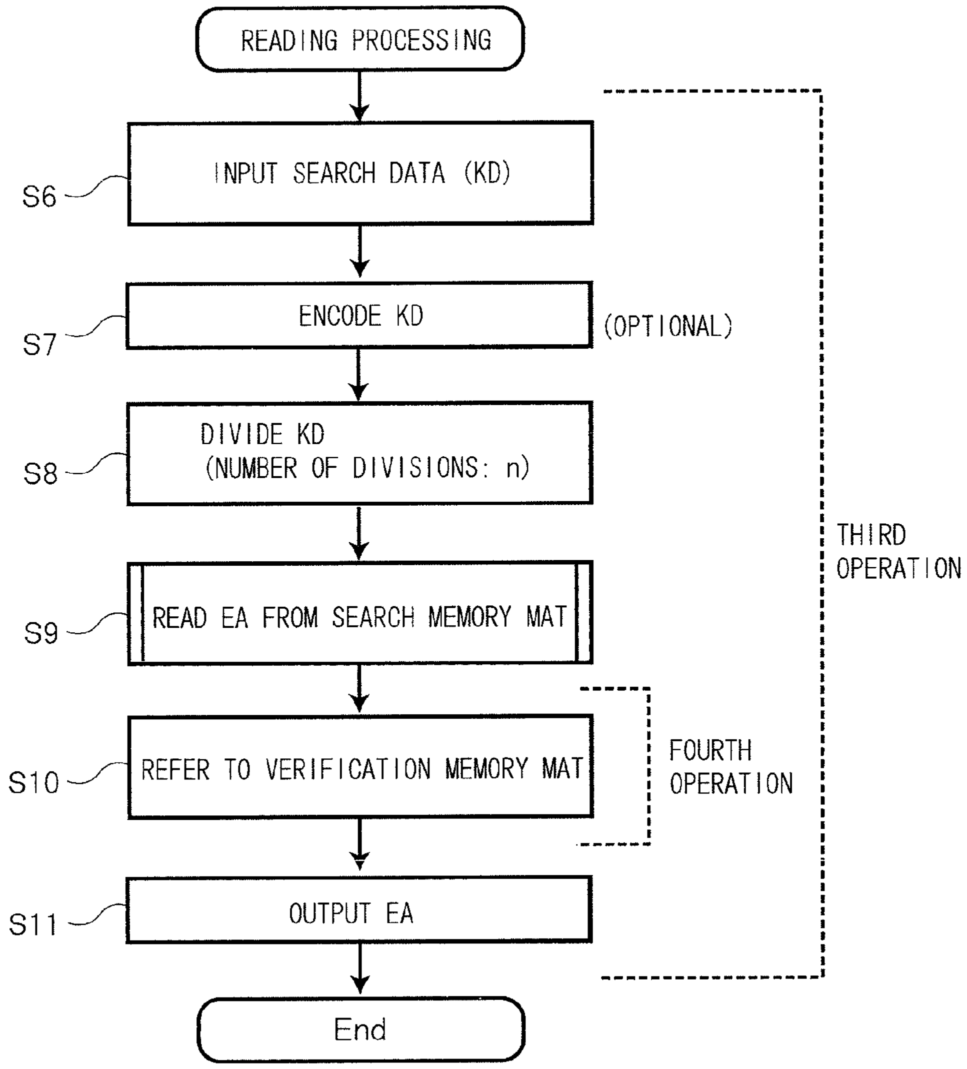
FIG. 4 is a flowchart illustrating a main flow of a reading method according to an embodiment of the present invention.
Figure 5:
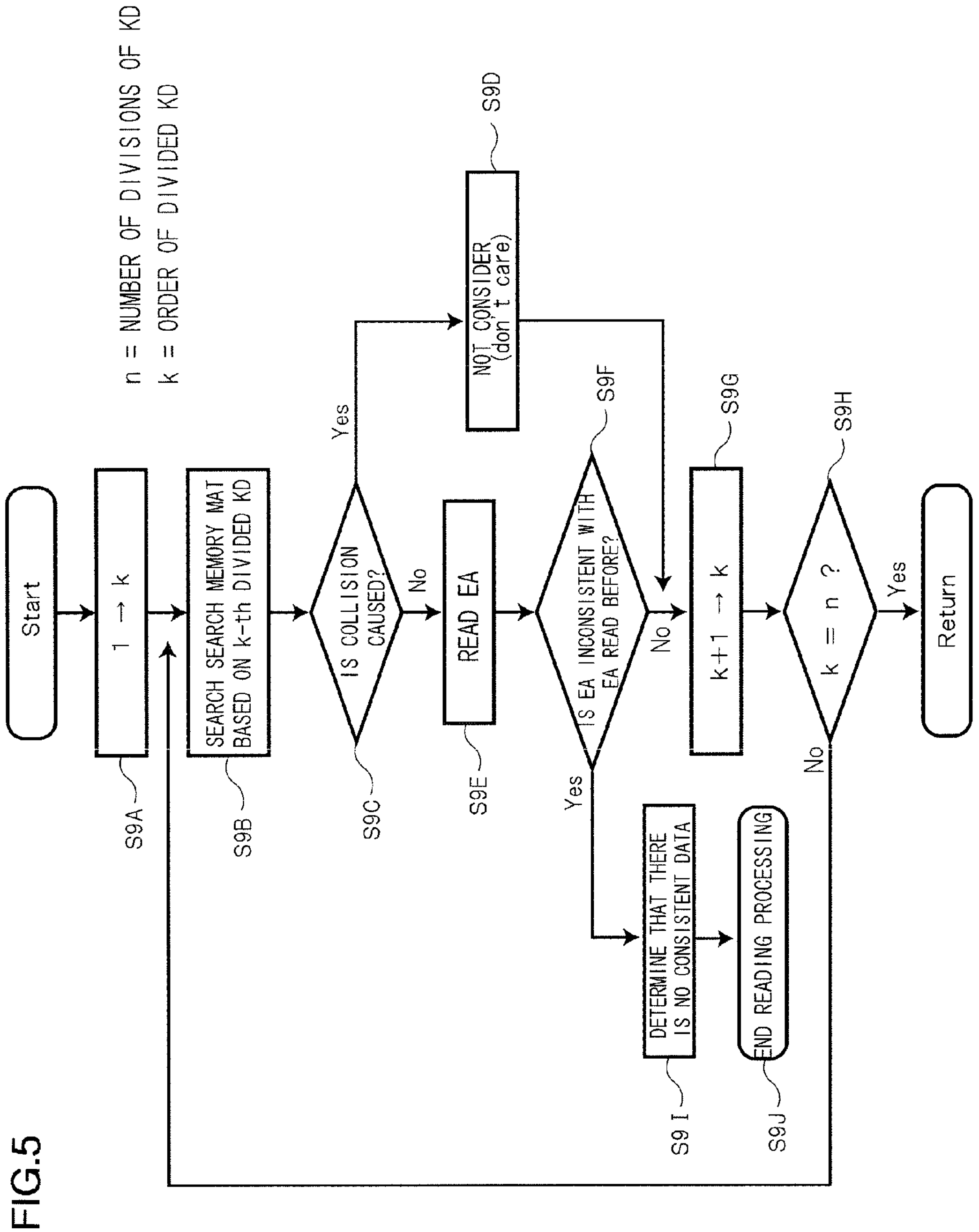
FIG. 5 is a flowchart illustrating a sub-flow of the reading method according to an embodiment of the present invention.

Here, FIGS. 4 and 5 are flowcharts illustrating the reading processing performed by the control circuit 105. The reading processing here is processing of reading an entry address corresponding to the key data when data consistent with key data to be searched (search data) has been already written into the search memory mat 102.

As illustrated in FIG. 4, in the reading processing, first, key data to be searched in the search memory mat 102 (search data) is input to the semiconductor device (step S6). Here, the key data as the search data may be directly input to the input unit 1051 of the control circuit 105, as illustrated in FIG. 1, or may be input to the input unit 1051 of the control circuit 105 through the encoding circuit 106.

Here, when the key data as the search data is input to the encoding circuit 106, encoding processing of the key data is performed by the encoding circuit 106 (step S7). Note that the encoding processing performed here will be described in detail in [Example 4].

Meanwhile, when the key data as the search data is directly input to the input unit 1051 of the control circuit 105, the input unit 1051 sends the key data to the division unit 1052.

Following that, the division unit 1052 divides the key data as the search data into a plurality of pieces of data (step S8). Here, the division processing performed by the division unit 1052 in the reading processing (step S8) is performed using the same algorithm as the division processing (step S3) performed by the division unit 1052 in the above-described writing processing. As described above, the processing of step S8 is the same as the processing of step S3, and therefore, description is omitted.

As illustrated in FIG. 1, in the reading processing, the division unit 1052 sends the divided key data to the reading unit 1055.

Following that, the reading unit 1055 accesses the separate memories 102*a*, 102*b*, 102*c* . . . of the search memory mat 102 based on the plurality of divided key data divided by the division unit 1052, and performs processing of reading an entry address corresponding to each of the plurality of divided key data (step S9). The processing performed in step S9 will be described in more detail in FIG. 5.

The flowchart of FIG. 5 illustrates a case in which the binary data of the key data (KD) is divided into n pieces of divided key data, and the order of the divided key data is defined to be the k-th.

That is, as illustrated in FIG. 3, first, "l" is substituted for "k", and processing of the first divided key data among the n pieces of divided key data is started (step S9A).

Next, the reading unit 1055 searches the search memory mat 102 based on the first (k-th) divided key data (step S9B). To be specific, the reading unit 1055 accesses the search memory mat 102 using the binary data that expresses the first (k-th) divided key data as an address while referring to the address data for identifying the "location with which the entry address (EA) is registered" allocated to the y axis of the search memory mat 102, and extracts information written into the address accessed here of the accessed search memory mat 102. The processing here will be described later in more detail with reference to FIGS. 8(*a*) to 8(*e*) and the like.

In short, in step S9B, the reading unit 1055 accesses an appropriate location (address) of the search memory mat 102 using the same method as the method performed by the writing unit 1053 in step S5B. That is, the appropriate location (address) of the search memory mat 102 can be identified by the order (k-th) of the divided key data, currently being in processing, and the binary data of the divided key data. The method of identifying the appropriate location of the search memory mat 102 has been described in step S5B, and therefore, description is omitted.

Following that, the reading unit 1055 confirms whether or not information indicating a collision (collision flag) has been written into the address accessed based on the first (k-th) divided key data (step S9C). The "information indicating a collision" here is information written by the collision information storage unit 1054 in step S5F above.

Here, in step S9C, when having determined that the collision of entry addresses has been caused, the reading unit 1055 treats the first (k-th) divided key data as data "not to be considered (don't care)" as data to be searched (step S9D). That is, regarding the divided key data treated as data "not to be considered (don't care)", the reading unit 1055 does not read an entry address corresponding thereto, and terminates the processing (proceeding to step S9G). As described above, by introduction of the concept of "not-considering (don't care)" when a collision of entry addresses is caused in the address accessed in the reading processing, the data search can be efficiently performed at a high speed and with low power consumption.

Meanwhile, in step S9C, when having determined that the collision of entry addresses has not been caused, the reading unit 1055 reads one entry address written into the accessed location (address) of the search memory mat 102 (step 9E). That is, there is a possibility that the entry address read by the reading unit 1055 here is an entry address corresponding to the key data (search data) input as the data to be searched. However, even if the entry address corresponding to one divided key data can be read, the entry address cannot always be the entry address corresponding to the key data (search data) as the data to be searched. Therefore, the processing of reading an entry address corresponding to each of divided key data is continuously performed.

Next, the reading unit 1055 confirms whether or not the entry address read in step S9C is inconsistent with the entry address read before based on other divided data (step S9F). Note that, first, the processing of the first divided key data is performed, and the entry address read before does not exist. Therefore, the processing passes step S9F, and moves on to step S9G.

When the processing of either step S9D or step S5F above has been terminated, the reading unit 1055 adds "l" to "k", and substitutes a value of "k+l" for "k" (step S9G). Then, the reading unit 1055 confirms whether or not a value of "k" obtained through step S9G becomes equal to "n (the number of divisions of the key data)" (step S9H). When k is less than n (k<n), the reading unit 1055 returns to step S5B. For example, when the reading processing based on the first (k-th) divided key data has been completed, reading processing based on the second (k+first) divided key data is continuously performed. Meanwhile, when k becomes equal to n (k=n), the reading unit 1055 terminates the sub-flow illustrated in FIG. 5, and returns to the main flow illustrated in FIG. 4.

Following that, the reading processing based on the second (k+first) divided key data is performed following the first (k-th) divided key data. Here, for example, it is assumed that in step 9F, it is determined that the entry address read based on the second divided key data is inconsistent with the entry address read before based on the first divided data (step 9F). For example, there is also a possibility that, while the entry address read based on the second divided key data is "00", the entry address read before based on the first divided data is "01". In this case, the reading unit 1055 determines that the key data input as the data to be searched has not been registered with the search memory mat 102, and there is "no consistent data" (step S9I). Then, the reading unit 1055 terminates the reading processing as a whole here without returning to the main flow illustrated in FIG. 4. As described above, in the present invention, it can be determined that there is "no consistent data" in the stage where the second divided key data is processed, for example. Therefore, a result can be early obtained without executing the processing of reading the third and subsequent divided key data. Accordingly, the search processing can be speeded up.

As illustrated in FIG. 4, when the processing of reading an entry address has been terminated (step S9), the processing by the control circuit 105 proceeds to step S10. In step S10, the verification unit 1056 of the control circuit 105 refers to the verification memory mat 104 based on the entry address read by the reading unit 1055. In the verification memory mat 104, the entry address and the key data are stored in association with each other in correct combinations, as described in step S4. That is, here, the verification unit 1056 reads the key data associated with the entry address from the verification memory mat 104 based on the entry address read by the reading unit 1055. The verification unit 1056 then confirms whether or not the key data read from the verification memory mat 104 is consistent with the entry address of the key data input as the data to be searched. As described above, by reference to the verification memory mat 104 based on the entry address read by the reading unit 1055, whether or not the entry address is consistent with the key data input as the data to be searched can be confirmed.

For example, if all entry addresses have the same value when a plurality of entry addresses are read based on a plurality of divided key data, it is found that the entry address is correct. However, the present invention introduces a concept of "not-considering (don't care)", when a plurality of entry addresses is registered with the same location (address), and a "collision" has been caused. Therefore, when a plurality of entry addresses is read based on a plurality of divided key data, such a result may also be obtained that, while some of the entry addresses indicate the same value, others are "not considered (don't care)". Therefore, probabilistically, an error may be caused in the read entry address. Therefore, to eliminate such uncertainty, the present invention refers to the verification memory mat 104.

In step S10, as a result of reference to the verification memory mat 104, when having determined that there is no error in the entry address read by the reading unit 1055, the verification unit 1056 sends the entry address to the output unit 1057. The output unit 1057 then outputs one entry address received from the verification unit 1056 to an outside of the control circuit 105 as a search result (step S10). That is, the output unit 1057 is an output interface in the control circuit 105.

With each step above (S6 to S10), the control circuit 105 performs search of data registered with the search memory mat 102 in response to a search request from the user, and outputs one entry address corresponding to the key data input as the search data.

As described above, the semiconductor device according to the present invention includes the basic configuration illustrated in FIG. 1. The semiconductor device basically performs the writing/reading processing illustrated in FIGS. 2 to 5. This processing indicates a basic concept of the present invention. Specific processing in the present invention will be described in detail in [Example 1] to [Example 6] blow.

As described above, the present invention provides a completely new logical system method while being based on a conventional circuit configuration, especially, based on a memory circuit. That is, the present invention relates to programless architecture sophisticatedly using a configuration of key data and its entry address. In other words, the present invention relates to brain-type architecture.

In the present invention, first, a memory space of a memory circuit is separated into a plurality of clusters, and data to be written into the clusters is also similarly divided. Further, in the present invention, the divided data itself is treated as an address for accessing the cluster. Further, the address is allocated to a y axis in the memory space, and the data to be input to the cluster is allocated to an x axis in the memory space. In the present invention, the memory space in the x direction is then separated into a plurality of memories capable of independently performing writing/reading, and an input of the separated cluster is allocated to the plurality of separate memories.

Further, the present invention is based on an idea that a switch and search can be realized at a high speed with lower power consumption by introduction of the concept of "not-considering (don't care)" when addresses collide.

Further, the inventor of the present invention hits on an idea of providing input/output units of a separate memory with switches capable of selectively distributing the order of input/output data and a control circuit that controls the switches. Therefore, the separate memory can also be treated as a look up table (LUT), and the cluster in the memory can also be treated as a logic circuit. That is, the semiconductor device of the present invention becomes so-called a uniform circuit. Accordingly, the semiconductor device of the present invention can be used by switching the functions as a logic circuit and a memory, as needed. Further, the semiconductor device of the present invention can dynamically move a necessary cluster to be set to an adjacent position. Therefore, high-speed search processing with low power consumption becomes possible.

Further, the semiconductor device of the present invention can provide the input unit and the output unit of the separate memory with a switch circuit. In this case, the control circuit of the semiconductor device is further configured to be able to logically select the separate memory. The separate memory is provided with a configuration capable of logical operation as data is input as a look up table (LUT), and enables the configuration to be arranged in a plurality of block arrays, if needed.

Further, the method of writing/reading an entry address with respect to the semiconductor device of the present invention stores information indicating a collision in the address of the separate memory when a plurality of entry addresses has been written into the same address of the separate memory identified by the divided key data. Further, the method of the present invention is configured to sequentially refer to the verification memory mat with the read collision information and extract a consistent key address when all of the information read based on the divided key data is information indicating a collision.

Here, to facilitate understanding of the present invention, description will be given regarding the search memory mat and the separate memory by applying specific numerical values. The search memory mat 102 includes a plurality of separate memories. For example, when the total number of entries of the search memory mat 102 is set to be 4096 entries, the size of the address that can identify the 4096 entries becomes 12 bits. Further, assuming that the size of the key data for searching an entry address from the search memory mat 102 is 144 bits, the 144 bits divided by the 12 bits becomes 12. That is, the number of separate memories becomes 12.

When the key data of 144 bits is input, the control circuit 105 that belongs to the search memory mat 102 divides the key data into twelve pieces of key data, and allocates each of the divided key data to each separate memory associated in advance. Binary data of the divided key data is used as an address for accessing the corresponding separate memory. The control circuit 105 then writes an entry address corresponding to the key data into a location of the search memory mat designated by the divided key data. The entry address is written into all of the 12-separate memories.

Next, when reading written information, the control circuit 105 divides the input 144-bit key data into twelve pieces of key data by the same procedure as the writing procedure. Further, the control circuit 105 accesses a predetermined separate memory using the divided key data as an address. The control circuit 105 then reads data written into the designated separate memory. The read data is the entry address corresponding to the key data.

Here, the size of the input key data can also be made larger. For example, it is possible to expand the size of 144 bits of the key data to 288 bits. In this case, it is only necessary to configure such that two search memory mats 102 are arranged in parallel. Further, the total number of entries of the search memory mat 102 can also be expanded. For example, when the total number of entries of the search memory mat 102 is expanded from 4096 to 8192, it is only necessary to configure such that two search memory mats 102 are arranged in series. Note that the basic unit of the total number of entries of the search memory mat and the number of search memory mats arranged in parallel or in series are not limited to those described above, and can be freely expanded or decreased upon request.

Note that although to be described below, a switch function can be added to the search memory mat. In this case, the search memory mat can also be configured as a look up table (LUT) system logic circuit. Further, it is also possible to set so as to include, as a part of an expanded memory space, the configuration of the search memory mat.

The above description is a specific example for facilitate understanding of the present invention. Therefore, the present invention is not limited to those described above.

Example 1

Figure 6:
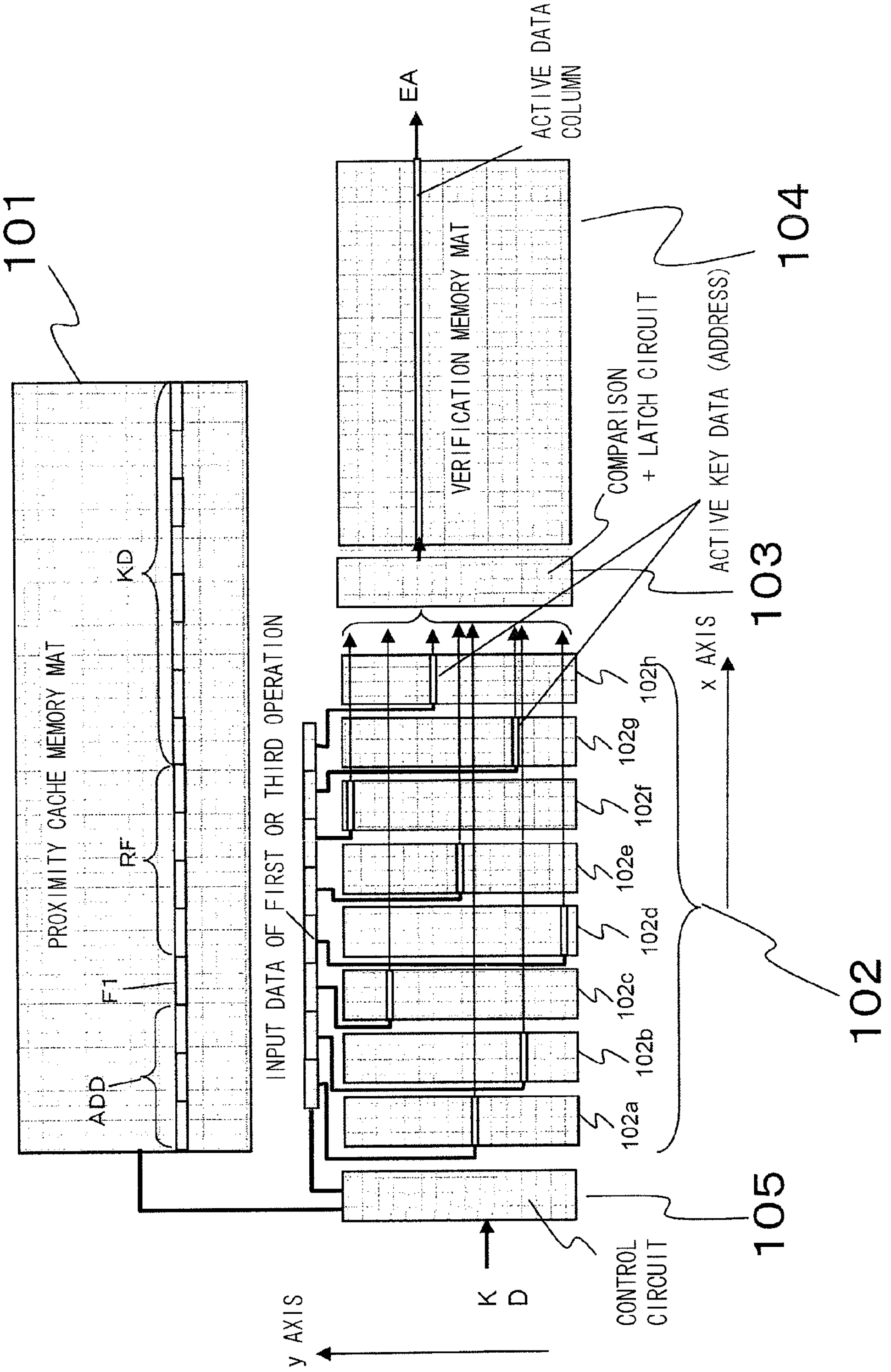
FIG. 6 is a diagram illustrating a semiconductor memory circuit configuration illustrating an example of the present invention.

FIG. 1 illustrates an example of a semiconductor device that realizes the present invention. Especially, FIG. 6 illustrates an example of a memory circuit configuration by an SRAM-CAM. Note that, in the present example, a memory configuration and basic principles of the semiconductor device configured with an SRAM-CAM will be described. However, the principles of the present invention can be realized by any semiconductor device as long as the one is provided with a memory space (memory mat) that accesses a memory array made of a row address and a column address.

As illustrated in FIG. 6, the semiconductor device according to an example of the present invention includes a proximity cash memory mat 101, a control circuit 105, a search memory mat 102, a comparison and latch circuit 103, and a verification memory mat 104. Further, the search memory mat 102 is built by a plurality of separate memories 102*a*, 102*b*, 102*c*, . . . 102*h*. Note that it is not necessary to provide the proximity cash memory mat 101 if not needed.

First, the present invention is intended to overcome a drawback of the CAM often used in a switch or a router of the Internet. That is, a conventional CAM has a drawback of consuming high power to activate all bits when data search is performed. Therefore, the present invention activates a designated entry of the y axis only, rather than activates all bits like the conventional CAM. Therefore, according to the present invention, search with active bits of one out of the number of entries (1/the number of entries) becomes possible, compared with the conventional CAM. That is, the present invention can output a search result by operating an address of one out of the number of entries (1/the number of entries) of the y axis only, compared with the conventional CAM. Therefore, in the present invention, an output encoder, which has been used by the conventional CAM, becomes unnecessary, and also a tree structure of a NAND circuit that consumes high power becomes unnecessary. Therefore, according to the present invention, the search processing can be executed with low power consumption.

As illustrated in FIG. 6, in the semiconductor device (SRAM-CAM) of the present invention, key data (KD) that is input data and an entry address (EA) are input to the control circuit 105, and are written into the search memory mat 102 by a predetermined algorithm. That is, the control circuit 105 divides the input key data into a predetermined number of pieces of data, and accesses predetermined corresponding separate memories 102*a*, 102*b*, 102*c*, . . . 102*h* using the divided key data as addresses. The control circuit 105 then writes the key data and entry addresses in the accessed separate memories 102*a*, 102*b*, 102*c*, . . . 102*h*. The writing operation by the control circuit 105 is performed with respect to all of the separate memories 102*a*, 102*b*, 102*c*, . . . 102*h*. Note that, in the specification of the present application, the key data input to be newly registered with the search memory mat 102 may be called "input data", and the key data input for searching the search memory mat 102 may be called "search data".

The control circuit 105 allocates a location (address) with which the entry address (EA) is registered to a y axis of the search memory mat 102, and allocates the key address (KD) to an x axis thereof. Describing this operation by the control circuit 105 in association with a basic operation of the CAM, the key data input at the time of data search is allocated to the x axis, and the location (address) with which an entry address is registered is allocated to the y axis.

In the search memory mat 102, a region in the x-axis direction is separated into a plurality of basic cells. The number of separations of the search memory mat 102 is n (n is an integer of 2 or more). In each basic cell, the entry address (EA) is stored in a location designated by the divided key data by the number of bits having an appropriate size. The example of FIG. 6 illustrates a case in which n is 8. The number of bits of the entry address stored in each basic cell is determined according to the number of bits of the divided key data. The number of bits of the key data is an arbitrary number.

In the verification memory mat 104, the entry address (EA) is allocated to the y axis, and the key data (KD) corresponding to the entry address is allocated to the x axis. That is, the key data corresponding to the entry address is written into the x axis of the verification memory mat 104.

Figure 7:
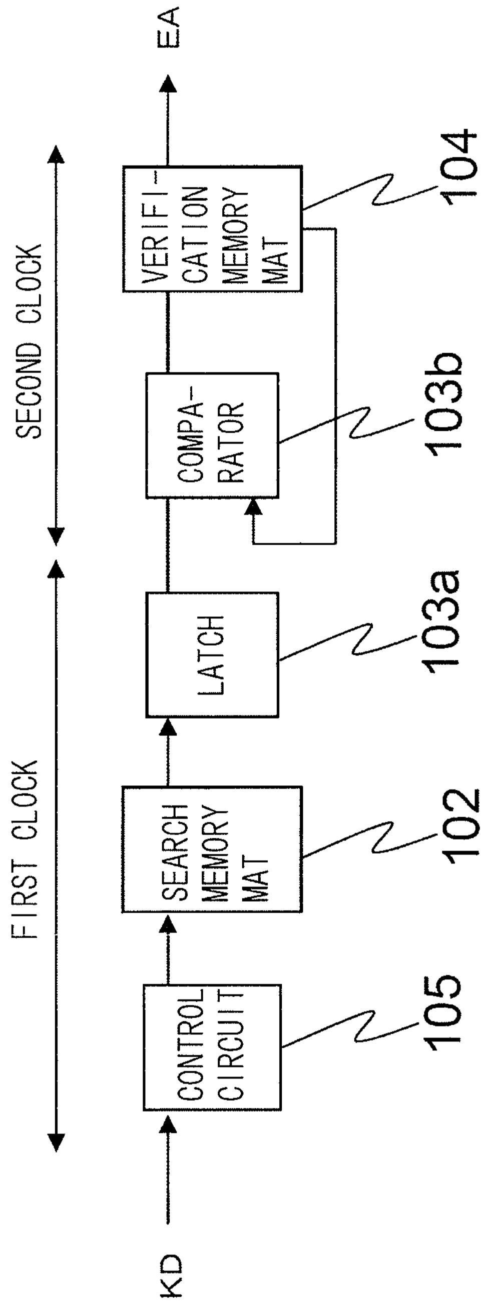
FIG. 7 is a diagram illustrating an operation of a switch or search of SRAM-CAM illustrating an example of the present invention.

FIG. 7 illustrates timing of the search operation of the memory circuit illustrated in FIG. 6 in connection with a first clock and a second clock. In the first clock, operations of inputting the key data (KD) to the control circuit 105, reading the entry address (EA) stored in each separated mat, and latching the read entry address to a latch circuit 103*a* are executed. Following that, in the second clock, operations of comparing data of the latch circuit 103*a* in a comparator 103*b*, inputting an entry address of which the consistency has been confirmed to the verification memory mat 104, and determining the entry address of which the consistency has been confirmed by referring to the verification memory mat 104 to be an output of the CAM are executed.

As described above, FIG. 7 illustrates an operation of a switch or search by the SRAM-CAM according to the example of the present invention. As illustrated in FIG. 7, in the present example, one search operation is completed in a two-clock machine cycle. In contrast, in the conventional CAM, at least three clocks are required to perform one search operation, and typically, five to ten clocks are required. That is, power supply for operating all bits is indispensable in the conventional CAM. Therefore, an operation in a pipeline manner is required. Further, in the conventional CAM, an encoder consumes one clock. Therefore, at least three clocks are required. The SRAM-CAM of the present invention can complete the search operation in two clocks, as illustrated in FIG. 7, by devising the method of inputting the key data. That is, the SRAM-CAM of the present invention can execute the search operation with the power of one out of the number of entries (1/the number of entries) compared with the conventional CAM.

FIGS. 8(*a*) to 8(*e*) illustrate a writing operation of the SRAM-CAM according to the example of the present invention. FIGS. 8(*a*) to 8(*e*) illustrate an example of a case in which entry addresses of four pieces of key data (KD="2699""3779""1859""1440") are input to the search memory mat 102. Note that, in the example illustrated in FIGS. 8(*a*) to 8(*e*), there is still a blank in the search memory mat 102 even after all of the entry addresses of the four pieces of key data are input. Therefore, in the example of FIGS. 8(*a*) to 8(*e*), the key data of the number of entries or more can be registered. This is because the key data length is substantially larger than the number of entries. In the example of FIGS. 8(*a*) to 8(*e*), the key data length is twice or more the number of entries.

An example of an operation of writing an entry address into the search memory mat 102 will be described with reference to FIGS. 8(*a*) to 8(*e*). In the example of FIGS. 8(*a*) to 8(*e*), the search memory mat 102 is separated into six mats (the number of separations of the search memory mat: N). Accordingly, a search memory mat 102*b* is built by the six separate memories 102*a*, 102*b*, 102*c*, 102*d*, 102*e*, and 102*f*. Further, in the example of FIGS. 8(*a*) to 8(*e*), the key data written into the search memory mat is expressed by 12 bits. Such 12-bit key data is written into the six separate memories. Therefore, the control circuit 105 divides the input key data into six pieces of data (the number of divisions of the key data: n). Therefore, the number of bits of each of the divided key data becomes two bits.

Further, as illustrated in FIGS. 8(*a*) to 8(*e*), locations with which a plurality of entry addresses is registered are allocated to each of the plurality of separate memories 102*a* to 102*f* that configures the search memory mat 102, in the y-axis direction thereof. As described above, the storage region of each of the separate memories 102*a* to 102*f* is separated into a plurality of regions in the y-axis direction. In the example illustrated in FIGS. 8(*a*) to 8(*e*), each of the separate memories 102*a* to 102*f* has four locations with which an entry address is registered. Further, as illustrated in FIGS. 8(*a*) to 8(*e*), address data for identifying an address in a memory space in the search memory mat 102 is given to each location with which an entry address is registered. In the example illustrated in FIGS. 8(*a*) to 8(*e*), the address data is two-bit information. For example, the address data is expressed in binary data of "00""01""10""11". As illustrated in FIGS. 8(*a*) to 8(*e*), the address data of "00""01""10""11" just has to be given to the locations to which an entry address is registered in the order from the top.

First, the entry address (EA) is allocated to each of "2699""3779""1859""1440" that are the input key data (KD). In the example of FIGS. 8(*a*) to 8(*e*), each entry address is two bit data. That is, the entry addresses are "00""01""10""11". As described above, one entry address is associated with one piece of key data. The correspondence between the key data and the entry address may be stored in the verification memory mat 104, or may be stored in another memory. The correspondence between the entry address (EA) and the key data (KD) is illustrated in the upper left of FIGS. 8(*a*) to 8(*e*).

First, the key data input as data to be written into the entry address "00" is "2699". When the key data "2699" is expressed in binary, it becomes "10 10 10 00 10 11". In the present example, the binary values of the six pieces of divided key data are used as addresses for accessing the separated search memory mat 102. That is, the control circuit 105 writes "00" that is the entry address of the key data "2699" into each of the plurality of separate memories 102*a* to 102*f* that builds the search memory mat 102. As described above, in the semiconductor device of the present invention, the data to be written into the memory mat is in a reverse form to a normal CAM.

As illustrated in FIG. 8(*a*), the key data "2699" is divided into six pieces of data and is expressed as "10""10""10""00""10""11". The control circuit 105 writes the entry address "00" into the search memory mat 102 provided with the separate memories 102*a* to 102*f* separated using the divided key data as addresses. To be specific, the control circuit 105 accesses a location identified by the address data "10" in the first separate memory 102*a* using the first divided key data "10" in the six pieces of divided input data "2699" as an address, and writes the entry address "00" corresponding to the input data "2699" into the location. Following that, the control circuit 105 accesses a location identified by the address data "10" in the second separate memory 102*b* using the second divided key data "10" of the input data "2699" as an address, and writes the entry address "00" into the location. Further, the control circuit 105 accesses a location identified by the address data "10" in the third separate memory 102*c* using the third divided key data "10" as an address, and writes the entry address "00" into the location. Further, the control circuit 105 accesses a location identified by the address data "00" in the fourth separate memory 102*d* using the fourth divided key data "00" as an address, and writes the entry address "00" into the location. Further, the control circuit 105 accesses a location identified by the address data "10" in the fifth separate memory 102*e* using the fifth divided key data "10" as an address, and writes the entry address "00" into the location. Similarly, the control circuit 105 accesses a location identified by the address data "11" in the sixth separate memory 102*f* using the sixth divided key data "11" as an address, and writes the entry address "00" into the location.

This results in that the entry address "00" corresponding to the input key data "2699" has been written into the separate memories of the search memory mat 102 designated by the key data "2699". As described above, the key data "2699" is expressed by "10 10 10 00 10 11", and thus, the key data is divided into six pieces of data of two bits each. Then, each of the divided key data is used as an address for accessing the "location with which an entry address is registered" allocated to the y axis of the six-separated search memory mat.

The entry address corresponding to the input key data is written into the search memory mat as described above. When the search memory mat is searched, the key data as the data to be searched is divided into a plurality of pieces of data in a similar procedure to the procedure used when the key data has been written. For example, when the key data as the data to be searched is "2699", the binary data thereof is divided into six pieces of data "10 10 10 00 10 11". Accordingly, when the data of the search memory mat 102 is read using the first divided key data "10" as an address, the entry address "00" is read. Next, when the data of the search memory mat 102 is read using the second "10" as an address, the entry address "00" is read. Subsequently, similarly, when the search memory mat 102 is accessed using each piece of the third to sixth data "10""00""10""11" as an address, the entry address "00" is read from the search memory mat 102 in the same manner as described above. Note that FIGS. 8(*a*) to 8(*e*) illustrate a state in which the entry address has been read from each of the separate memories 102*a* to 102*h*.

That is, the entry address "00" can be searched using any one piece of the divided key data. Note that, in this sense, the verification memory mat 104 provided in the present example is merely for confirmation, and in principle, it is not an indispensable configuration requirement.

As described above, the search memory mat 102 is configured with a plurality of separate memories, and the processing of dividing the input and search key data is performed, whereby the problems of the conventional CAM can be solved. That is, according to the present invention, it is not necessary to activate all bits like the conventional CAM. Therefore, the drawback of consuming high power can be overcome. In the example of the present invention, to output a search result, the search can be performed using the active bits of one out of the number of entries (1/the number of entries) of the y axis. In this way, the present invention can operate only the entry addresses of one out of the number of entries (1/the number of entries) of the y axis. Therefore, in the present invention, an output encoder configured with a tree of a NAND circuit consuming a large area, which is used by an output unit of the conventional CAM, becomes unnecessary.

Next, referring back to FIGS. 8(*a*) to 8(*e*), and description is continued. Similarly to the above description, an operation at the time of inputting key data "3779" that is the next input data will be described. The key data "3779" is key data input as data to be written into the entry address "01". When the key data "3779" is expressed in binary, it becomes "11 10 11 00 00 11". The control circuit 105 accesses the storage region of the y axis of the six-separated search memory mat 102 using the binary values as addresses, and writes an entry address "01" corresponding to the key data "3779" into the search memory mat 102.

In FIG. 8(*b*), the key data "3779" is divided into six pieces of data, and is expressed by "11""10""11""00""00""11". The control circuit 105 writes the entry address "01" into the search memory mat 102 provided with the plurality of separate memories 102*a* to 102*f* using the divided key data as addresses. That is, the control circuit 105 accesses a location identified by the address data "11" in the first separate memory 102*a* using the first divided key data "11" in the divided key data of the input key data "3779" as an address, and writes the entry address "01" corresponding to the key data "3779" into the location. Following that, the control circuit 105 accesses a location identified by the address data "10" in the second separate memory 102*b* using the second divided key data "10" as an address, and writes the entry address "01" into the location. However, when the entry address is written into the second separate memory 102*b*, the entry address "00" of the key data "2699" has been already written into the location of the second separate memory 102*b*. In this way, there is a case in which a phenomenon of collision is caused when an entry address is intended to be written into the search memory mat 102. The address in which the collision phenomenon is caused is displayed as a filled portion in FIG. 8(*b*). The key data of the filled portion is processed as data "not to be considered (don't care)" in the search processing subsequently performed.

Further, in the present invention, it is favorable to provide a collision flag in order to record the fact that the collision has been caused. The collision flag can be two-bit data, for example. When the collision flag is two-bit data, for example, "00" can indicate an initial state of non-writing, "01" can indicate a state in which writing has been done, "10" can indicate a collision state, and "11" can indicate other states.

In FIG. 8(*b*), following that, the control circuit 105 accesses a location identified by the address data "10" in the third separate memory 102*c* using the third divided key data "11" as an address, and writes the entry address "01" into the location. Similarly, the control circuit 105 respectively writes the entry address "01" into the third to sixth separate memories 102*d* to 102*f* using the fourth to sixth divided key data "00""00""11" as addresses. However, the fourth to sixth addresses have been already used by the writing of another key data "2699", and thus, the collision flags are written. Accordingly, the fourth to sixth addresses are processed as addresses "not to be considered (don't care)" in the search processing subsequently performed.

The above processing results in that the entry address "01" has been written into the search memory mat 102 designated by the key data "3799". Up to this point, the processing of writing the two pieces of key data "2699" and "3799" into the search memory mat 102 has been completed. However, as for the key data "3799", the collisions have been caused in the writing operations of the second, fourth, and sixth divided key data, resulting in that the processing of "not-considering (don't care)" is performed in the subsequent search processing. Therefore, focusing on the key data "3799", three pieces out of the six pieces of divided key data are not treated as the data to be searched, resulting in that the number of pieces of the data to be searched has been decreased from six to three.

With respect to the third and fourth key data "1859" and "1440", the control circuit 105 similarly writes corresponding entry addresses "10" and "11" into the search memory mat 102 in a similar procedure to the above-described key data. As illustrated in FIG. 8(*c*), in the processing of writing the key data "1859", the address collision has been newly caused in the fifth separate memory 102*e*. Further, as illustrated in FIG. 8(*d*), in the processing of writing the key data "1440", the address collision has been newly caused in the first and third separate memories 102*a* and 102*c*.

FIG. 8(*e*) illustrates a writing state of the verification memory mat (SRAM) 104. In the memory address "00" of the verification memory mat 104, the binary data "10 10 10 00 10 11" of the key data "2699" that is the first input data is divided and sequentially written. Further, in the memory address "01" of the verification memory mat 104, the binary data "11 10 11 00 00 11" of the key data "3779" that is the second input data is sequentially written. Subsequently, similarly, in the memory address "10" of the verification memory mat 104, the binary data of the key data "1859" that is the third input data is sequentially written, and in the memory address "11" the binary data of the key data "1440" that is the fourth input data is sequentially written.

The above processing becomes the basic processing of writing an entry address corresponding to the key data input to the search memory mat 102.

Next, hereinafter, processing of searching the search memory mat 102 based on the input key data, and reading the entry address corresponding to the key data will be described.

Figure 9:
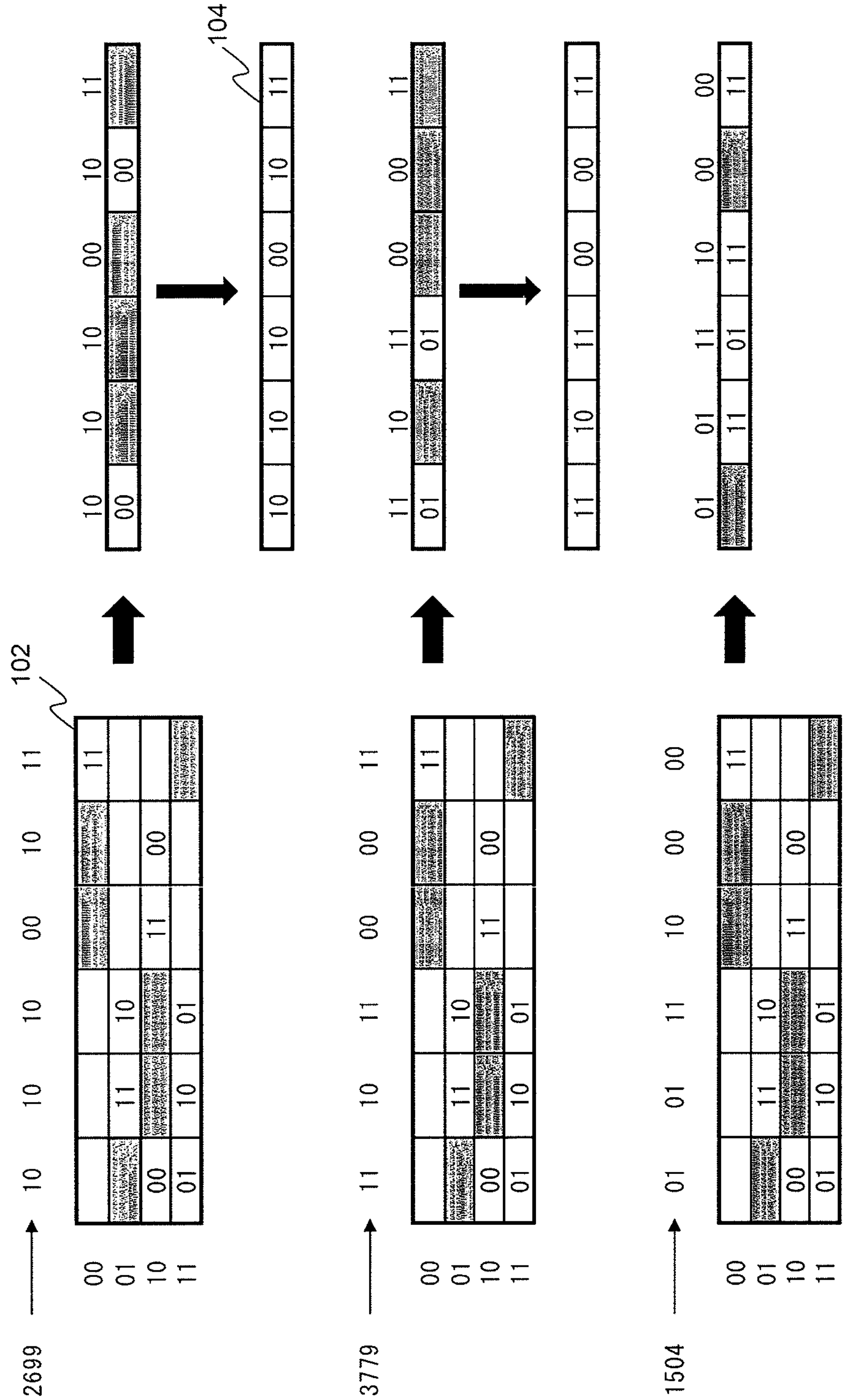
FIGS. 9(*a*) to 9(*c*) are diagrams illustrating a search operation of the SRAM-CAM illustrating an example of the present invention.

FIGS. 9(*a*) to 9(*c*) are diagrams illustrating an example of search/reading operations of the SRAM-CAM of the example of the present invention. FIGS. 9(*a*) to 9(*c*) illustrate that the search can be correctly performed based on search input data even if a collision of entry addresses has been caused at the time of the writing processing, that is, even if the dark-shaded entry address illustrated in FIGS. 8(*a*) to 8(*e*) has been treated as an address "not to be considered (don't care)".

FIG. 9(*a*) illustrates a case in which the key data "2699" has been input as the search data. The input key data "2699" is expressed by "10 10 10 00 10 11" in binary data. The binary data of the key data "2699" is divided into six pieces of data of "10""10""10""00""10""11". The plurality of divided key data is used as addresses for accessing the "locations with which an entry address is registered" allocated to the y axis of the six-separated search memory mat 102.

First, when the control circuit 105 accesses the location identified by the address data "10" in the search memory mat 102 using the first divided key data "10" of the six pieces of divided key data as an address, the entry address "00" is read from the location (address) corresponding to "10" of the first separate memory 102*a*. Similarly, the control circuit 105 accesses the location identified by the address data "10" in the second separate memory 102*b* using the second divided key data "10" as an address. However, the collision of addresses has been caused at the time of writing of the second input data "3799" of FIG. 8(*b*) into the location (address) of the second separate memory 102*b*. Therefore, in the search processing based on the second divided key data "10", the control circuit performs the processing of treating the search result as a result "not to be considered (don't care)". Therefore, the data read from the second separate memory 102*b* of the search memory mat 102 becomes excluded from the search. Whether or not the "not-considering (don't care)" processing is performed just has to be determined such that the data is read from the memory once, and the determination is made based on a flag part given to the read data. As described above, strictly speaking, the control circuit 105 performs the reading operation from the memory circuit while not performing an output of the entry address about the data excluded from the search.

As for the accesses to the search memory mat 102 using the third divided key data "10", the fourth divided key data "00", and the sixth divided key data "11" as addresses, similarly, the read data becomes excluded from the search by the "not-considering (don't care)" processing. Meanwhile, when the control circuit 105 accesses the location identified by the address data "10" in the fifth separate memory 102*f* of the search memory mat 102 using the fifth divided key data "10" as an address, the collision flag is not caused. Therefore, the entry address "00" can be read. The right side diagram of FIG. 9(*a*) illustrates that the entry addresses (EA) read from the search memory mat 102 are arranged based on the key data "2699".

As illustrated in FIG. 9(*a*), an entry address that is actually used for search among the entry addresses read from the search memory mat 102 based on the key data "2699" as the search data results in the entry address "00" written into the first separate memory 105*a* and the fifth separate memory 105*e*.

Here, when the value of the key data is read from the verification memory mat 104 illustrated in FIG. 8(*e*) based on the entry address "00", it is found that the key data corresponding to the entry address "00" is "10 10 10 00 10 11". The "10 10 10 00 10 11" is "2699" in the decimal system. From this, it is found that the entry address "00" read in the reading processing is of the key data "2699" input as the search data. That is, the present invention reads the entry address from the search memory mat 102 and accesses the verification memory mat 104 using the entry address while applying the "not-considering (don't care)" processing. Therefore, the present invention compares the key data that is the output data from the verification memory mat 104 and the key data input as the data to be searched, confirms that these pieces of key data are consistent with each other, and then outputs the entry address thereof.

FIG. 9(*b*) illustrates a case in which "3779" is input as the key data of the search input data. The input key data "3779" is expressed by "11 10 11 00 00 11" in binary data. The binary data is divided into six pieces of data such as "11""10""11""00""00""11", and the divided data is respectively used as addresses for accessing the "locations with which an entry address is registered" allocated to the y axis of the search memory mat 102. When data is read from the first separate memory 102*a* using the first divided key data "11" as an address, the entry address "01" is read. While data is read from the second separate memory 102*b* using the second divided key data "10" as an address, the data has had the address collision at the time of inputting the input data "3779". Therefore, the data is treated as data "not to be considered (don't care)" and becomes excluded from the search.

When data is read from the separate memory 102*c* of the search memory mat 102 using the third divided key data "11" as an address, the entry address "01" is read. Further, the collisions have been caused in the accesses to the search memory mat 102 respectively using the fourth divided key data "00", the fifth divided key data "00", and the sixth divided key data "11" as addresses. Therefore, the data becomes excluded from the search by the "not-considering (don't care)" processing.

As illustrated in FIG. 9(*b*), the value read from the search memory mat 102 based on the key data "3779" as the search data results in the entry address "01" written into the first separate memory 102*a* and the third separate memory 102*c*.

Here, when the value of the key data stored in the verification memory mat 104 illustrated in FIG. 8(*e*) is read using the entry address "01", the value becomes "11 10 11 00 00 11", and it is found that the value is consistent with the key data "3779" as the input data. That is, while applying the "not-considering (don't care)" processing, the control circuit 105 accesses the verification memory mat 104 using the entry address read from the data read from the search memory mat 102. Then, the control circuit 105 compares the key data as the output data from the verification memory mat 104 and the key data input as the data to be searched, confirms that these pieces of key data are consistent with each other, and then outputs the entry address.

Next, FIG. 9(*c*) illustrates processing in a case in which key data "1504" not written into the search memory mat 102 is input as the key data to be searched.

First, when the key data "1504" is input as the search data, binary data of "1504" is divided into six pieces of data such as "01""01""11""10""00""00". The six pieces of divided key data are respectively used as addresses for accessing the "locations with which an entry address is registered" allocated to the y axis of the search memory mat 102. When data is read from the first separate memory 102*a* using the first divided key data "01" as an address, the address collision has been caused at the time of the writing processing. Therefore, the "not-considering (don't care)" processing is performed. Next, when data is read from the second separate memory 102*b* using the second divided key data "01" as an address, the entry address "11" is read. Next, when data is read from the third separate memory 102*c* using the third divided key data "11" as an address, the entry address "01" is read. However, the entry address "01" read here has a value different from the entry address "11" read before. That is, an inconsistency is caused between the entry addresses "11" and "01" read based on the key data "1504". From this, it is found that the key data "1504" has not yet been recorded in the search memory mat 102. Therefore, the control circuit 10 can determine that there is "no consistent data" at the stage where the control circuit 10 has processed the third divided key data.

As described above, when the inconsistency is caused between the entry addresses read from the search memory mat 102, the confirmation processing using the verification memory mat 104 as described above becomes unnecessary. Note that, although not illustrated in the present example, when there is a plurality of address collisions in the same separate memory, and the "not-considering (don't care)" processing is performed, such a problem may be caused that the key data input as the search data is not consistent with the key data corresponding to the entry address output in the reading processing even if all of the entry addresses read from the memory are consistent. However such a problem can be solved by reference to the verification memory mat 104. That is, the access to the verification memory mat 104 is made based on the entry address read from the search memory mat 102, and it can be determined that there is "no consistent data" when the key data as the data to be searched is not consistent with the key data output from the verification memory mat 104.

Figure 10:
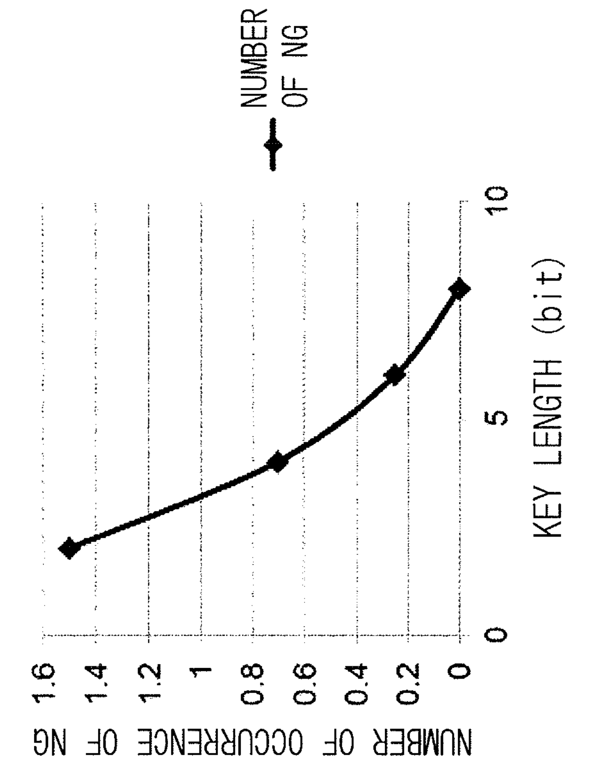
FIGS. 10(*a*) and 10(*b*) are diagrams illustrating the number of occurrence of NG at the time of search when key data is written by the number of entries of the SRAM-CAM illustrating an example of the present invention.
Figure 10:
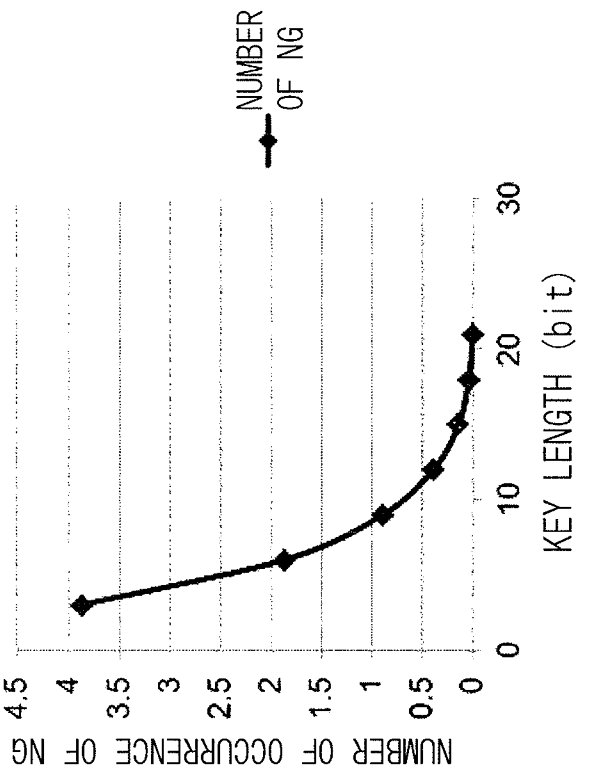

FIGS. 10(*a*) and 10(*b*) are graphs illustrating the number of occurrence of search inconsistency (NG) at the time of writing of the key data by the number of entries. That is, the graphs of FIGS. 10(*a*) and 10(*b*) illustrate examples in which the "not-considering (don't care)" processing is caused many times in the search memory mat 102, and the probabilities of malfunction are simulated from a table of random numbers. FIG. 10(*a*) illustrates a case in which the key data is four bits or more, and the number of entries of the search memory mat is four. Further, FIG. 10(*b*) illustrates a case in which the key data is eight bits or more, and the number of entries of the search memory mat is eight. From the simulation result illustrated in FIG. 10(*a*), it is found that the number of occurrence of the search inconsistency (NG) becomes as close as zero when the key data length is set to 8 bits or more. Similarly, from the simulation result illustrated in FIG. 10(*b*), it is found that the number of occurrence of the search inconsistency (NG) becomes as close as zero when the key data length is set to 16 bits or more. That is, from these simulation results, it is found that when the number of bits of the key data is twice or more the number of entries of the search memory mat, the occurrence of the malfunction of the semiconductor device and the search inconsistency (NG) can be almost reliably prevented. Therefore, it is favorable that the number of bits of the key data is twice or more the number of entries of the search memory mat.

As described above, the semiconductor device of the present invention writes the entry address of the input data into the plurality of separate memories that configures the search memory mat 102 using the divided key data obtained by division of the input data as addresses. Since the divided key data is obtained by division of the input data into a plurality of pieces of data, there is a possibility of occurrence of the collision state when the divided key data is written into the search memory mat 102.

The operation of writing the entry address into the plurality of separate memories is referred to as a "first operation". Note that an example of the processing steps of the first operation is also illustrated in FIG. 2.

The above first operation becomes an operation of creating basic information data for performing a switching operation or search processing in the search memory mat.

In the first operation, even if a plurality of entry addresses is written into the same address, the collision flag is set, and the input proceeds as is. Then, when the search memory mat is searched, an address to which the collision flag is set is processed as data "not to be considered (don't care)". In this way, in the present invention, the problem of the address collision caused when the entry address is written into the separate memory is solved when the search operation is performed.

Here, as described in the present example, a case in which the bit length of the input key data (KD) is substantially larger than the number of the entry addresses (EA), for example, a case in which the bit length is twice or more the number of the entry addresses will be considered.

For example, when the bit length of the key data is smaller than the size of the entry address, the total sum of the data of divided portions can be made larger than the bit length of the original key data by dividing the key data such that a part of the first data of the divided portion is overlapped with the next divided key data when the key data is divided. By the expansion of the key data, the bit length of the key data can be substantially made larger than the size of the entry address even if the bit length of the key data is smaller than the size of the entry address. However it is necessary that the key data be expanded such that the divided key data are not completely overlapped each other.

Further, in order to secure the reliability of the data, it is important to make it possible to confirm that the data output as the search result is correct in the search operation described below. Therefore, in the example of the present invention, a part of the memory space is allocated to the verification memory mat 104. The verification memory mat 104 includes a region in the y-axis direction, where the entry address (EA) is stored, and a region in the x-axis direction, where the key data (KD) is stored in association with the entry address. Further, in the example of the present invention, the input key data and the entry address are written into the verification memory mat 104 at the same time as the input key data is written into the search memory mat 102. In this way, the confirmation basic information data is prepared in the verification memory mat 104. Such an operation of writing the key data into the verification memory mat 104 is referred to as a "second operation". Note that an example of the processing steps of the first operation is also illustrated in FIG. 2.

Following that, the control circuit 105 searches the search memory mat 102 based on the input key data in response to a request from a user, and performs the processing of reading the entry address corresponding to the key data. In the processing of reading the entry address, the control circuit 105 divides the key data input as the search data according to the method of dividing the key data (KD) described above, activates the search memory mat with the divided key data, and outputs the entry address (EA) read based on the divided key data. The search processing is referred to as a "third operation". However the control circuit 105 treats an entry address in which the address collision has been recorded in the writing processing (the first operation) described above as an entry address "not to be considered (don't care)" in the reading processing, and does not output the entry address.

Further, the control circuit 105 reads one or more entry addresses based on the plurality of divided key data, and refers to the verification memory mat 104 in which the confirmation basic information data is stored using the entry addresses when all of the read entry addresses are consistent. That is, the control circuit 105 compares the entry address read in the search processing and the key data input as the data to be searched with the entry address stored in the y axis and the key data stored in the x axis of the verification memory mat 104. Then, after confirming that the entry addresses and the key data are consistent, the control circuit 105 outputs one entry address. Such an operation of referring to the verification memory mat 104 is referred to as a "fourth operation". Note that an example of the processing steps of the fourth operation is also illustrated in FIG. 4. Note that the entry address output in the third operation and the third operation described above becomes a switch connection address or a search address.

As described above, the present invention realizes a memory circuit configuration that enables the four operations from the first to fourth operations, that is, a logic method configuration by the memory circuit of an SRAM-CAM illustrated in FIG. 6.

Example 2

Next, another method of reducing the probability of malfunction of a semiconductor device even if "not-considering (don't care)" processing is caused many times will be described as an example of the present invention.

First, an outline of this example will be described. In this example, as a search memory mat 102, m (m is an integer of 2 or more) definition blocks are prepared. Further, when the number of entries of the search memory mat 102 is defined to be an arbitrary size, entry addresses are divided and are input to one block from a lower order to 1/m of the number of entries. Then, inputs of certain number or more of entry addresses are stopped with respect to the one block, and the operation is moved to another memory block and the input operation is continued, so that large basic information data is stored in a plurality of memory blocks. In this method, a condition is made where the key data length is ⅛ bits or more of the number of entries. As for remaining entry addresses in upper order than 1/m, the entry addresses are sequentially input to memory blocks from a lower-order address, similarly to the first memory block. In the present example, switching of the operations among memory blocks and the like can be controlled by a selector. Accordingly, an upper-order/lower-order search address is composed, and is input to the y axis as an address axis of the confirmation search mat, so that the first to fourth operations described in Example 1 can be performed.

Figure 11:
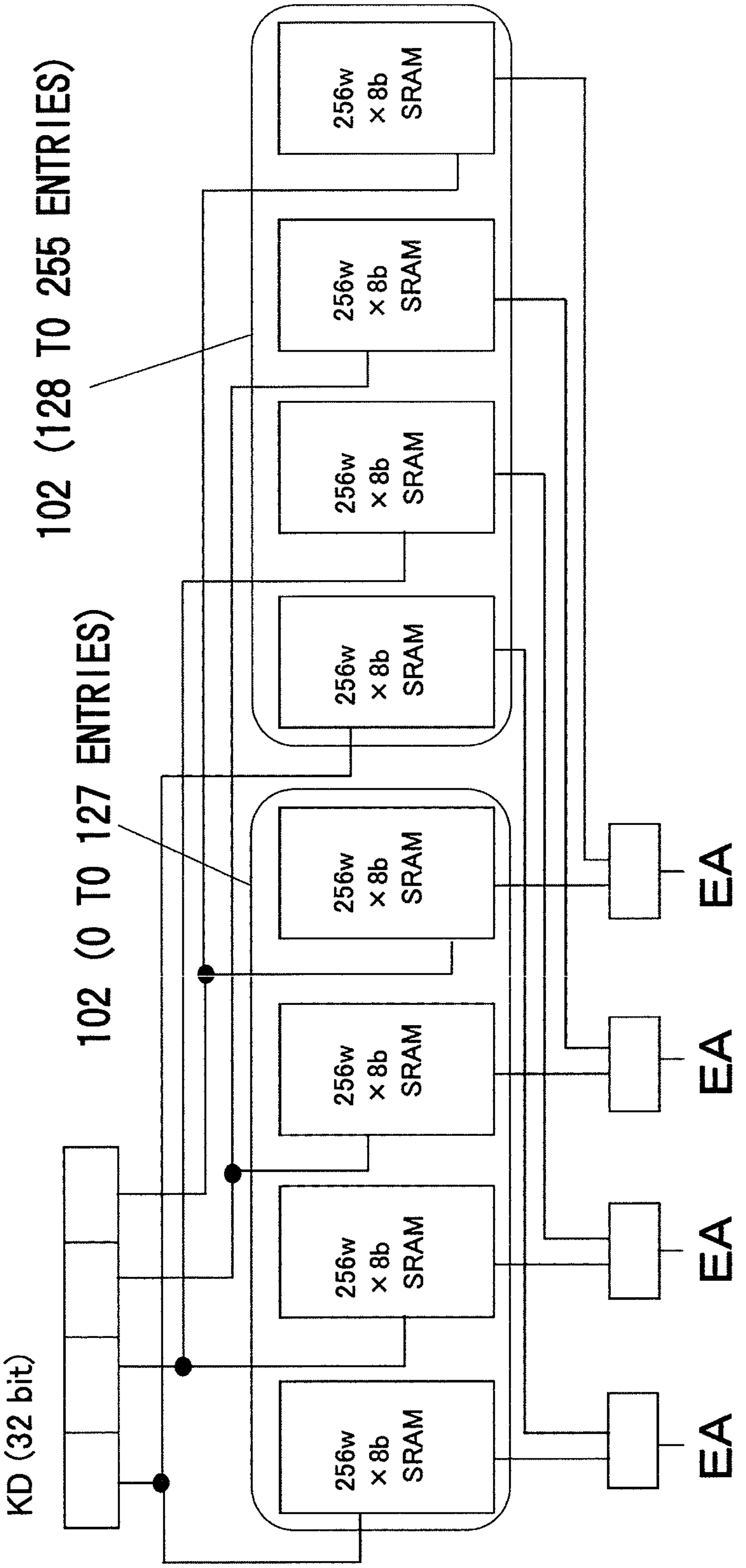
FIG. 11 is a diagram illustrating a semiconductor memory circuit configuration illustrating another example of the present invention, and is a configuration diagram illustrating an example in which the number of entries of 256 is adapted.

FIG. 11 illustrates an example of a case where the number of entries of the search memory mat 102 is 256.

As illustrated in FIG. 11, the search memory mat 102 is configured with two memory mats. Here, when the size of the entry in the y-axis direction is 256, 0 to 127 entries are input to the first search memory mat 102, and 128 to 255 entries are input to the second search memory mat 102. Accordingly, the probability of occurrence of malfunction can be almost reliably maintained at a practical level or less. Switching between the two memory mats that configure the search memory mat 102 just has to be performed using a first flag F1 that is added to a header. In the actual search memory mat 102, two bits are required for the flag. Therefore, in a case of the key data of 256 entries×32 bits, the search memory mat becomes configured with eight SRAMs having 256 words×10 bits and the verification memory mat 104 becomes configured with one SRAM having 256 words×32 bits.

Figure 12:
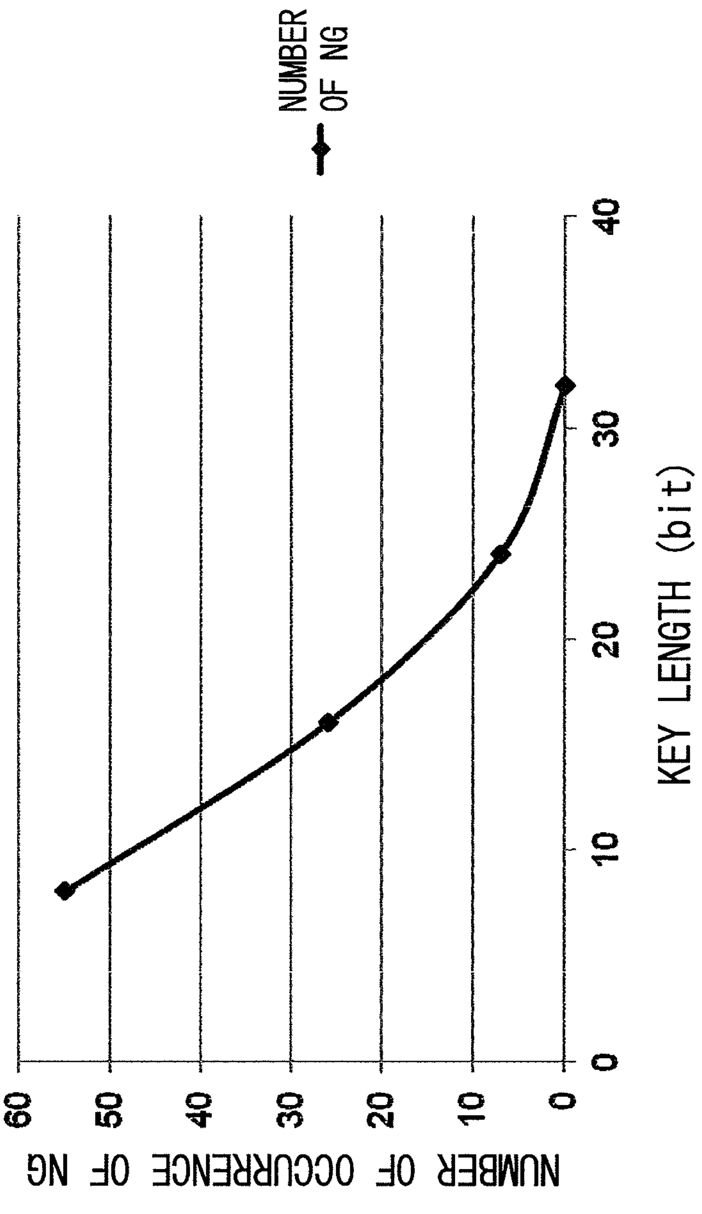
FIG. 12 is a diagram illustrating a probability that a malfunction has gone with a key data length of 32 bits even if an entry width (the number of entries) is 256 in FIG. 11.

As described above, the number of entries that can be written into the search memory mat 102 is limited to 1/m (m is an integer of 2 or more), whereby the probability of occurrence of malfunction can be decreased. FIG. 12 illustrates a simulation result of the probability of the occurrence of malfunction in a case where m is 2, that is, in a case where the number of entries to be written into the memory is limited to ½. As illustrated in FIG. 12, even if an entry width (the number of entries) is 256 words (8 bits), malfunction has gone probabilistically with the key data length of 32 bits. Note that, in the simulation illustrated in FIG. 12, a random number function of EXCEL was applied as data to be written of the CAM.

While an example of preventing malfunction has been described in the foregoing, as another example of the present invention, there is also a method of eliminating a non-writing region and efficiently registering an entry address with the search memory mat 102.

Regarding the number of registration entry addresses that are entry addresses to be able to be written, there is no non-writing region only if all of the registration entry addresses are unique in terms of the unit of SRAM. Unique indicates two cases of a case where the address of the SRAM and the content of the SRAM are the same, and a case where the content or address of the SRAM is arbitrarily replaced in the state of the former case, when the SRAM is assumed to have a configuration of n words×n bits.

Figure 13:
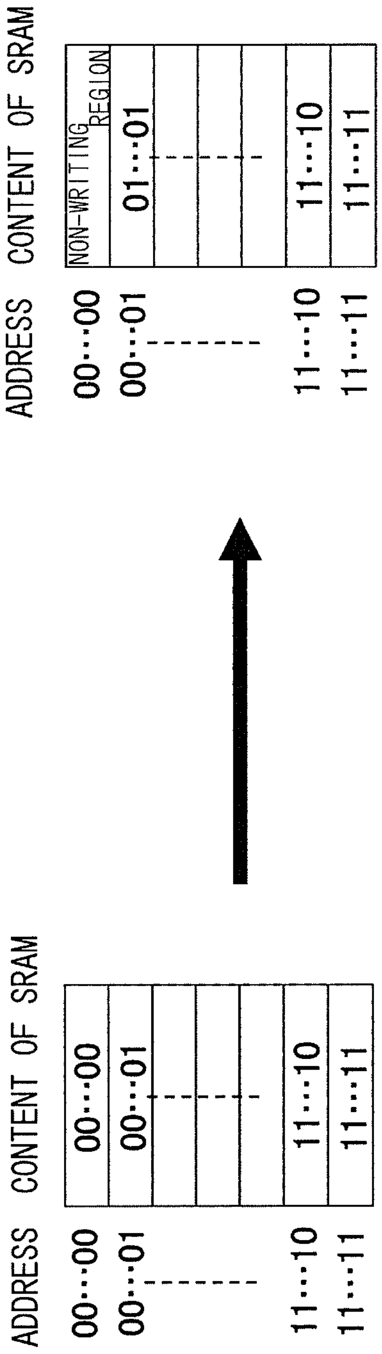
FIG. 13 is a diagram illustrating a configuration in which a non-writing region is increased when data of entry addresses is the same, so that the number of writing can be increased.

However, as illustrated in FIG. 13, if overlapping of the content or address of the SRAM is caused in a plurality of places, the non-writing region is increased to that extent. That is, when the content of the SRAM is the same, for example, when data of an address of “00 . . . 00” is the same as data of an address of “00 . . . 01”, the content of the address of “00 . . . 00” becomes the non-writing region as illustrated in the right diagram. That is, if data that is not unique is increased, the non-writing region is increased (registration can be easily performed) as a result. By making use of this, the number of writing can be increased. The reason why this is explained here is that the same data tends to be repeatedly used like a header in a case of search of a CAM, for example, and as a result, the non-writing region tends to be increased in terms of individual SRAM.

Here, the present example will be summed up from the aspect of its effects.

First, since the SRAM is used, an increase in size is easy, and low power consumption of one out of the number of entries (1/the number of entries) can be realized, compared with a typical CAM.

Next, if one of the separate memories (SRAM) in which the entry addresses have been written remains after the writing operation is terminated, the registered entry address can be correctly searched.

Even if a plurality of addresses that is excluded from the search exists in the separate memories (SRAM), correct search can be performed by using the verification memory mat (SRAM). While the present example has been described using the SRAM, the content of the verification memory mat just has to be a device in which input data can be written according to an address, and can also be realized by a register and the like.

According to the present example, when the address collision is caused at the time of entry registration of key data, the non-writing region is increased by introduction of exclusion from the search that becomes outside the search by performing the “not-considering (don’t care)” processing. By making use of the non-writing region, the entry address can be expanded.

Further, according to the present example, when all of the separate memories (SRAM) of the search memory mat 102 become excluded from the search at the time of entry registration of key data, the entry registration of key data cannot be performed. However, this state indicates that the area of the SRAM that configures the CAM is in overflow. As countermeasures, this can be solved by preparing a plurality of search memory mats and, when such a state is caused, switching a search memory mat to another.

Example 3

Next, in Example 3, a procedure of further performing function expansion about the semiconductor device described in Examples 1 and 2 will be described.

In Examples 1 and 2, the processing of writing an entry address is limited to a region that has no malfunction due to a collision of addresses in the separate memory to prevent malfunction. In addition, by an increase in the number of entry addresses that can be input, the malfunction can be further prevented.

Figure 14:
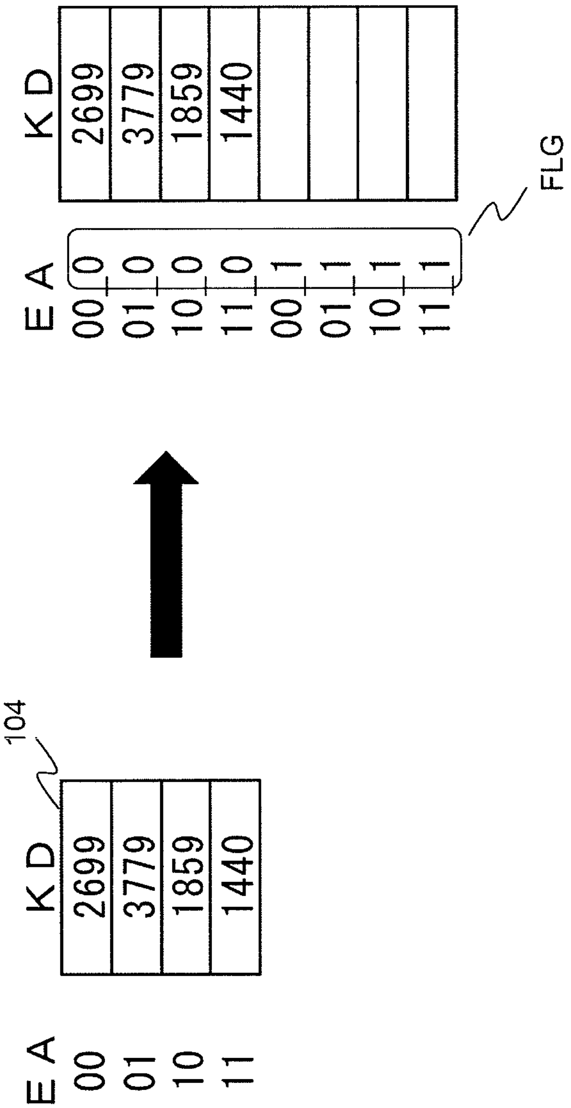
FIG. 14 is a diagram illustrating a configuration diagram illustrating an extension function illustrating further another example of the present invention.

For example, as illustrated in FIG. 14, an entry address (EA) can be increased from two bits (FIG. 14(*a*)) to three bits (FIG. 14(*b*)). Accordingly, the number of entry addresses of a verification memory mat 104 can be increased. As illustrated in FIG. 14, when the entry address is three bits, an expansion flag (FRG) is set, and a normal entry address (normal address) and an expanded entry address (expansion address) just have to be identified. For example, the example of FIG. 14 illustrates that when the third bit of the entry address is “0”, the entry address is a normal address, and that when the third bit of the entry address is "1", the entry address is an expansion address.

Figures 16A, 16B:
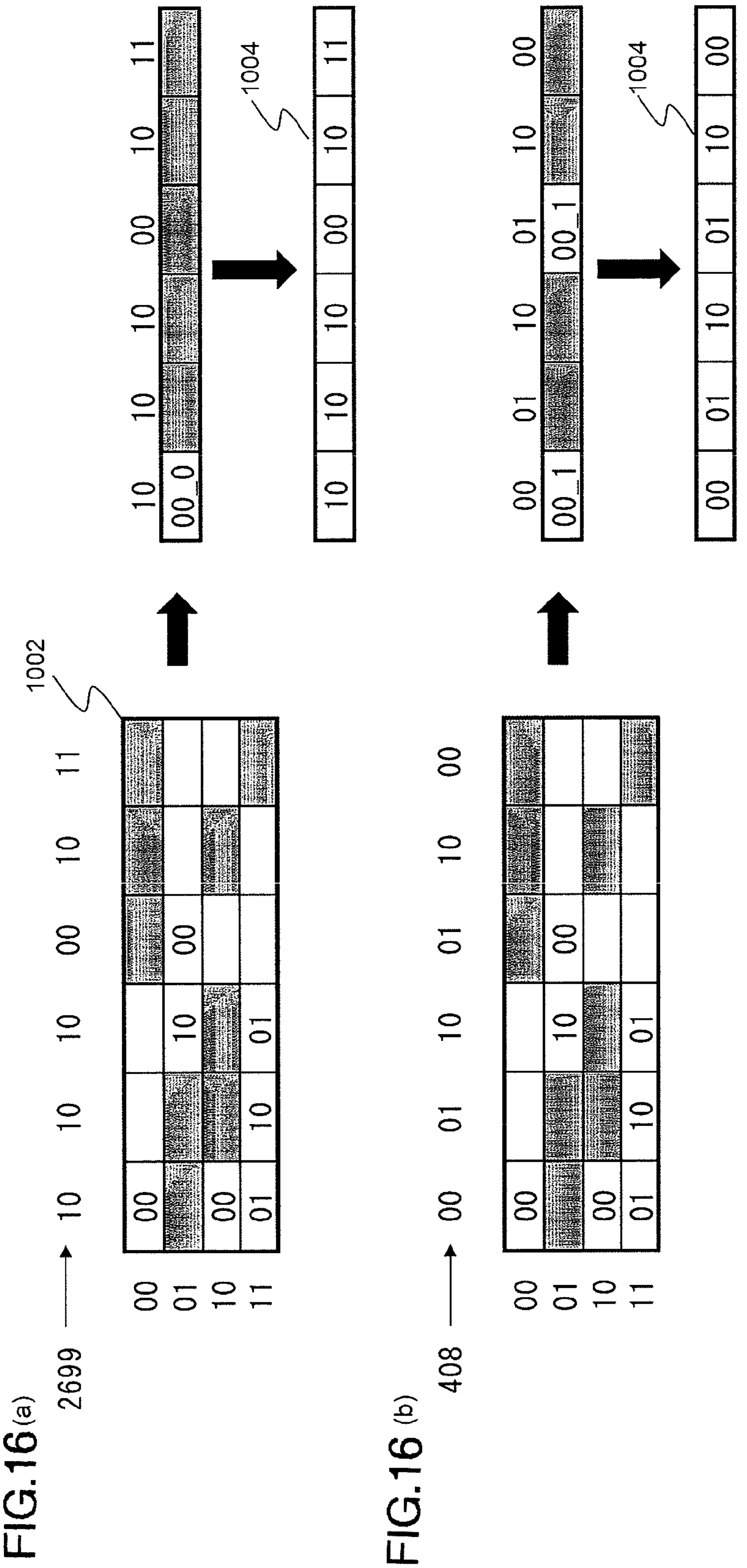
FIGS. 16(*a*) and 16(*b*) are diagrams illustrating a search operation in FIG. 14.

FIG. 15 illustrates an example of processing of writing data and FIGS. 16(*a*) and 16(*b*) illustrate an example of processing of searching data when the entry address (EA) is three bits.

FIG. 15 illustrates an example of a writing operation. As illustrated in FIG. 15, when the entry address (EA) is expressed by three bits, the number of the entry addresses (EA) becomes eight. For example, in the example of FIG. 15, in addition to the four pieces of key data "2699""3779""1859""1440" as illustrated in FIGS. 8(*a*) to 8(*e*), the fifth key data "408" is written into each of a search memory mat 1002 and a verification memory mat 1004 according to the procedure of the first operation described in Example 1.

Binary data of the key data "408" is "00 01 10 01 10 00", and the writing is performed with respect to the search memory mat 1002 using the binary data as addresses. This results in that as for the first divided key data "00", a three-bit entry address "001" is written with respect to the memory address "00". In FIG. 15, there is description of "00", but actually, "001" is written.

Since the entry address (EA) is increased from two bits to three bits, when an increased one bit is "0", the same processing as the processing performed when the entry address is two bits is performed, and when the increased one bit is "1", the bit is used for identifying that the entry address is an expansion address. To be specific, when the second divided key data "01" of the key data "408" is used as an address, the address collision is caused between the second divided key data and "1440" that has already been written (see FIG. 8(*d*)). Therefore, the "not-considering (don't care)" processing is performed. When the third divided key data "10" of the key data "408" is used as an address, the address has already been subjected to the "not-considering (don't care)" processing in the writing processing of "1440". Therefore, writing is not performed and the processing is terminated. Similarly, in the fourth divided key data "01", "001" is written into the memory address. In FIG. 15, there is description of "00", but actually, "001" is written. In the fifth and sixth divided key data "10""00", the "not-considering (don't care)" processing is performed with each of the memory addresses.

With respect to the search memory mat 1002, the writing operation can be performed similarly to Example 1 by performing the writing operation using two bits in upper order out of the three bits of the entry address.

Meanwhile, with respect to the verification memory mat 1004, the number of entries is doubled due to the three bits, and therefore, One bit in lower order of the three bits is increased as illustrated in FIG. 15. That is, input data "00 01 10 01 10 00" is written with respect to the entry address "001".

Next, FIGS. 16(*a*) and 16(*b*) illustrate a search example using the expanded entry address written in FIG. 15.

As illustrated in FIG. 16(*a*), when the key data "2699" is input as the search data, "000" is read from the first separate memory (SRAM) of the separated search memory mat 1004. Since the memory addresses corresponding to the second to sixth divided key data have been subjected to the "not-considering (don't care)" processing, read data becomes excluded from the search. Then, when the verification memory mat 1004 is accessed using "000" as an address, "10 10 10 00 10 11" is read. As described above, it is found that the confirmation result of the search memory mat 102 is consistent with the input data "2699".

Next, as illustrated in FIG. 16(*b*), when the key data "408" is input as the search data, an entry address of "001" is read from the first and fourth of the separated search memory mat 1002, and data read from the rest of the search memory mat 1002 becomes excluded from the search because the accessed data has been subjected to the "not-considering (don't care)" processing. When the verification memory mat 1004 is accessed using the read entry address "001", it is found that "00 01 10 01 10 00" is consistent with the input data "408".

Figure 17:
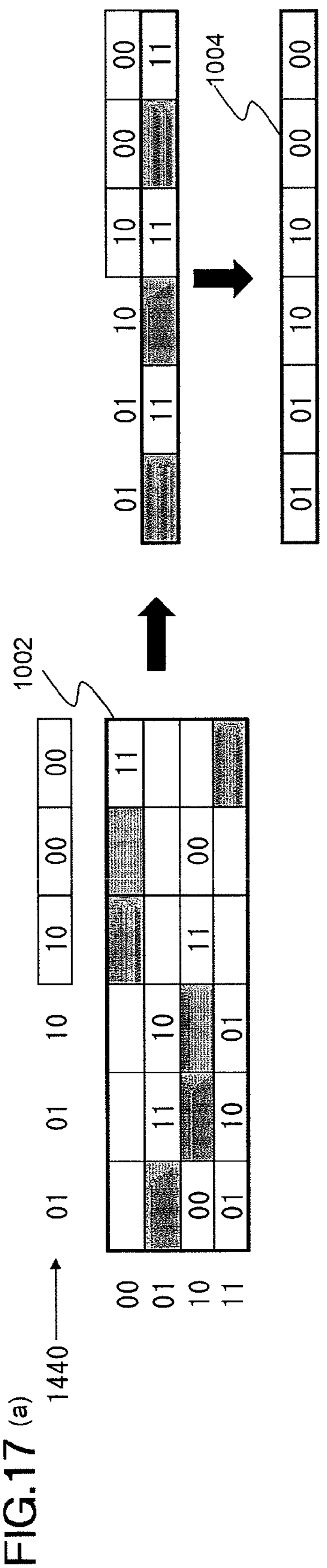
FIGS. 17(*a*) and 17(*b*) are diagrams illustrating a mask operation that becomes a basis of keyword search.
Figure 17:
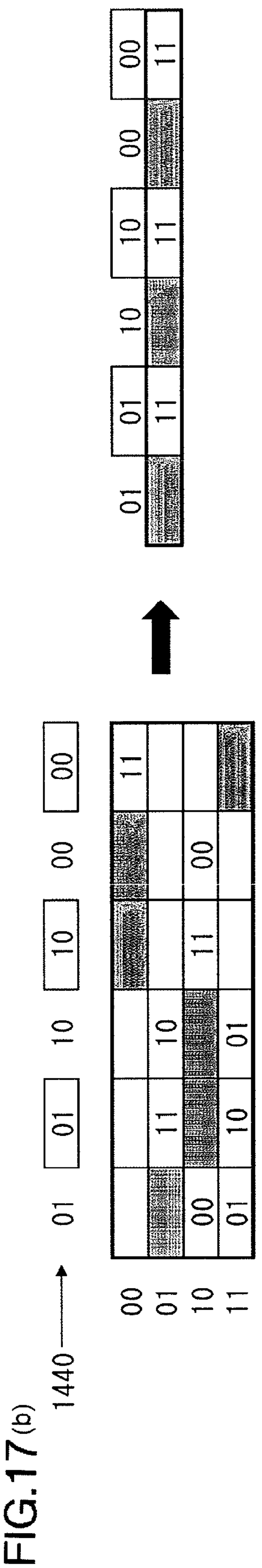

Next, a method of a mask operation that becomes a base of keyword search will be described with reference to FIGS. 17(*a*) and 17(*b*). FIG. 17(*a*) illustrates a state in which the fourth to sixth of the separate memory mat 1002 are masked and searched with the key data "1440". In this case, in the state of FIG. 17(*a*), "11" is output from the search memory mat 1002, and when the verification memory mat 1004 is accessed with the memory address "11", it is found that the output from the search memory mat 1002 and the key data as the input data are consistent with each other.

Meanwhile, FIG. 17(*b*) illustrates an example in which the second, fourth, and sixth memory mats are masked and searched with respect to the input data "1440". In this case, the first, third and fifth entries are treated as entries "not to be considered (don't care)", and the second, fourth, and sixth are masked. Therefore, there is no output of the search memory mat 1002. That is, in this case, it is determined that there is no search data.

Next, a definition of multi-hit in the example of the present invention and expansion to a search engine will be described.

Figure 18:
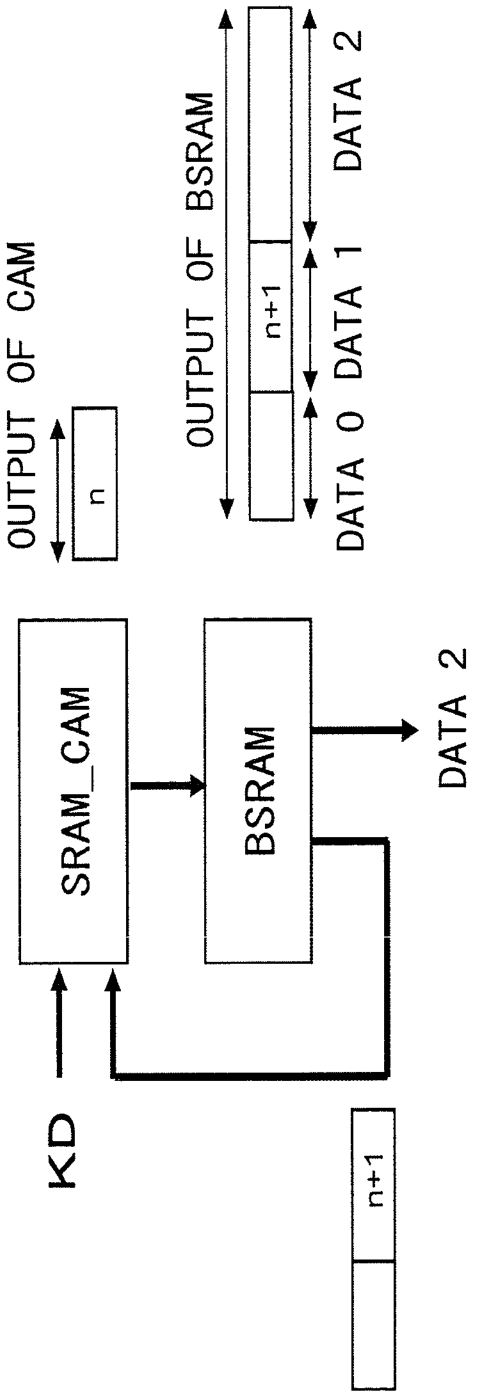
FIG. 18 is a configuration diagram illustrating an implementation of a multi-hit function.

Similarly to Examples 1 and 2, the bit of the first flag F1 as a first control bit and bits indicating a tree of a related address RF as a second, third, and fourth . . . flag bits are added to a header, and the first to third operations are completed. When the bit of the first flag F1 is not active, a single hit mode in which an operation is performed similarly to Examples 1 and 2 is performed. Meanwhile, when the first flag F1 is active, multi-hit is performed such that requested key data is processed in the third operation, and after an entry address is output, the entry address is temporarily stored in a buffer memory BSRAM, as illustrated in FIG. 18. In this case, the fourth operation is cancelled, and in the second clock, an upper-order address of the related address tree of the entry address output in the third operation is hit in a cash memory mat, data is extracted, and the data is temporarily stored together with its address. In the next clock, second data of the second address of the related address tree is hit in the cash memory mat, and the address and the data are extracted. This operation is continued until a lower order of priority in the related flag tree. When the operation is returned to the first related address, an operation of inactivating the flag is performed. This operation is a feedback loop, and thus, new search is cancelled while the operation is repeated (while the flag is active). The addresses and the data are temporarily stored in a new fourth operation, and a plurality of associated addresses is output. Data is added as needed.

Accordingly, a plurality of similarity searches that is an important role of the search engine becomes possible. In FIG. 6, when the flag F1 exists, inputs of ½ of the number of input entries described above require a flag. The number of bits is added, and a flag function is added and is associated with data, so that a flag RF is prepared. This flag is classified into several flags, and becomes a flag which enables tree search. The set information is written into a proximity cash memory mat, and thus, a sub-routine operation is started, and a plurality of search addresses and a plurality of pieces of data are output.

To enable the CAM to be used in the multi-hit, it is necessary to cause a plurality of key data to correspond to one entry.

Under present circumstances, if a plurality of key data is caused to correspond to one entry address, outputs of the search memory mat 102 become in a search neglect state, and reading of the verification memory mat 104 cannot be performed. This problem will be solved by the following method.

When a plurality of key data is caused to correspond to one entry address, the flag is set to "11". When the flag is "11", the verification memory mat 104 is not used, and when it is confirmed that all of read entry addresses except the search neglect portion are consistent, the data is determined to be the entry address.

This means that the search operation can be controlled with a part of the data of the cash memory accessed with the entry address.

Figure 19:
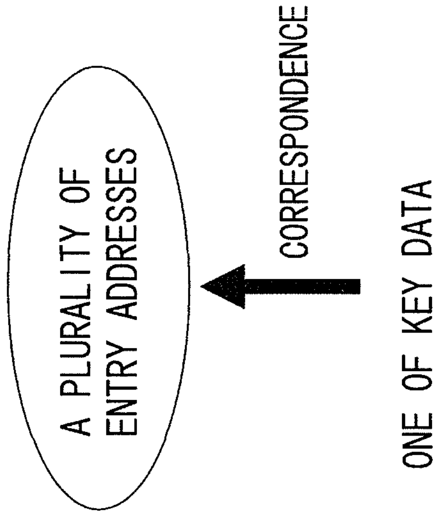
FIGS. 19(*a*) and 19(*b*) are diagrams illustrating a difference from multi-hit of a typical CAM.
Figure 19:
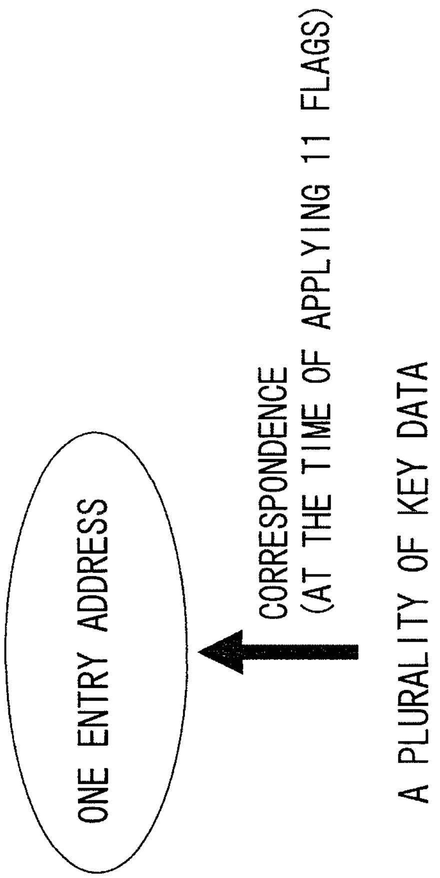

The above method is illustrated in FIGS. 19(*a*) and 19(*b*). FIGS. 19(*a*) and 19(*b*) illustrate a difference from multi-hit of a typical CAM. In the multi-hit of the typical CAM, as illustrated in FIG. 19(*a*), a plurality of entry addresses is output with respect to one key data. Meanwhile, in the multi-hit of the SRAM-CAM of the present example, one entry address is output with respect to a plurality of key data, as illustrated in FIG. 19(*b*).

Figure 20:
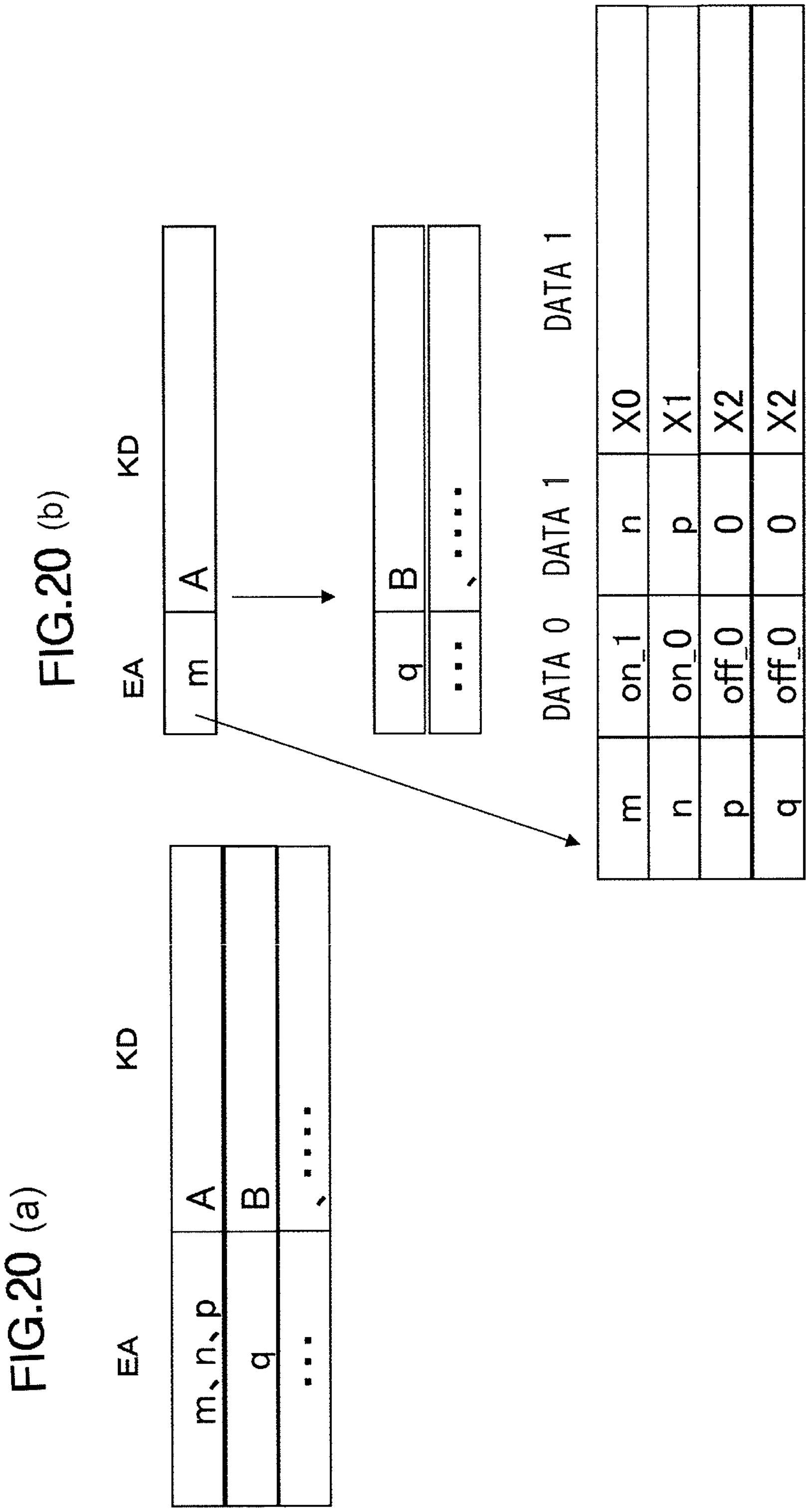
FIGS. 20(*a*) and 20(*b*) are diagrams illustrating a configuration that enables the multi-hit of the typical CAM.

A method which enables multi-hit similar to the typical CAM in the SRAM-CAM of the present invention is described in FIGS. 20(*a*) and 20(*b*). In the typical CAM, a plurality of entry addresses "m""n""p" is hit with respect to one key data "A", as illustrated in FIG. 20(*a*). In contrast, in the SRAM-CAM of the present example, the entry addresses "m""n""p" correspond to one key data "A", as illustrated in FIG. 20(*b*). The portion of data 0 uses data of 0 or 1 as a flag when the multi-hit is ON, and uses data of 0 or 1 as a flag when the multi-hit is OFF. The flag is switched until the portion of data 1 becomes 0, and when the portion of data 1 becomes 0, input stop of the key data is cancelled.

As described above, a plurality of SRAMs accessed with an entry address is provided, and the plurality of SRAMs can be controlled with data 0. Further, by use of a multiport SRAM, the output of the multi-hit data can be speeded up.

Figure 21:
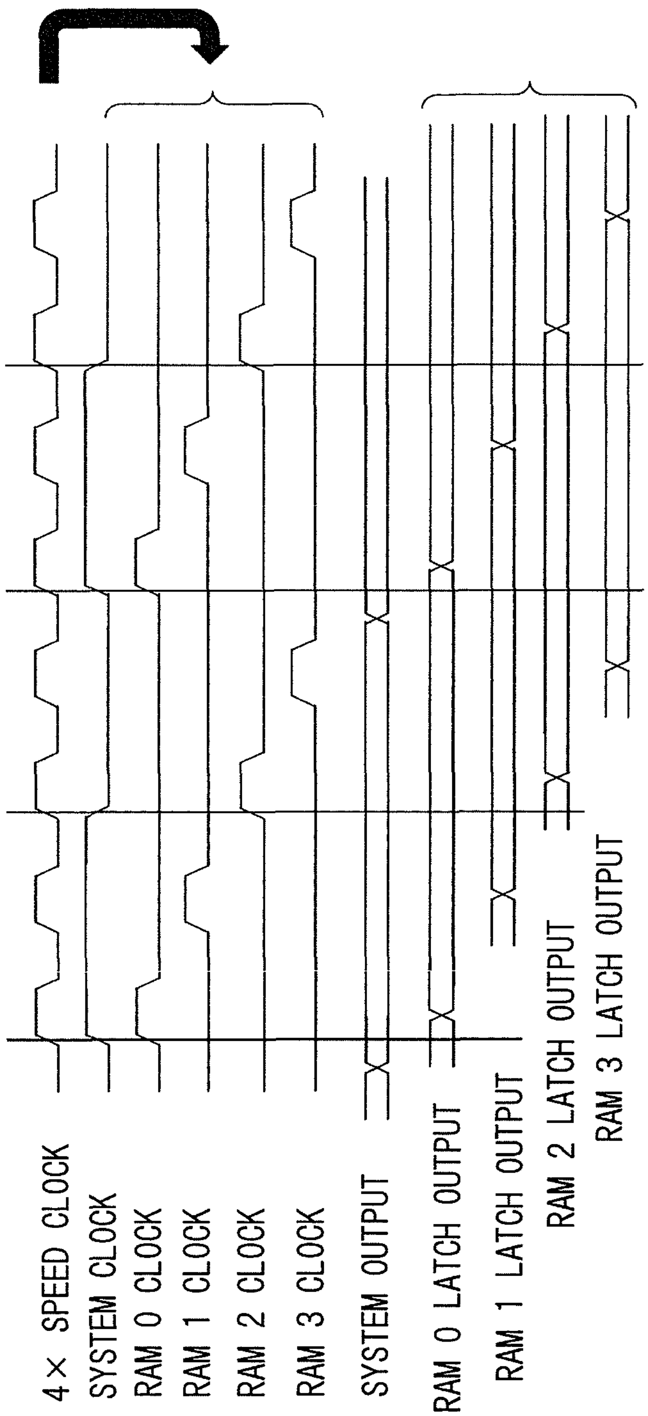
FIG. 21 is a timing chart illustrating clock timing of the multi-hit.

FIG. 21 illustrates clock timing of the multi-hit. When an SRAM operation has a margin with respect to a system operation, the SRAM can be speeded up and can perform a multi-port operation. FIG. 21 illustrates an example of a four-port operation. A system clock, a RAM 0 clock, a RAM 1 clock, a RAM 2 clock, and a RAM 3 clock can be easily generated by a 4× speed clock with a counter and a simple logic circuit. Note that, when a system output is latched by an invert signal of the RAM 3 clock, the timing of an output becomes the same as that of the system output. Further, a normal operation is operated by the system clock and the RAM 0 clock. In a case of the multi-hit, the SRAM of the entry destination is operated by OR signals (4× speed clock) of the RAM 0 to RAM 3, and when a latch output of the SRAM is latched by an invert signal of the RAM 3 clock, four parallel outputs at the same timing as the system output can be obtained.

While a method of realizing the CAM operation that can be used as a switch router and a search engine has been described, the configuration can be expanded to a function based on a look up table (LUT). To realize it, a control circuit such as a small switch just has to be attached above and below the search memory mat.

The limit of the method described in Examples 1 and 2 in which the overlapping in the input of an entry address to the memory is treated as one "not to be considered (don't care)", is until before all of memory columns overlap with each other. This problem is more likely to occur where there is an interval of data more than that of random data. Countermeasures thereto are that substitution of the flag accompanying the entry address is performed.

When an already-written address is selected at the time of data writing, the writing is not performed using the flag as "10" and input data information of the flag of "10" is neglected at the time of search. However, due to the interval of data, the flags of all memory mats may become "10" at the time of search and the search may become enabled. To avoid this, even if the flags of all input data are "10" at the time of search, data of reading information of the SRAM is treated as the key data as the search data only when all the reading information of the SRAM is consistent.

Figure 22:
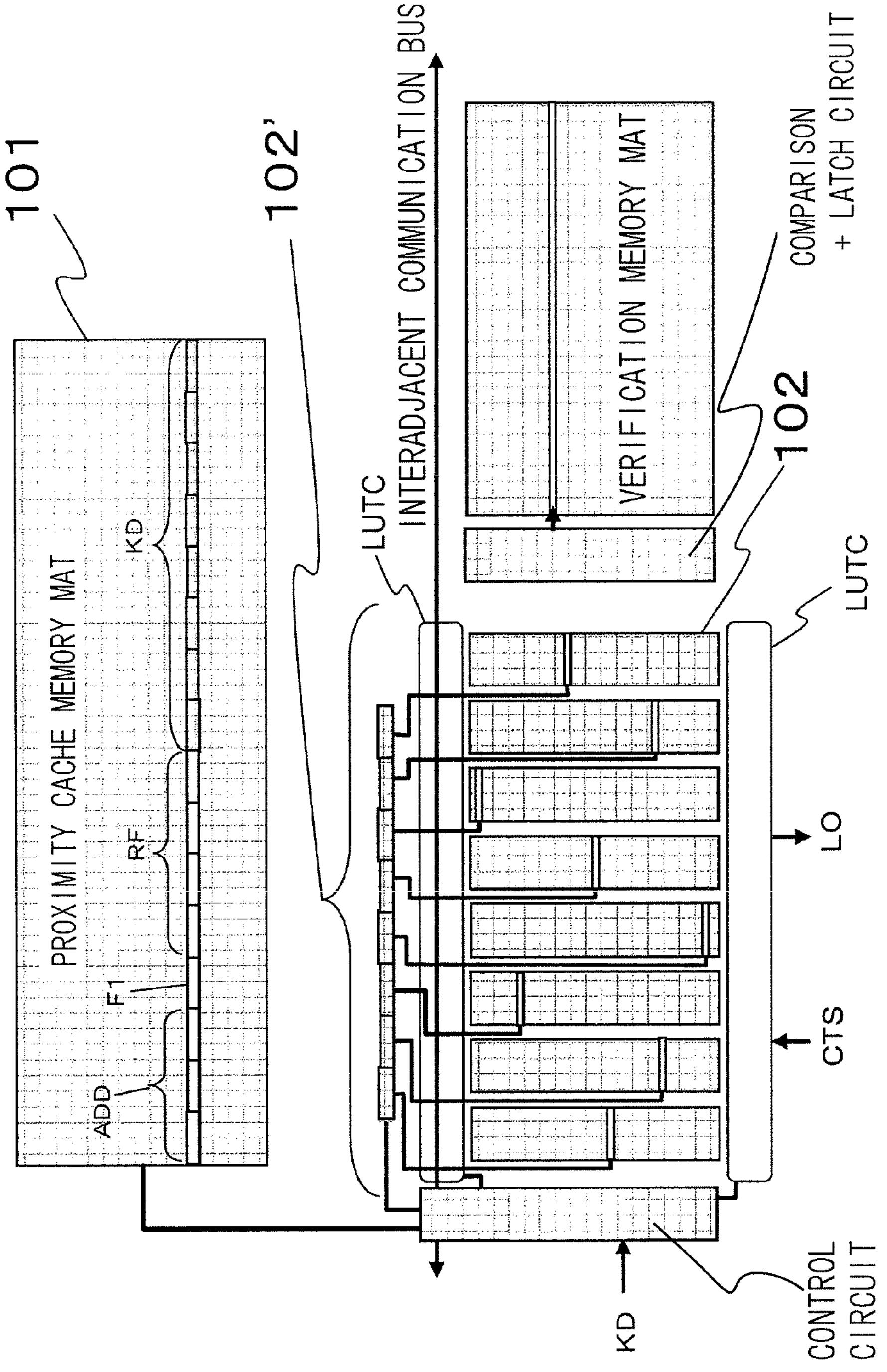
FIG. 22 is a configuration diagram illustrating a state in which a LUT control circuit is added to a search memory mat.

An application method to a logic circuit is formation of a concept of a unified cluster circuit, resulting in that an application range is dramatically expanded. A state in which a LUT control circuit (LUTC) is added to the search memory mat is illustrated in FIG. 22. That is, FIG. 22 illustrates a configuration in which a switch circuit network is added to the input unit and the logic output unit of the search memory mat 102 of FIG. 6.

Figure 23:
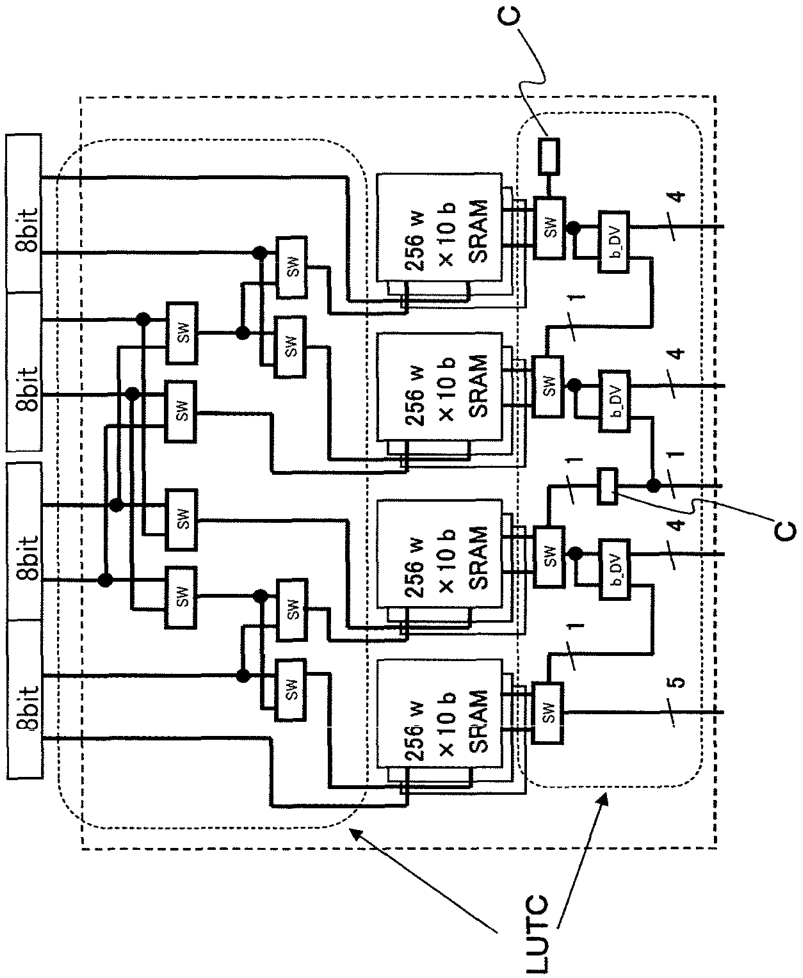
FIG. 23 is a configuration diagram illustrating an example of an adder that becomes a basis of four arithmetic operations and shift.

In FIG. 22, CTS indicates a control signal and LO indicates a logic output. The search memory mat 102 is used as a look up table (LUT) 102'. FIG. 23 illustrates an example of an adder that becomes a base of four arithmetic operations and shift. Operation steps necessary for the four arithmetic operations are configured with switch circuits. That is, FIG. 23 illustrates a case in which a plurality of LUTs is included, and illustrates an example at the time of selecting a 16-bit adder. SW is a switch circuit that switches between two inputs, b_DV is a bit distribution circuit, C is a connector and is a circuit to which ON/OFF can be set, and which is forcibly set to 0 at the time of OFF. Note that, if a peripheral circuit of the LUT is caused to be able to deal with a plurality of LUTs, functions can be dynamically changed. Further, in conjunction with a plurality of circuit blocks, the process efficiency can be enhanced, and the area of the system can be reduced. Further, when the output of the connector is set to 0, the adder becomes an 8-bit adder×2.

Figure 24:
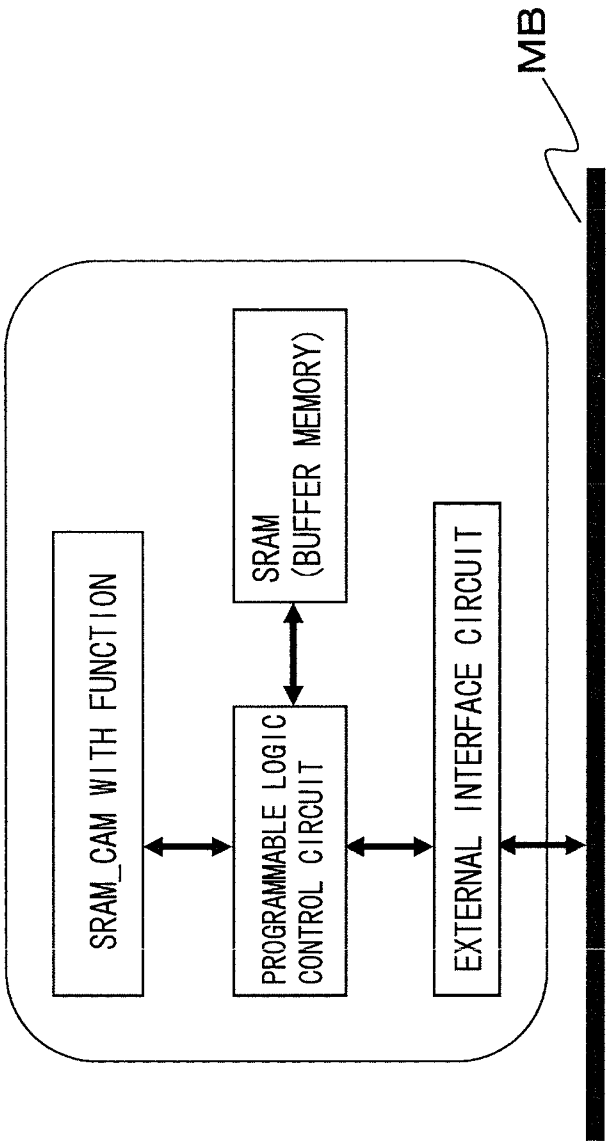
FIG. 24 is a configuration diagram of a unit part of a CAM array of 256 entries×32 keys.

Further, FIG. 24 illustrates an overall configuration example in which the number of bits is illustrated. As illustrated, the search memory mat becomes a block capable of performing a logic operation by an additional switch circuit (LUT control circuit).

A configuration of a unit portion of a CAM array of 256 entries×32 keys illustrated in FIG. 24 becomes as follows. That is, (1) the main body of the CAM realizes CAM functions until the multi-hit function. (2) The LUT has a configuration in which (a) eight SRAMs of 256 words×10 bits, (b) one SRAM of 256 words×32 bits, and (c) one SRAM of 256 words×48 bits. Among them, (b) and (c) may be nine SRAMs of 256 words×10 bits. In this case, the use efficiency as the LUT is enhanced. Note that, with the configuration, a unified cluster circuit that can be used as a logic circuit or a memory having good area efficiency can be realized. By arranging the blocks illustrated in FIG. 24 in an array manner, the blocks can be used as a programmable logic block or a memory block. Conceptually, the blocks can be configured to be in a form that is equivalent to the CAM functions+a programmable logic block or a memory block. Note that MB indicates a multi-bus.

A uniform block array in which the memory and the logic are configured in the same mat can eliminate a bus neck and secure a high-speed operation with low power consumption because the necessary processing blocks can be adjacently arranged. In addition, with such a uniform block array, any processing becomes possible.

Figure 25A:
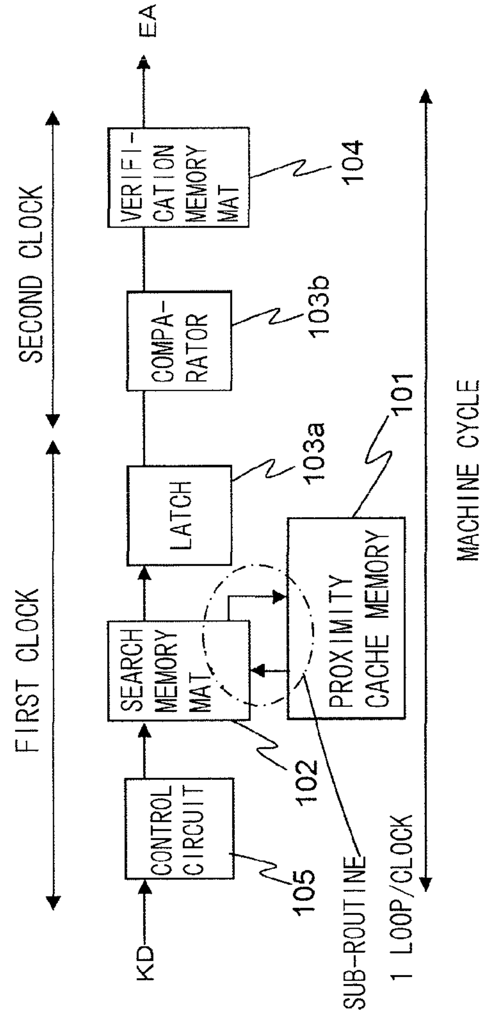
FIGS. 25(*a*) and 25(*b*) are configuration diagrams illustrating a switch or search.
Figure 25B:
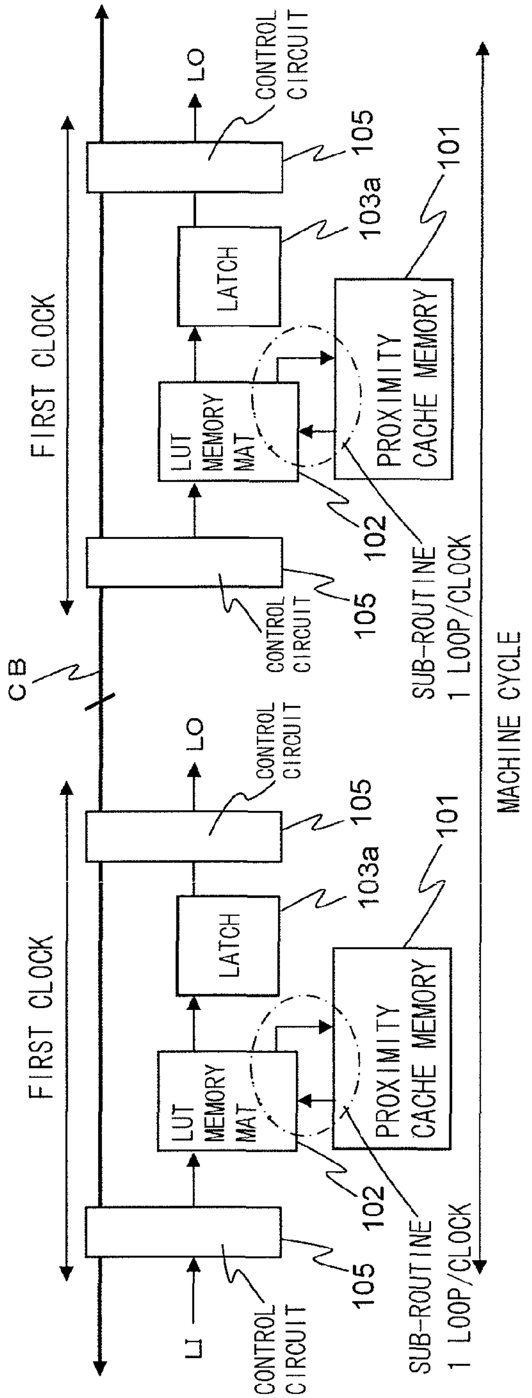

Between FIGS. 25(*a*) and 25(*b*), FIG. 25(*a*) illustrates an operation of a switch or search, and FIG. 25(*b*) illustrates a procedure of a logic operation (FIG. 25(*b*)). FIGS. 25(*a*) and 25(*b*) illustrate a configuration that enables any processing by performing switching with an instruction from a circuit that controls the entire system. Note that, in FIG. 25(*b*), CB indicates a proximity connection bus, LI indicates a logic input, and LO indicates a logic output. Further, the portions surrounded by the dashed lines indicate sub-routines, and are one loop/clock.

Figure 26:
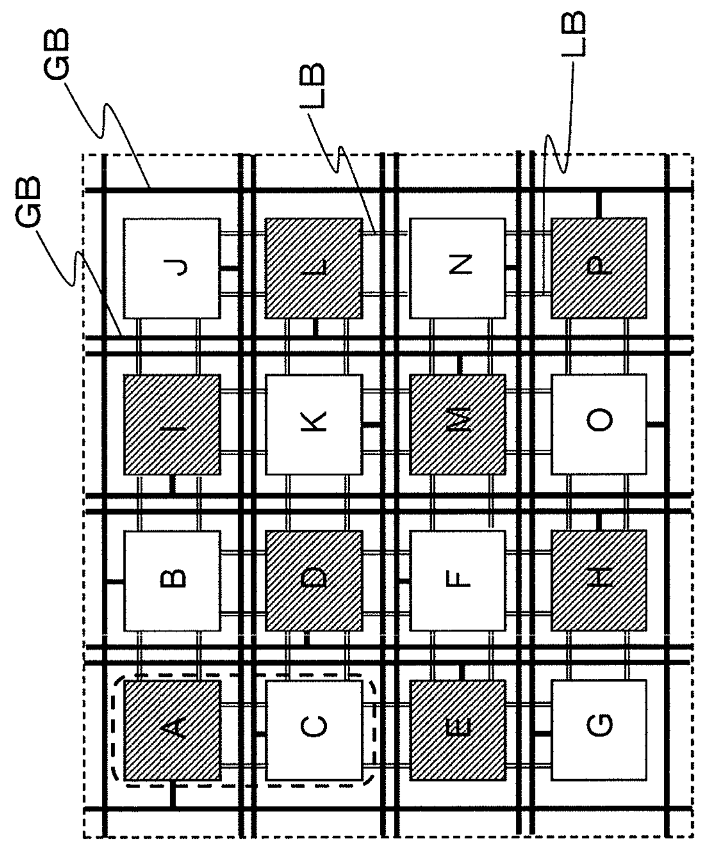
FIG. 26 is a configuration diagram illustrating an example of a dynamic reconfiguration memory.

In the present example, the necessary data groups are adjacently arranged, and thus, a parallel operation can be performed with an adjacent data group in one clock. Such a state is illustrated in FIGS. 25(*a*) and 25(*b*) by the timing of a first clock. Thus, the data groups can be configured in an adjacent state as much as possible. FIG. 25(*a*) illustrates a case of a switch or search, and FIG. 25(*b*) illustrates a case of a logic operation. That is, when the cases are expanded, the cases are also possible in a unit of block, and the concept of a dynamic reconfiguration comes out as a system (FIG. 26). That is, FIG. 26 illustrates an example of a 4×4 block array, and it is easily made clear that any configuration can be instantly switched. It can be found that this is the beginning of a brain-type computer.

FIG. 26 is a diagram illustrating a configuration of an SRAM-CAM array in which a logic operation function has been added. The example illustrated in FIG. 26 is a configuration example in which 16 (4×4) dynamic reconfiguration memory blocks are arranged. In the example illustrated in FIG. 26, all of the blocks are configured with the SRAM, and by incorporating a function switching register, the blocks can be instantly switched to any form. A local bus (LB) is the content with the adjacent bus (CB) of FIGS. 25(*a*) and 25(*b*) written, and thus information and processing sharing between adjacent blocks can be performed in one clock, and speeding up and low power consumption can be achieved. A global bus (GB) is mainly used at the time of block shift in the dynamic reconfiguration, and has a principal role of burst transfer of the block data groups.

Figure 27:
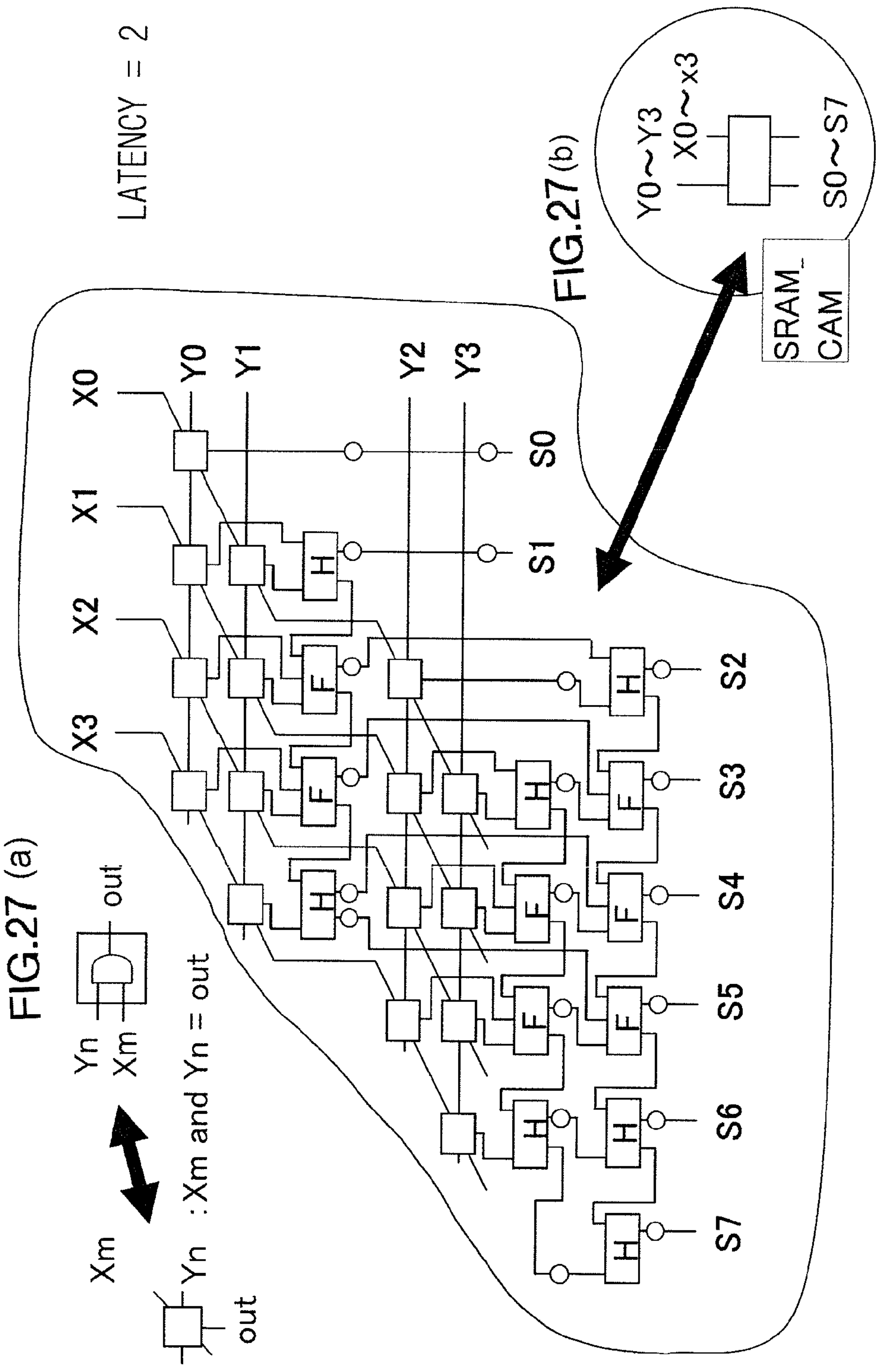
FIGS. 27(*a*) and 27(*b*) are configuration diagrams illustrating an example of reduction of a clock of calculation.

FIG. 26 illustrates an SRAM-CAM array, and GB is a global bus and LB is a local bus. Blocks A, D, E, H, I, L, M, and P are CAM function blocks, and others are LUT function blocks. Function designation of each block is set by programs. Accordingly, the search is performed by the CAM function blocks, and various types of operation processing are executed by the LUT function blocks. The portion of two blocks surrounded by the broken line means that the two blocks configure a processing unit block. Further, when a data width of a pair of the global buses (GB) is n byte, processing of 16n bytes becomes possible in the present example. Further, the LUT system of the present example has, as illustrated in FIGS. 27(*a*) and 27(*b*), a large advantage that the four arithmetic operations can be performed in one clock (FIGS. 27(*a*) and 27(*b*)). That is, while 4-bit multiplication in a process of shift, addition, and register latch, which is a typical arithmetic system, requires six steps, the LUT system of the present invention only pulls out an answer that can be accessed by inputs of x and y addresses. Therefore, the process is completed in one step. Note that FIG. 27(*a*) illustrates a binary 4 bit multiplier, and H is a half adder, F is a full adder, and the one indicated by a circle in the drawing is a flip-flop circuit (F/F). Further, the number of addition stages of a ripple carry adder is six stages, and the latency is 2. This has the same function as a multiplier of the LUT system illustrated in FIG. 27(*b*).

Figure 28:
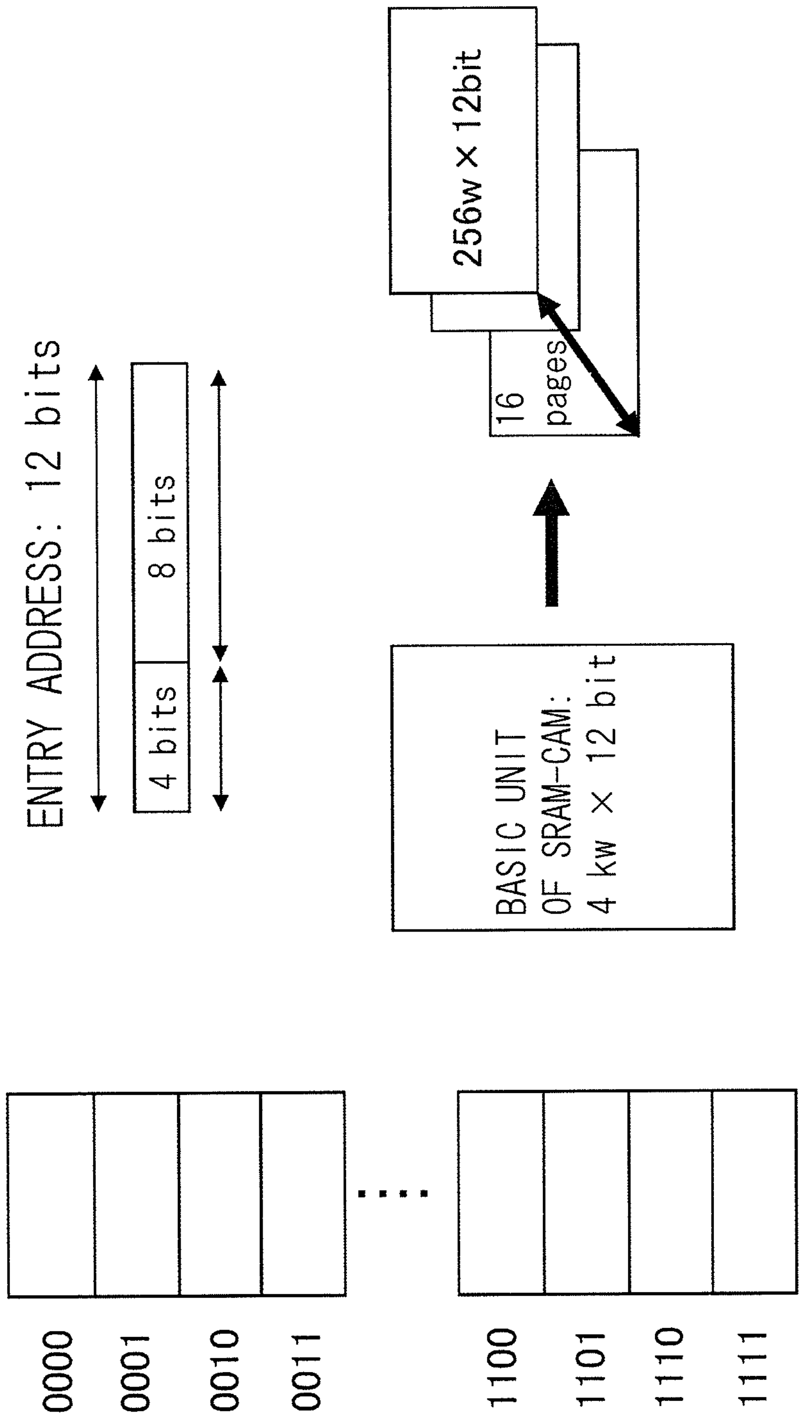
FIG. 28 is a conceptual diagram illustrating a point of view in a case where the number of entries is larger than 256.

Further, FIG. 28 illustrates a concept of a point of view in a case where the number of entries is larger than 256. When the number of entries is larger than 256, for example, 4 k, regions "0000" to "1111" of 16 faces can be secured from 256×16=4 k. These regions of 16 faces are allocated to a memory region, a LUT, an arithmetic unit, a comparator, and the like, and are dynamically switched, so that the functions can be improved. Where an entry address is 12 bits, 4 bits out of 12 bits can be used for designation of a region, and 8 bits can be used for an address in the region.

Example 4

Figure 29:
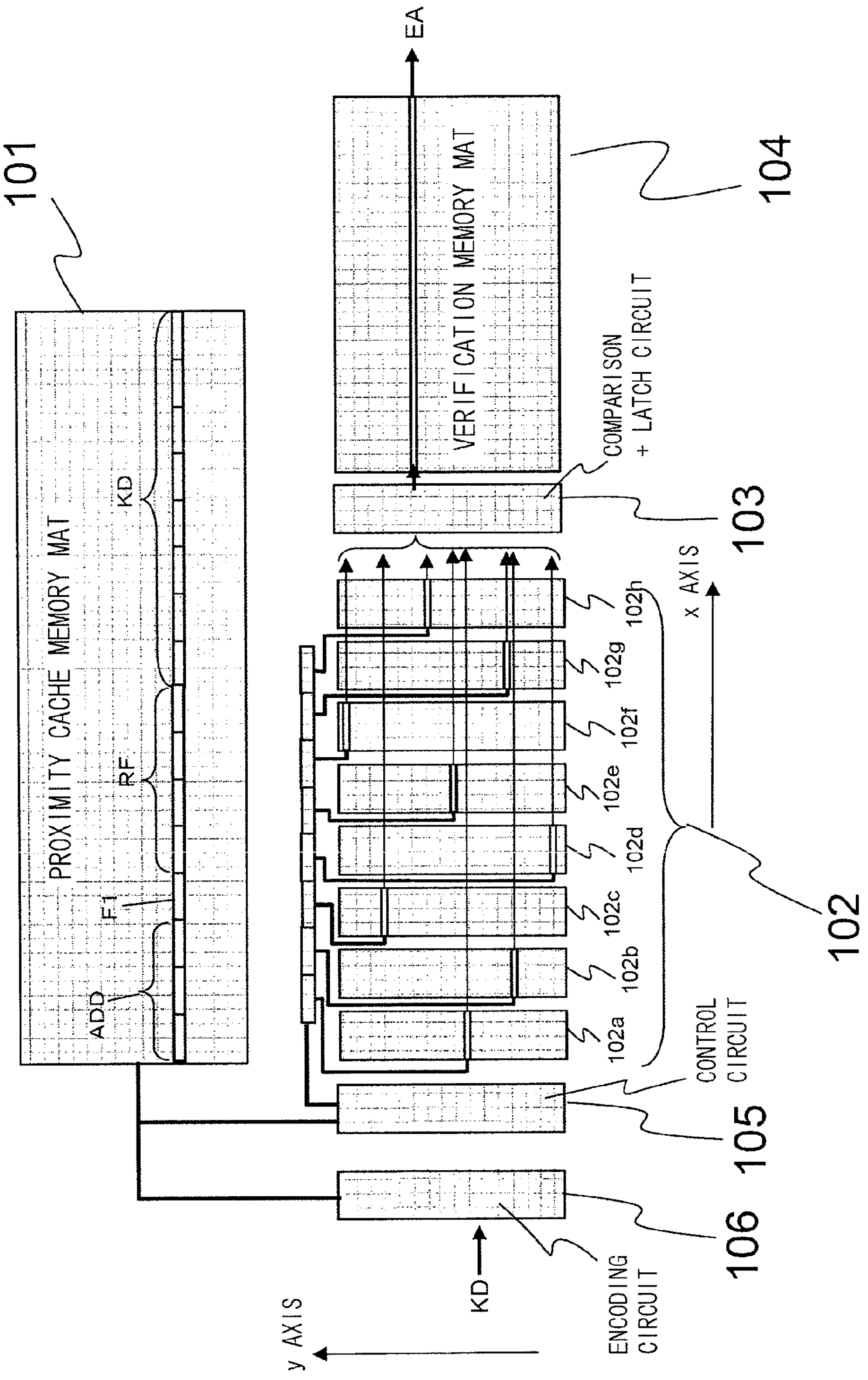
FIG. 29 is a diagram illustrating a semiconductor memory circuit configuration illustrating a fourth example of the present invention.

FIG. 29 illustrates an example in which processing of encoding key data of input data and key data as search data is performed. The [Example 4] is related to step S2 illustrated in FIG. 2 and step S7 illustrated in FIG. 4.

That is, a semiconductor device according to Example 4 is intended to eliminate deviation of a plurality of key data input to a control circuit by performing encoding of the key data of the input data and as the search data. By eliminating the deviation of the plurality of key data, the collision frequency on writing into a search memory mat can be decreased, and at the same time search processing can be appropriately performed even if a collision is caused. Especially, FIG. 29 illustrates an example of a memory circuit configuration of an SRAM-CAM.

The deviation of key data is caused when a plurality of key data having almost the same binary data is continuously written into the search memory mat, for example. For example, assuming a case in which, after key data of "00 01 10 01 10 00" is input, key data of "00 01 10 01 10 01" is continuously input, then only the last one bit is different between the two key data. In the semiconductor device of the present invention, it is favorable that a plurality of key data is randomly input to some extent in order that the probability of occurrence of the "collision" of addresses is decreased. However, as described in the above example, if almost the same key data is continuously input, this results in that the "collision" of addresses frequently occurs. Therefore, in the present example, the input key data is encoded, and the binary data of the plurality of key data is manually randomized.

Here, the "encoding" includes decentralization of key data according to a predetermined rule (algorithm). Further, the "encoding" includes not only encoding by an expression (algorithm) but also rearrangement of the order of data bits that express key data.

As illustrated in FIG. 29, the semiconductor device includes a proximity cash memory mat 101, an encoding circuit 106, a control circuit 105, a search memory mat 102, a comparison and latch circuit 103, and a verification memory 104. It is not necessary to provide the proximity cash memory mat 101, if not needed.

In the SRAM-CAM illustrated in FIG. 29, key data (KD) that is original information is first input to the encoding circuit 106. Then, the key data as the original information is encoded according to a predetermined algorithm by the encoding circuit 106. The encoding circuit 106 encodes the input key data according to the predetermined algorithm, and outputs the encoded key data. The key data encoded by the encoding circuit 106 is input to the control circuit 105. The control circuit 105 uses the encoded key data as an address for searching the search memory mat 102 or an address for being newly written into the search memory mat 102.

That is, the control circuit 105 can treat the encoded key data in exactly the same way as the key data described in [Example 1] and the like. That is, the control circuit 105 divides the encoded key data into a plurality of key data, and accesses the search memory mat 102 using the divided key data as addresses. The control circuit 105 then writes an entry address into the accessed search memory mat 102, or reads an entry address written into the accessed search memory mat 102. The writing and reading processing is the same as the processing described in [Example 1] and the like. The writing and reading processing is performed with respect to all the separated search memory mat 102.

First, the control circuit 105 allocates a location (address) for storing an entry address (EA) to a y axis of the search memory mat 102, and allocates the encoded divided key data (KD) to an x axis of the search memory mat 102.

The search memory mat 102 is separated into basic cells having the number of bits of an appropriate size corresponding to the encoded key data allocated to the x axis (the number of separations: N). Here, N is an integer of 2 or more. In the example of FIG. 29, N becomes 8. Meanwhile, allocation of the number of bits with respect to each of the basic cells is arbitrary. Further, the control circuit 105 allocates an entry address to the y axis of the verification memory mat 104, and allocates respectively key data corresponding to the entry address to the x axis. Therefore, in the verification memory mat 104, the key data is written according to the entry address. Note that the key data stored in the verification memory mat 104 is not input data encoded by the encoding circuit 106 described above, but corresponds to the key data as the original information which is not yet input to the encoding circuit 106.

That is, the key data input to the search memory mat 102 is the encoded key data that is obtained by encoding of the key data as the original information, which is input at the time of writing or at the time of search. In contrast, the key data stored in the verification memory mat 104 is data which is not yet encoded, that is, the key data as the original information itself, which is input at the time of writing or at the time of search. That is, reference processing with respect to the verification memory mat 104 is performed with respect to the key data as the original information, which is not yet encoded and is to be input to the encoding circuit 106.

Figure 35:
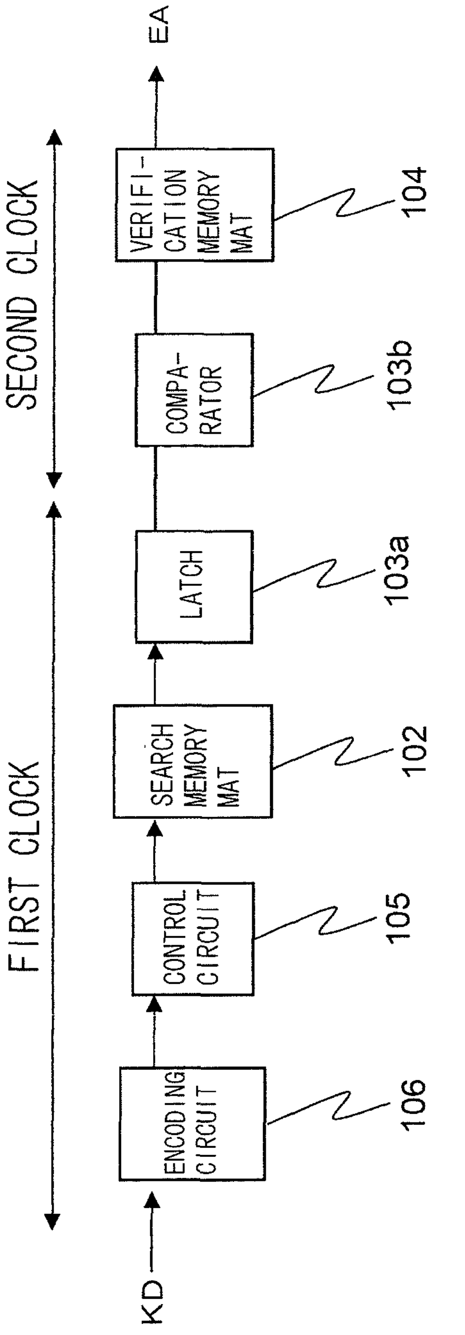
FIG. 35 is a diagram illustrating an operation of a switch or search of the SRAM-CAM illustrating the fourth example of the present invention.

FIG. 35 illustrates operation timing of the semiconductor device illustrated in FIG. 29 in connection with a first clock and a second clock. First, in the first clock, the key data is input to the encoding circuit 106, the key data as the original information is encoded, and the encoded key data is output to the control circuit 105. Further, in the first clock, the encoded key data is input to the control circuit 105, the writing processing or reading processing with respect to the search memory mat 102 is performed, and an entry address is latched to a latch circuit 103*a*. The processing so far is executed in the first clock. Following that, in the second clock, data from the latch circuit 103*a* is compared by a comparator 103*b*, and a comparison result thereof is input to the verification memory mat 104. Then, in the second clock, the data in the verification memory mat 104 is confirmed to be consistent with the input data which is not yet encoded, and finally, data read from the verification memory mat 104 is output.

Hereinafter, an operation and a circuit configuration of the encoding circuit 106 of the present example will be described. The encoding circuit 106 encodes the key data as the original information, which is input at the time of writing or reading data. Further, the encoding circuit 106 includes a function to remove deviation of the key data and a function to change the bit length by appropriately setting an encoding condition. The encoding processing is performed by mixing data, spreading data, or adding redundancy to data, as described below. For example, a coded bit is generated from the original information using a generator polynomial, and the length of the redundancy bit is changed according to a parameter designated at the time of generating a code. Examples of a method of inputting encoded data to the search memory mat 102 (SRAM-CAM) include (1) a method of using in a form of the original information+the coded bit, and (2) a method of using only the coded bit. In the present example, the method (1) will be described first, and then the method (2) will be described. Note that the method (2) has a configuration in which the original information is spread over a wide range in the coded bit. Therefore, this method is more effective for removal of the deviation of the bits.

FIG. 30 is a diagram for describing the degree of scattering of coded bits and data. FIG. 30 illustrates a case in which 28-bit key data is input to the encoding circuit. A code generation parameter illustrated in FIG. 30 is an index indicating the degree of scattering of the input data or the original information as the key data. For example, when the encoding processing is applied to the 28-bit original information, and 6-bit coded bits are obtained, the encoded input data input to the control circuit 105 has a total bit number of 34 bits. In this case, the code generation parameter indicating the degree of scattering becomes one bit. Further, when the encoding processing is applied to the 28-bit original information, and 27-bit coded bits are obtained, the encoded input data input to the control circuit 105 has a total bit number of 55 bits. In this case, the code generation parameter indicating the degree of scattering becomes 5 bits. Further, when the encoding processing is applied to the 28-bit original information, and 70-bit coded bits are obtained, the encoded input data input to the control circuit 105 has a total bit number of 98 bits. In this case, the code generation parameter indicating the degree of scattering becomes 11 bits.

Therefore, to increase the number of bits of the code generation parameter by increasing the degree of scattering, it is found that the number of coded bits just has to be increased. However, if the number of coded bits is increased, it is necessary to increase the number of SRAMs that configure the search memory mat 102. In contrast, in the method (2) of using only the coded bit, the total number of bits is decreased by the number of bits of the original information, and thus, the number of SRAMs that configure the search memory mat 102 can be saved. Further, the generated coded bit has redundancy. Therefore, it is not necessary to use all of the bits of the generated coded bit, and a part can be deleted. By deleting a part of the coded bit, not only the number of SRAMs that configure the search memory mat 102 can be saved, but also the bit length of the key data can be appropriately adjusted to the form suitable for the configuration of the SRAM.

Here, a case in which the key data as the original information is 7 bits, and the coded bit is 8 bits will be described. FIG. 31 is a diagram illustrating an example of the present invention, and illustrates the original information and the coded bit output by the encoding circuit 106. In the present example, as an example of a code used in the encoding processing, a Bose Chaudhurin Hocquenghem (BCH) code is used. The BCH code is one type of parameterized error correction codes, and has a characteristic of being easily decoded by a concise algebraic method called syndrome decoding. The BCH code can be encoded and decoded by a small, low power device. The present invention only uses the encoding function and does not use the decoding function. The BCH code is configured with a value made of XOR of original data of a plurality of bits (displayed by addition +). The BCH code can be used for search even if the encoding is performed only with the coded bit that does not include a portion of the original data, from the perspective of encoding. Note that, in encoding, there are a low-density parity-check code (LDPC) and a quadruple swing-by code (QSBC, a registered trademark of TOSHIBA CORPORATION), in addition to the BCH code. In the present invention, these LDPC and QSBC may be used in place of the BCH code.

As illustrated in FIG. 31, by applying the encoding processing to key data "a6 a5 a4 a3 a2 a1 a0" as the original information of 7 bits, an 8-bit coded bit (15, 7) code is generated. Bits of the coded bits become respectively "a6+a2+a0", "a6+a5+a2+a1+a0", "a6+a5+a4+a2+a1", "a5+a4+a3+a1+a0", "a6+a4+a3", "a5+a3+a2", "a4+a2+a1", and "a3+a1+a0". In this way, in each bit of the generated coded bits, the value of each bit of the key data as the original information is mixed and spread, and the redundancy is secured.

Details of BCH encoding processing executed in the encoding circuit 106 will be described.

When the information bits of the original information of k bits are "$a_{k-1}$, $a_{k-2}$, . . . $a_1$, $a_0$", and the coded bits of m bits are "$c_{m-1}$, $c_{m-2}$, $c_1$, $c_0$", the BCH code of n bits is expressed by "$a_{k-1}$, $a_{k-2}$, . . . $a_1$, $a_0$, $c_{m-1}$, $c_{m-2}$, $c_1$, $c_0$". Generation of the BCH code becomes to obtain the coded bits of m bits.

A polynomial that expresses the vector becomes Expression (1).

[Mathematical Expression 1]

$$F(x)=a_{k-1}x^{n-1}+a_{k-2}x^{n-2}+ \ldots +a_1x^{m+1}+a_0x^m+c_{m-1}x^{m-1}+c_{m-2}x^{m-2}+ \ldots +c_1x+c_0 \quad (1)$$

Further, Expression (2) can be expressed where the portion of the information bits is P(x), and the code bits are R(x).

[Mathematical Expression 2]

$$F(x)=x^mP(x)+R(x) \quad (2)$$

Further, following Expression (3) is established between F(x) and G(x) where an m-th degree polynomial G(x) called a generator polynomial is introduced, and only parts that can be divided by G(x) are codewords. Note that, in Expression (3), to express that F(x) can be divided by G(x) by an expression, a quotient obtained by dividing F(x) by G(x) is "Q(x)".

[Mathematical Expression 3]

$$F(x)=Q(x)G(x) \quad (3)$$

Following Expression (4) can be obtained from Expressions (2) and (3).

[Mathematical Expression 4]

$$x^mP(x)=Q(x)G(x)+R(x) \quad (4)$$

From this Expression, generation of the BCH code is to obtain the remainder R(x) obtained by dividing $x^m$P(x) by G(x).

A circuit which calculates a quotient and a remainder obtained by dividing a (k−1)th degree polynomial, Expression (5)

[Mathematical Expression 5]

$$P(x)=a_{k-1}x^{k-1}+a_{k-2}x^{k-2}+a_{k-3}x^{k-3}+ \ldots +a_1x+a_0 \quad (5)$$

by an m-th degree polynomial, Expression (6)

Figure 33:
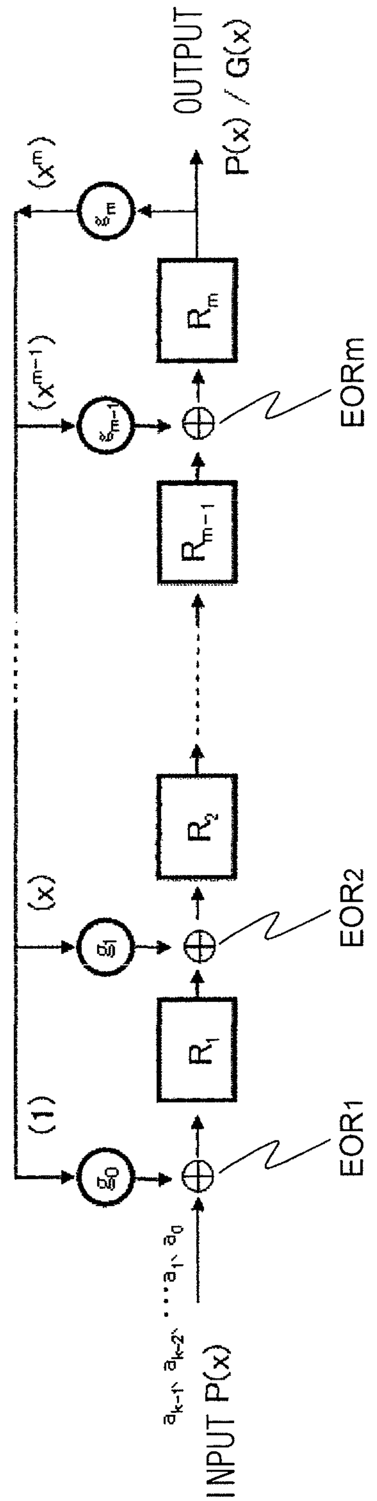
FIG. 33 is a configuration diagram of the encoding circuit of the SRAM-CAM illustrating the fourth example of the present invention.

[Mathematical Expression 6]

$$G(x)=g_mx^m+g_{m-1}x^{m-1}+ \ldots +g_1x+g_0 \quad (6)$$

becomes typically as illustrated in FIG. 33.

Figure 34:
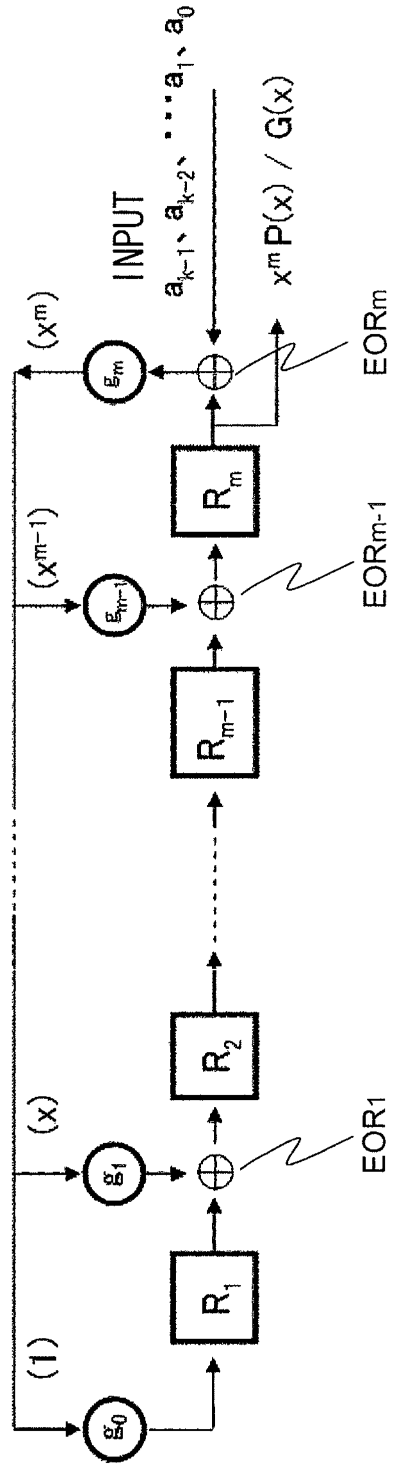
FIG. 34 is another configuration diagram of the encoding circuit of the SRAM-CAM illustrating the fourth example of the present invention.

Further, when the circuit illustrated in FIG. 33 is modified to a circuit in which $x^m$P(x) is divided by G(x), a modified circuit has a configuration in FIG. 34. FIG. 34 illustrates a circuit actually used to generate the BCH code. The remainder R(x) can be obtained by outputting information stored in a shift register by a shift operation after $a_{k-1}$, $a_{k-2}$, . . . , $a_1$, $a_0$ are input. By performing an arithmetic operation by the encoding circuit illustrated in FIG. 34, the (15, 7) code illustrated in FIG. 31 can be generated. The encoding circuit 106 of the present invention is configured using the expression that expresses the operation result of FIG. 31 without using the circuit of FIG. 34. By using the expression, encoding can be performed without requiring several cycles in the encoding like the circuit of FIG. 34. The (15, 7) code is a case where the generation parameter is 2 (t=2), and becomes a 15-bit code where the coded bits are added to the original information illustrated in FIG. 31 described above. The code then becomes the encoded input data. That is, the key data to be input to the search memory mat 102 through the control circuit 105 is generated. FIG. 32 is obtained where t=4, and the degree of scattering is increased. FIG. 32 is another example of the present invention, and is a diagram illustrating 8-bit original information and 20-bit coded bits generated therefrom.

In FIG. 32, the 20-bit coded bits are generated by the encoding processing applied to the key data "a7 a6 a5 a4 a3 a2 a1 a0" as the 8-bit original information. Bits of the coded bits become respectively "a1+a2+a3", "a0+a1+a2", "a0+a2+a3+a6+a7", "a3+a5", "a2+a4+a7", "a1+a3+a6+a7", "a0+a2+a5+a6", "a2+a3+a4+a5+a6", "a1+a2+a3+a4+a5+a7", "a0+a1+a2+a3+a4+a6+a7", "a0+a5", "a1+a2+a3+a4+a6+a7", "a0+a1+a2+a3+a5+a6", "a0+a3+a4+a5+a6", "a1+a4+a5+a6", "a0+a3+a4+a5+a6", "a1+a4+a6+a7", "a0+a3+a5+a6+a7", "a1+a3+a4+a5", and "a0+a2+a3+a4+a7". In this way, in each bit of the generated coded bits, the value of each bit of the key data as the original information is mixed and spread, and the redundancy is secured. Further, as compared with the case of FIG. 31, the degree of scattering is clearly increased. The 20-bit coded bits generated from the original information are expressed by an XOR logical expression of the original information, and can be converted into an XOR logic circuit of the original information as is.

A condition required in the encoding circuit 106 described above is that outputs of the encoding circuit 106 at the time of writing data and at the time of search are consistent. That is, the encoding circuit 106 executes the same encoding at the time of writing data and at the time of search. In this way, the encoding circuit 106 just has to be secured not to generate different coded bits at the time of writing data and at the time of search. Accordingly, the correspondence among the SRAMs that configure the search memory mat 102 can be maintained.

Figures 36, 36E:
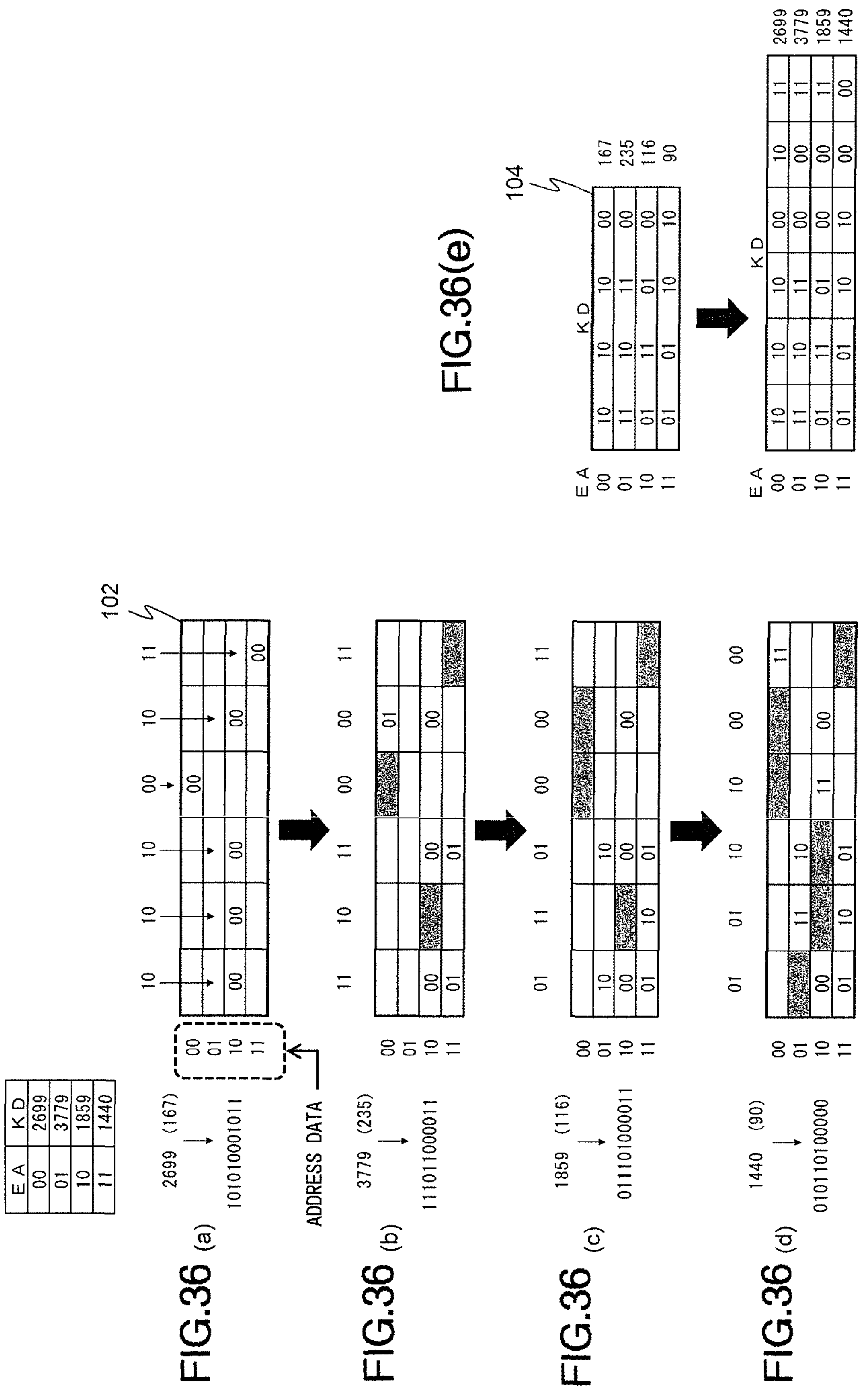
FIGS. 36(*a*) and 36(*e*) are diagrams illustrating a writing operation of the SRAM-CAM illustrating the fourth example of the present invention.

A writing operation with respect to the search memory mat 102 of the present invention will be described with reference to FIGS. 36(*a*) and 36(*e*). In FIGS. 36(*a*) and 36(*e*), for making the description easy to understand, key data "167", "235", "116", and "90" as the input data corresponding to four entry addresses are written into ( ). That is, the key data displayed in ( ) is data which is not yet encoded by the encoding circuit 106. Then, the data is encoded, and is converted into key data of "2699", "3779", "1859", and "1440".

In the example of FIGS. 36(*a*) and 36(*e*), the search memory mat 102 is separated into six separate memories (the number of separations N=6). A case is then assumed in which the control circuit 105 respectively allocates entry addresses "00""01""10""11" to the encoded key data "2699""3779""1859""1440".

That is, the key data "167" input as the data to be written into the entry address "00" is converted into "2699" by the encoding circuit 106. Further, when the encoded key data "2699" is expressed in binary data, it becomes "10 10 10 00 10 11". When the encoded key data is input to the control circuit 105, the control circuit 105 divides the encoded key data into a plurality of key data. In the example illustrated in FIGS. 36(*a*) and 36(*e*), the encoded key data is divided into six pieces of key data. Each of the divided key data is written into the six-separated search memory mat 102. At this time, the data written into the search memory mat 102 is the entry address "00" corresponding to the encoded key data "2699".

As illustrated in FIG. 36(*a*), the encoded key data "2699" is divided by the control circuit 105 into six pieces of key data and is expressed by "10""10""10""00""10""11". The control circuit 105 writes the entry address "00" into a first separate memory 102*a* using the first divided key data "10" as an address. Next, the control circuit 105 writes the entry address "00" into a second separate memory 102*b* using the second divided key data "10" as an address. Further, the control circuit 105 writes the entry address "00" into a third separate memory 102*c* using the third divided key data "10" as an address. Further, similarly, the control circuit 105 writes the entry address "00" into each of fourth to sixth separate memories 102*d*, 102*e*, and 102*f* using the fourth to sixth divided key data "00""10""11" as addresses.

This results in that the entry address "00" has been written into the search memory mat 102 designated by the encoded key data "2699".

Following that, the key data "235" input as the data to be written into the entry address "01" is converted into "3779" by the encoding circuit 106. When the encoded key data "3779" is expressed in binary data, it becomes "11 10 11 00 00 11". Here, the control circuit 105 writes the entry address "01" corresponding to the encoded key data "3779" into the six-separated search memory mat 102.

As illustrated in FIG. 36(*b*), the encoded key data "3779" is divided into six pieces of key data, and is expressed by "11""10""11""00""00""11". The control circuit 105 writes the entry address "01" into the search memory mat 102 using the divided key data as addresses. That is, the control circuit 105 writes the entry address "01" into the first separate memory 102*a* using the first divided key data "11" as an address. Further, the control circuit 105 writes the entry address "01" into the second separate memory 102*b* using the second divided key data "10" as an address. At this time, the entry address "00" has already been written into the address of the second separate memory 102*b* by the writing of the encoded key data "2699". Therefore, the control circuit 105 writes a collision flag into the place where the addresses collide, and processes the addresses as addresses "not to be considered (don't care)" in the subsequent reading processing. Further, as illustrated in FIG. 36(*b*), the control circuit 105 writes the entry address "01" into the third separate memory 102*c* using the third divided key data "11" as an address. Similarly, the control circuit 105 writes the entry address "01" into the fourth to sixth separate memories 102*d*, 102*e*, and 102*f* using the fourth to sixth key data "00""00""11" as addresses. However, the entry address of the encoded key data "2699" has been already written into the addresses of the fourth and sixth separate memories 102*d* and 102*f*. Therefore, the control circuit 105 sets a collision flag in the addresses, and processes the addresses as addresses "not to be considered (don't care)" in the search processing performed subsequently.

This results in that the entry address "01" has been written into the search memory mat 102 designated by the encoded key data "3799". Similarly, the key data "116""90" as the original information is converted into "1859""1440" by the encoding circuit, and the control circuit 105 writes the entry addresses "10""11" into the search memory mat 102 using the encoded key data "1859""1440" as addresses. Note that, as illustrated in FIG. 36(*c*), in the processing of writing the encoded key data "1859", an address collision is newly caused in the fifth separate memory 102*e*. Further, as illustrated in FIG. 36(*d*), in the processing of writing the encoded key data "1440", an address collision is newly caused in the first and third separate memories 102*a* and 102*c*.

The upper section of FIG. 36(*e*) illustrates an example of a writing state of the verification memory mat (SRAM) 104.

As illustrated in the upper section of FIG. 36(*e*), binary data "10 10 10 00" of the key data "167" is written into the entry address "00" in the verification memory mat 104, binary data "11 10 11 00" of the key data "235" is written into the entry address "01", binary data "01 11 01 00" of the key data "116" is written into the entry address "10", and binary data "01 01 10 10" of the key data "90" is written into the entry address "11", respectively.

Further, as illustrated in the lower section of FIG. 36(*e*), the encoded key data "2699", "3779", "1859", and "1440" may be written into the entry addresses "00""01""10""11" of the verification memory mat 104.

Figure 37:
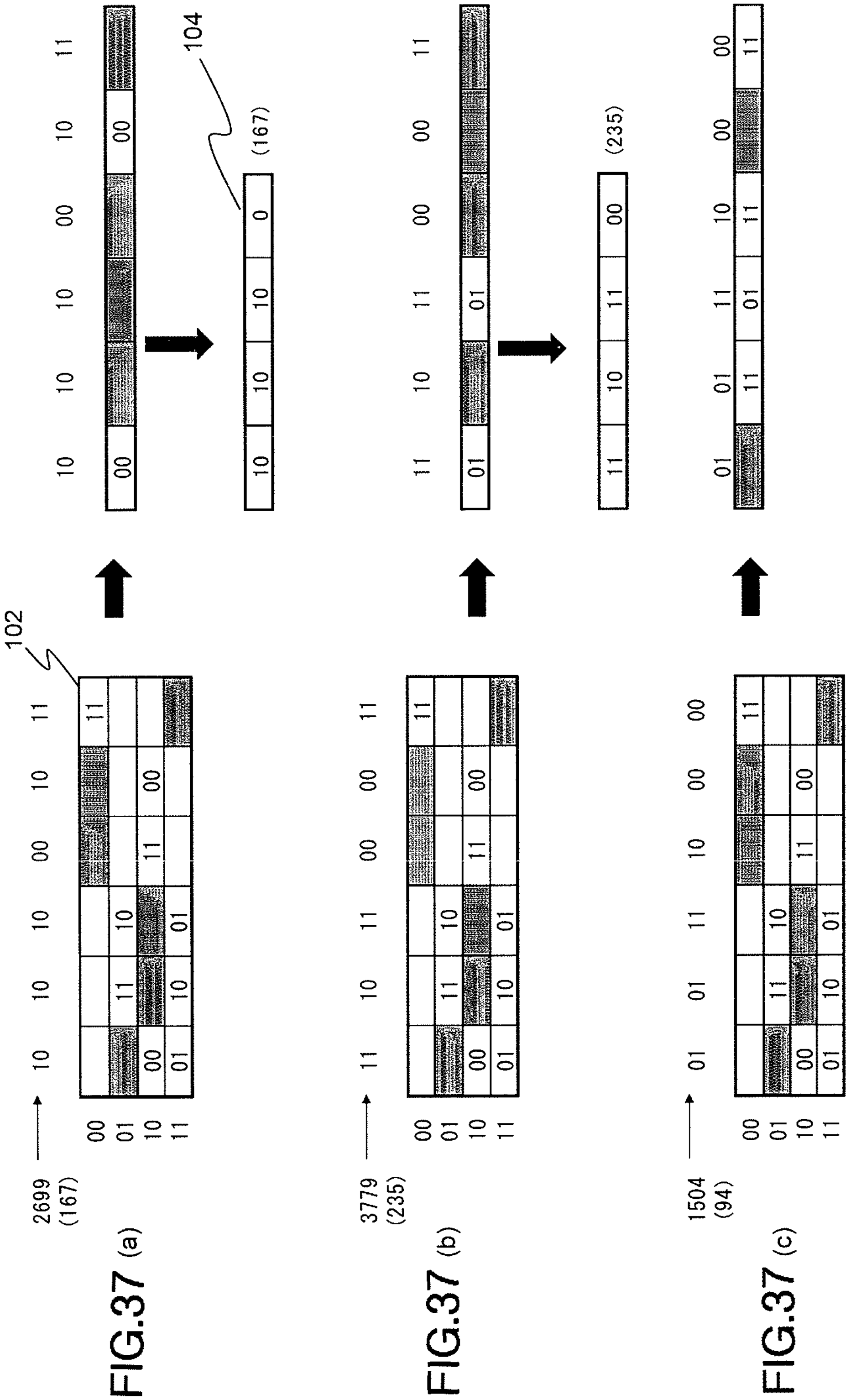
FIGS. 37(*a*) to 37(*c*) are diagrams illustrating a search operation of the SRAM-CAM illustrating the fourth example of the present invention.

FIGS. 37(*a*) to 37(*c*) are diagrams illustrating a search operation of the semiconductor device (SRAM-CAM) according to the present invention. FIG. 37(*a*) illustrates a search operation in a case where "167" is input as the key data of the original information, and is converted into the encoded key data "2699" by the encoding circuit 106. The encoded key data "2699" is expressed by "10 10 10 00 10 11" in binary data. The binary data is divided into six pieces of key data in the control circuit 105. Each of the divided key data is used as addresses for accessing the "locations with which an entry address is registered" allocated to the y axis of the six-separated search memory mat 102. When data is read from the first separate memory 102*a* using the first divided key data "10" as an address, the entry address "00" is read. Further, data is read from the second separate memory 102*b* using the second divided key data "10" as an address. However, in this data, the address collision has been caused at the time of inputting the encoded key data "3799" illustrated in FIG. 36(*b*). Therefore, the "not-considering (don't care)" processing is performed. That is, the data read from the second separate memory 102*b* becomes excluded from the search.

Further, similarly, in the search processing using each of the third divided key data "10", the fourth divided key data "00", and the sixth divided key data "11" as addresses, the address collision has been caused. Therefore, the read data becomes excluded from the search by the "not-considering (don't care)" processing. Further, as for the fifth divided key data "10", when the fifth separate memory 102*e* is accessed using the fifth divided key data as an address, the control circuit 105 can read the entry address "00".

As illustrated in FIG. 37(*a*), regarding the data read from the search memory mat 102 based on the encoded key data "2699", the data of the first separate memory 102*a* and the data of the fifth separate memory 102*e* is both "00" and consistent. Therefore, the entry address corresponding to the encoded key data "2699" can be estimated to be "00".

Therefore, when a value of the key data accessed by the entry address "00" is read using the verification memory mat 104, the value becomes "10 10 10 00", and it is found that the key data is consistent with the key data "10 10 10 00" that is the input data which is not yet encoded. In this way, the control circuit 105 compares the key data that is output data from the verification memory mat 104 and the key data as the search data which is not yet encoded, confirms that both are consistent, and outputs the entry address.

FIG. 37(*b*) illustrates a case in which the encoded key data "3779" is input as the data to be searched. The key data "3779" is expressed by "11 10 11 00 00 11" in binary data, and is divided into six pieces of key data by the control circuit 105. Each of the divided key data is used as addresses for accessing the "location with which an entry address is registered" allocated to the y axis of the six-separated search memory mat 102. When data is read from the first separate memory 102*a* using the first divided key data "11" as an address, the entry address "01" is read. Data is read from the second separate memory 102*b* using the second divided key data "10" as an address, but in the data, the address collision has been caused. Therefore, the data is processed as data "not to be considered (don't care)". Accordingly, the second divided key data "10" becomes excluded from the search.

When data is read from the third separate memory 102*c* using the third divided key data "11" as an address, the entry address "01" is read. Meanwhile, accesses to the third to sixth separate memories 102*d*, 102*e*, and 102*f* using respectively the fourth divided key data "00", the fifth divided key data "00", and the sixth divided key data "11" as addresses become excluded from the search by the "not-considering (don't care)" processing.

As illustrated in FIG. 37(*b*), a value read from the search memory mat 102 by the encoded key data "3779" results in the entry address "01" of the first and third separate memories 102*a* and 102*c*.

Therefore, when a value of the key data accessed by the entry address "01" is read using the verification memory mat 104, the key data becomes "11 10 11 00", and is consistent with the key data which is not yet encoded "11 10 11 00". That is, the control circuit 105 compares the key data as output data from the verification memory mat 104 and the key data which is not yet encoded, confirms that these pieces of key data are consistent with each other, and then outputs the entry address.

Following that, FIG. 37(*c*) illustrates a case in which the key data "94" that has not been written into the search memory mat 102 is encoded, and the encoded key data "1504" is input as the data to be searched.

As illustrated in FIGS. 37(*a*) to 37(*c*), the encoding circuit 106 encodes the key data "94", and converts the key data into "1504". The encoded key data "1504" is expressed by "01 01 11 10 00 00" in binary data. The encoded key data is divided into six pieces of key data in the control circuit 105. The divided key data is used respectively as addresses for accessing the "locations with which an entry address is registered" allocated to the y axis of the six-separated search memory mat 102. When data is read from the first separate memory 102*a* using the first key data "01" as an address, there is an address collision. Therefore, the "not-considering (don't care)" processing is performed. Further, when data of the second separate memory 102*b* is read using the second divided key data "01" as an address, the entry address "11" is output.

Further, as illustrated in FIG. 37(*c*), data read from the search memory mat 102 based on the encoded input data "1504" results in the entry address "11" as an output of the second separate memory 102*b*, the entry address "01" as an output of the third separate memory 102*c*, the entry address "11" as an output of the fourth separate memory 102*d*, and the entry address "11" as an output of the sixth separate memory 102*f*. Note the access to the separate memory 102*e* using the fifth divided key data "00" as an address is excluded from the search by the "not-considering (don't care)" processing. In this case, a plurality of types of entry addresses read from the search memory mat 102 exists. That is, there is inconsistency in the entry addresses. Therefore, the control circuit 105 can determine that, at this stage, data that is consistent with the key data as the search data does not exist in the search memory mat 102, without using the verification memory mat 104.

Next, an example of a case in which encoding is performed only using coded bits will be described with reference to FIGS. 38 to 41. To make the description simple, it is assumed that the bit length of the key data to be input to the SRAM-CAM is 24 bits, and the bit length of the encoded key data is also 24 bits. Further, it is assumed that such a configuration is made that the encoded key data is divided into six pieces, similarly to the above-description, and the six-separated search memory mat 102 is searched by the divided key data. From the premise, it is found that the search memory mat 102 of the SRAM-CAM is configured with six SRAMs of 16 words×4 bits. Therefore, the number of entries of the SRAM-CAM becomes 16.

Figure 38:
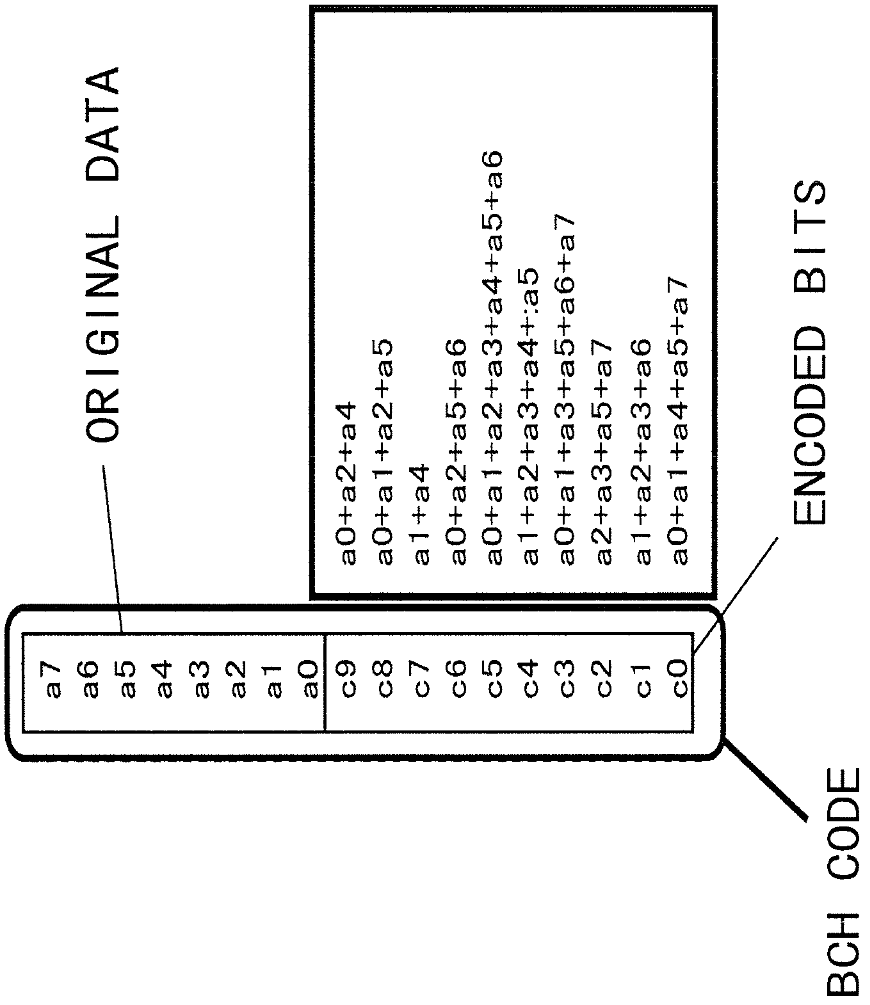
FIG. 38 is a diagram illustrating the original information and the coded bit output by the encoding circuit of the SRAM-CAM illustrating the fourth example of the present invention.

There are various methods of generating 24-bit coded bits from the 24-bit original information. Here, an example of a method of generating coded bits will be described with reference to FIG. 38. FIG. 38 illustrates an example in which 10-bit coded bits can be generated from 8-bit original information. However the original information is spread in the 10 bits of the coded bits. Therefore, bits from c2 to c9 except c0 and c1 are to be used. This result in that 8-bit coded bits are generated from the 8-bit original information. However, in this state, the encoding of 24-bit key data can be only performed in a unit of 8 bits. When the encoding of 24 bits is performed in a unit of 8 bits, such a problem is caused that deviation of key data cannot be handled. Therefore, 24-bit key data is divided into six groups by four bits, and an operation of switching the arrays of the groups according to a predetermined algorithm in a unit of group. Then, two groups each from the left end of the switched groups are encoded in a unit of 8 bits. This method is illustrated in FIGS. 39(*a*) to 39(*c*).

FIGS. 39(*a*) to 39(*c*) illustrate changes of three types of data of the key data that is the original information input to the SRAM-CAM (FIG. 39(*a*)), the key data grouped by four bits and subjected to the array change of the groups (FIG. 39(*b*)), and the key data encoded in a unit of 8 bits (FIG. 39(*c*)). The numerals (1) to (6) in the circles are denoted to distinguish the groups.

In the three types of data of FIGS. 39(*a*), 39(*b*), and 39(*c*), the number of entries of the SRAM-CAM is 16, and 16 types of data can be written into the search memory mat 102. Therefore, 16 pieces of data are written into the order of entry number. Further, to see an influence of deviation, a case is assumed in which all data of three groups ((1) to (3)) out of the six groups of the original information has the same value. The entry address and the numerals of the locations indicated by (1) to (6) of FIGS. 39(*a*) to 39(*c*) are obtained by writing the binary system expressed in four bits, in the decimal system. In the entry address "0" of the key data as the original information, the six numerals from (1) to (6): "4", "1", "13", "14", "11", and "5" indicate values of respective groups of (1) to (6) in a case where the 24-bit original information is divided by four bits. Therefore, when an array change of the groups is conducted, as illustrated in FIG. 39(*b*), the original information of (1), (2), (3), (4), (5), and (6) is rearranged to the order of (2), (5), (6), (3), (1), and (4). Further, the 24-bit binary data of the entry address "0" subjected to the rearrangement becomes "1", "11", "5", "13", "4", and "14". This data is converted by an XOR combination logic circuit according to the XOR logical expression of the coded bits illustrated in FIG. 38 where the data is regarded as 8-bit data of (2)(5), (6)(3), and (1)(4) in the encoding in a unit of 8 bits. A result of the encoding in a unit of 8 bits is illustrated in FIG. 39(*c*). That is, as illustrated in FIG. 39(*c*), when the encoding is performed, in the entry address "0" there is 24-bit data expressed by "1", "7", "1", "10", "6", and "12".

Figure 40:
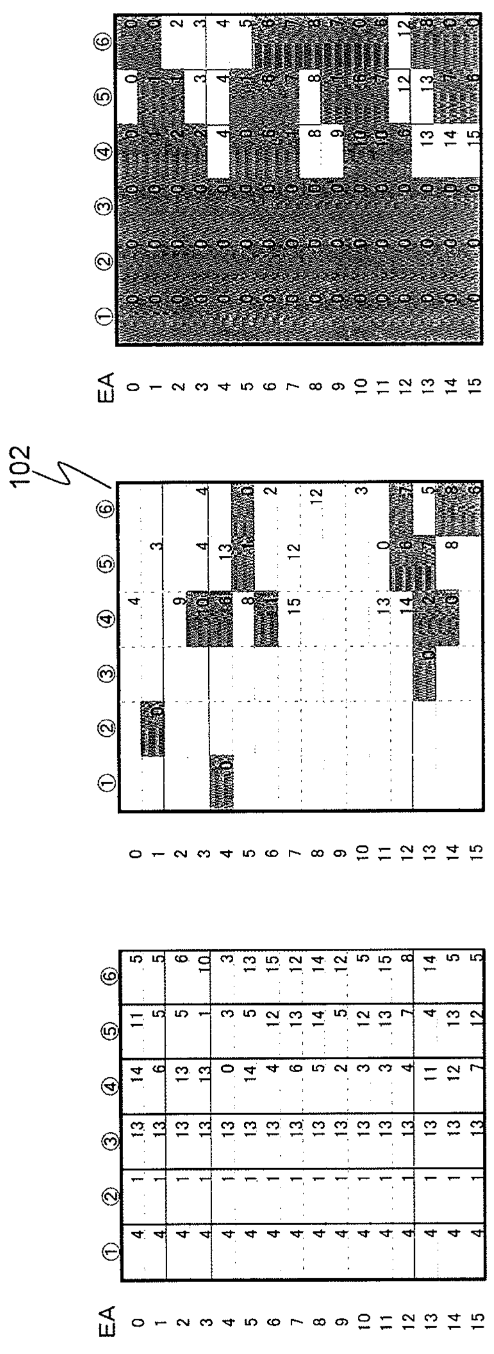
FIGS. 40(*a*) and 40(*b*) are diagrams illustrating key data, content of a search memory mat, and a reading result in a case where array change/encoding processing is executed with respect to the key data.
Figure 40:
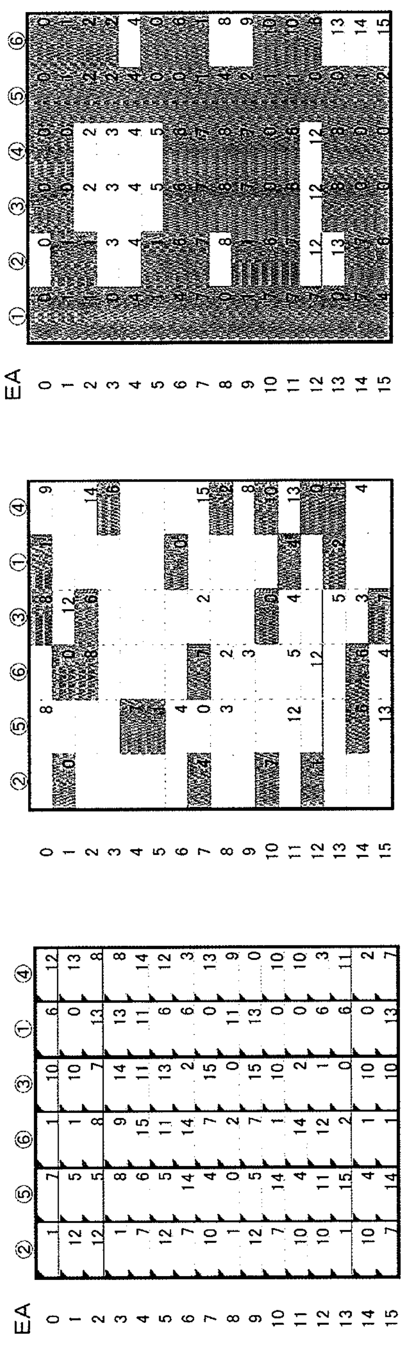

FIG. 40(*a*) illustrates a case in which the key data as the original information is not encoded and is written into the search memory mat 102 of the SRAM-CAM, and the data written into the search memory mat 102 is read. FIG. 40(*a*) illustrates, from the left, the key data as the original information, the content of the search memory mat 102, and a reading result of the search memory mat 102. FIG. 40(*b*) illustrates a case in which, after the encoding in a unit of 8 bits is performed, data is written into the search memory mat 102, and the data is read. That is, FIG. 40(*b*) illustrates a case in which the number of entries of the search memory mat 102 is 16, and thus 16 types of key data are written, and the data is read from the search memory mat 102. FIG. 40(*b*) illustrates, from the left, the data subjected to the encoding in a unit of 8 bits, the content of the search memory mat 102, and a reading result of the search memory mat 102.

As illustrated in FIG. 40(*a*), when the encoding is not performed, deviation in (1), (2), and (3) separate memories becomes large, and a state in which only one type of data is written is caused. Further, as illustrated in FIG. 40(*a*), when the writing into the search memory mat 102 is sequentially performed in the order of the entry addresses, "0" of the entry address is written into (1), (2), and (3) memory mats in the decimal system, and the memory mats become in the address collision state in the subsequent writing operation. In FIGS. 40(*a*) and 40(*b*), the information written in the filled state is "0". Further, the data of (4), (5), and (6) is assumed to be in a random state, and thus, it is found that, in the search memory mat 102, the address collision is randomly caused. In FIGS. 40(*a*) and 40(*b*), the address collision is displayed in the filled state. It is found that when the content written into the search memory mat 102 is read, (1), (2), and (3) become in a full collision state, and the memory mat that functions as the SRAM-CAM is substantially only three memory mats of (4), (5), and (6). Since many address collisions are caused, and only three of six separate memories function, reading of 5 entries out of 16 entries, that is, reading of entry addresses "1", "6", "7", "10", and "11" causes all of (1) to (6) to be in the collision state. However, it can also be said that correct search can be performed in a place where the all collisions of (1) to (6) are not caused because the entry address written into the search memory mat 102 and the entry address of the divided key data are consistent.

FIG. 40(*b*) illustrates an example of a case where the encoding processing in a unit of 8 bits is performed. As illustrated in FIG. 40(*b*), by performing the encoding processing, the extreme collisions caused in (1), (2), and (3) illustrated in FIG. 40(*a*) are not caused. However, reading results of the search memory mat 102 are the same in the case where the encoding processing is performed and the case where the encoding processing is not performed. This is because, as shown in the data subjected to the array change of the groups on which the encoding in a unit of 8 bits is not yet performed in FIGS. 39(*a*) to 39(*c*), one of two pieces of data to be encoded is fixed data, which does not change at all. Therefore, the group array change and the encoding in a unit of 8 bits are performed again using the data subjected to the encoding in a unit of 8 bits as the original information, the resultant data is subjected to the second encoding in a unit of 8 bits, and the writing and reading into/from the search memory mat 102 is performed using the data.

Figure 41:
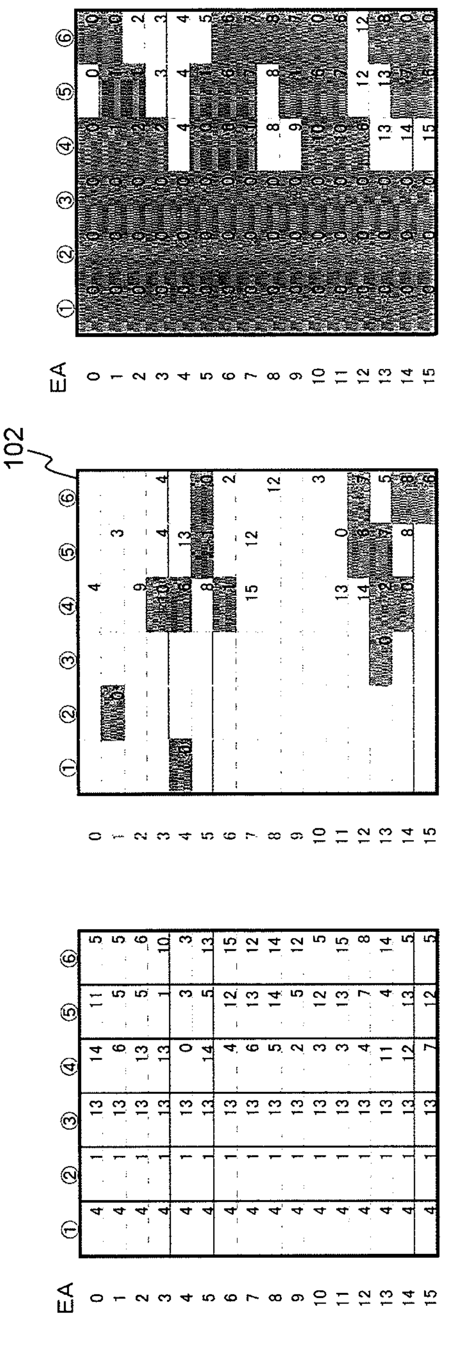
FIGS. 41(*a*) and 41(*b*) are diagrams illustrating content of a search memory mat and a reading result in a case where array change/encoding processing is executed twice with respect to key data.
Figure 41:
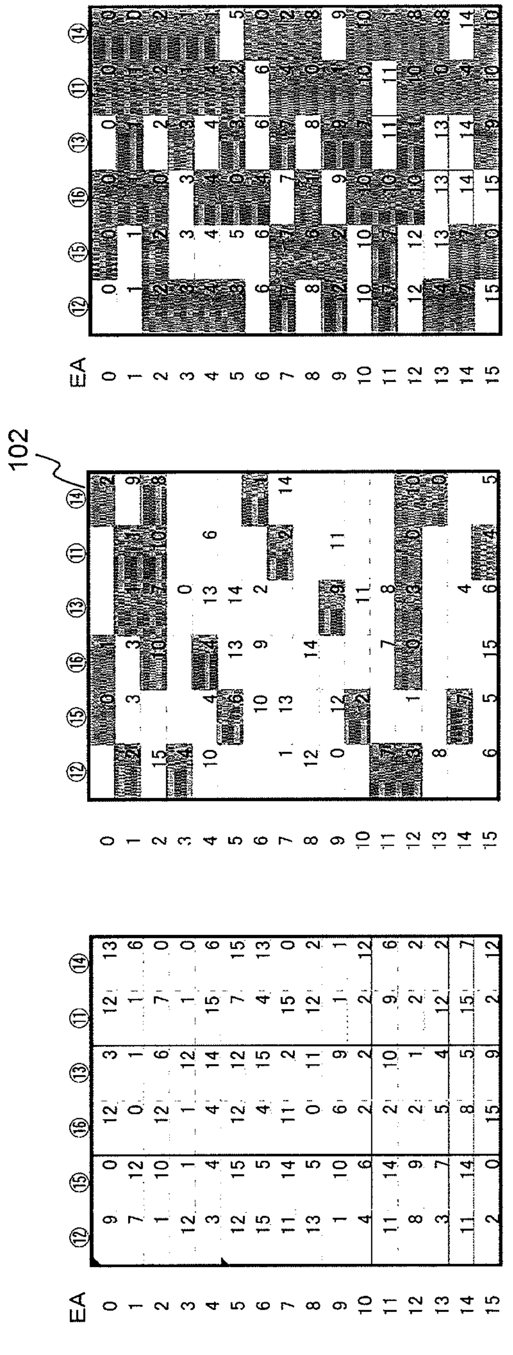

FIG. 41(*a*) illustrates a result in a case where the writing/reading is performed with respect to the search memory mat of the SRAM-CAM without encoding the key data as the original information, and FIG. 41(*b*) illustrates a result in a case where the second encoding in a unit of 8 bits is performed, and the writing and reading is performed with respect to the search memory mat using the data. As illustrated in FIG. 41(*b*), when the data subjected to the second encoding in a unit of 8 bits is written into the search memory mat 102, and the written data is read, such a state has gone that the address collision is caused in all of the six separate memories. Further, as illustrated in FIG. 41(*b*), it is found that all of the entry addresses read from the separate memory are consistent with the entry address of the key data, and all of the 16 pieces of entry data can be correctly searched.

From this result, it is found that, even if the deviation of data is large, the deviation of data can be more effectively removed by performing the encoding processing several times. While, in the present example, the encoding is performed in a unit of 8 bits, the encoding is not necessarily performed in 8 bits, and various combinations can be selected. That is, the present invention can generate various coded bits by selecting a code generation parameter and the number of bits of the original information. For example, even in a case where the configuration of the search memory mat 102 is not changed, the original information may be changed to 12 bits or 16 bits, 10-bit coded bits may be generated, and 8 bits thereof may be used as in the present example. Alternatively, the original information may be changed to 24 bits, and coded bits may be changed to 24 bits. When the original information is changed to 16 bits, 24-bit coded bits can be generated by selecting four out of six four-bit groups (1) to (6) so as not to overlap one another, in a case where the obtained coded bits are 8 bits.

Example 5

FIGS. 42(*a*) to 42(*e*) are diagrams for describing a writing operation of an SRAM-CAM where a search result can be output even if a state of collision is caused in all columns of key data input at the time of search.

In the present example, a configuration of a memory circuit of a semiconductor and an operation of switch or search of the SRAM-CAM are similar to those of Example 1, and thus description is omitted.

A writing operation with respect to a search memory mat 102 in the present example will be described with reference to FIGS. 42(*a*) to 42(*e*). Note that in the present example a case is assumed in which an entry address is two bits and four words, the key data length as input data is 12 bits. In the example of FIGS. 42(*a*) to 42(*e*), a search memory mat 102 is separated into six.

Further, in the present example a case is assumed in which key data "2699""2691""1859""1440" is respectively written into entry addresses "00""01""10""11".

When the key data "2699" input as data to be written into the entry address "00" is expressed in binary data, it becomes "10 10 10 00 10 11". Data is written into the search memory mat 102 using the value as addresses of a y axis of six-separated memories 102*a* to 102*f*. At this time, the data to be written is the entry address "00" of the key data "2699", for example.

As illustrated in FIG. 42(*a*), the key data "2699" is divided into six pieces of key data, and is expressed by "10""10""10""00""10""11". The entry address "00" is written into the separate memories 102*a* to 102*f* using the values as addresses. That is, a control circuit 105 writes the entry address "00" into the first separate memory 102*a* using the first divided key data "10" as an address. Further, the control circuit 105 writes the entry address "00" into the second separate memory 102*b* using the second divided key data "10" as an address. Further, the control circuit 105 writes the entry address "00" into the third separate memory 102*c* using the third divided key data "10" as an address. Further, the control circuit 105 writes the entry address "00" into the fourth to sixth separate memories 102*d*, 102*e*, and 102*f* using the fourth to sixth divided key data "00""10""11" as addresses.

This results in that the entry address "00" has been written into the search memory mat 102 designated by the key data "2699".

Similarly, when the key data "2691" input as the data to be written into the entry address "01" is expressed in binary, it becomes "10 10 10 00 00 11". Data is written into the search memory mat 102 using the value as addresses for accessing the "locations with which an entry address is registered" allocated to the y axis of the six-separated search memory mat. At this time, the data to be written is "01" input as the entry address.

As illustrated in FIG. 42(*b*), the key data "2691" is divided into six pieces of key data, and is expressed by "10""10""10""00""00""11". The entry address "01" is written into the search memory mat 102 using the values as addresses. That is, the control circuit 105 writes the entry address "01" into the first separate memory 102*a* using the first divided key data "10" as an address. At this time, the entry address "00" has been already written into the address of the first separate memory 102*a* in the processing of writing the key data "2699", and thus, an address collision is caused. In FIG. 42(*b*), the portions in which the address collision is caused are filled. The portions where the address collision is caused are processed as portions "not to be considered (don't care)" in the subsequent reading processing.

As illustrated in FIG. 42(*b*), the control circuit 105 further writes the entry address "01" into the second separate memory 102*b* using the second divided key data "10" as an address. Further, the control circuit 105 writes the entry address "01" respectively into the third to sixth separate memories 102*c*, 102*d*, 102*e*, and 102*f* using the third to sixth divided key data "10""00""00""11" as addresses. However, in the second to fourth and sixth addresses, the entry address of the key data "2699" has been already written. Therefore, the control circuit 105 sets a collision flag, and processes the addresses as addresses "not to be considered (don't care)" in the subsequent reading processing.

This results in that the entry address "01" has been written into the search memory mat 102 designated by the key data "2691".

Similarly, the control circuit 105 writes the entry addresses "10""11" into the search memory mat 102 of the SRAM-CAM using the key data "1859""1440" as addresses. As illustrated in FIG. 42(*c*), in the processing of writing the key data "1859", an address collision is caused in the fourth to sixth separate memories 102*d*, 102*e*, and 102*f*. Further, as illustrated in FIG. 42(*d*), in the key data "1440", an address collision is caused in the first, third, and fifth separate memories 102*a*, 102*c*, and 102*e*.

FIG. 42(*e*) illustrates a writing state of a verification memory mat (SRAM) 104.

In FIG. 42(*a*), the binary data of the key data "2699" is written into the entry address "00", the binary data of the key data "2691" is written into the entry address "01", the binary data of the key data "1859" is written into the entry address "10", and the binary data of the key data "1440" is written into the entry address "11".

Figure 43:
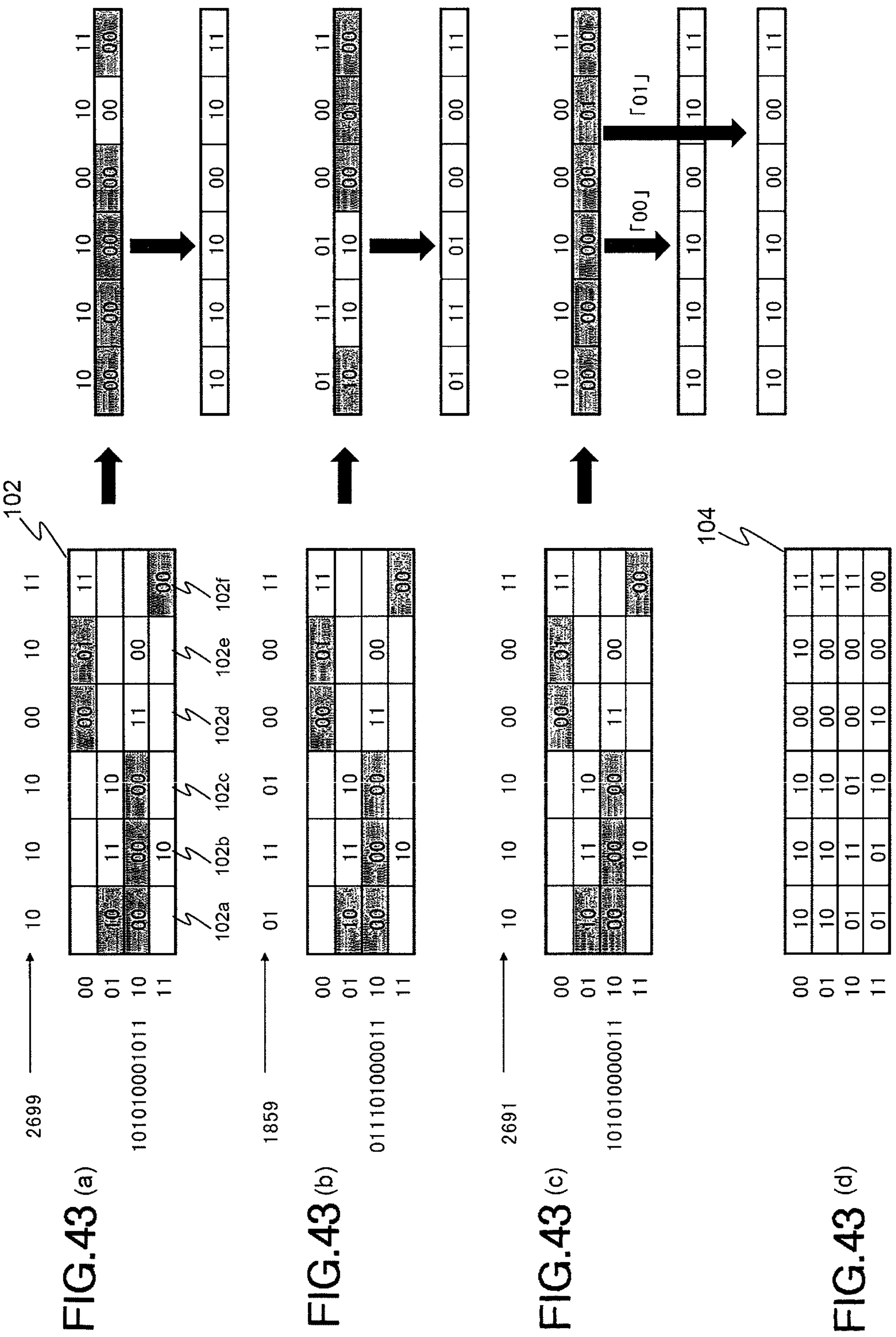
FIGS. 43(*a*) to 43(*d*) are diagrams illustrating a search operation of the SRAM-CAM illustrating the fifth example of the present invention.

FIGS. 43(*a*) to 43(*d*) are diagrams illustrating a search operation of the SRAM-CAM according to [Example 5] of the present invention.

FIGS. 43(*a*) to 43(*d*) illustrate whether or not the input data is correctly searched when the portions illustrated in FIGS. 42(*a*) to 42(*e*), in which addresses overlap with each other, that is, when the dark-shaded entries are treated as entries "not to be considered (don't care)".

FIG. 43(*a*) illustrates a case in which the key data "2699" as the search data has been input. The key data "2699" as the search data is expressed by "10 10 10 00 10 11" in binary, and is divided into six pieces of key data by two bits by the control circuit 105. The divided key data is used respectively as addresses for accessing the "locations with which an entry address is registered" allocated to the y axis of the six-separated search memory mat 102. First, when the control circuit 105 reads the entry address "00" from the first separate memory 102*a* using the first divided key data as an address, an address collision has been caused in the data. Thus, the data is processed as data "not to be considered (don't care)". Therefore, the control circuit 105 excludes the data read from the first separate memory 102*a* from the search. Further, the control circuit 105 accesses each of the separate memories 102*b*, 102*c*, 102*d*, and 102*f* using respectively the second divided key data "10", the third divided key data "10", the fourth divided key data "00", and the sixth divided key data "11" as addresses. However, an address collision has been caused in these accesses, and thus the control circuit 105 excludes the read data from the search by the "no-considering (don't care)" processing. Meanwhile, the control circuit 105 can read the entry address "00" from the fifth separate memory 102*e* using the fifth divided data "10" as an address.

As illustrated in FIG. 43(*a*), data actually used for the search becomes the entry address "00" read from the fifth separate memory 102*e* among the data read from the search memory mat 102 by the key data "2699" as the search data.

Therefore, when the control circuit 105 reads a value of the key data accessed by the entry address "00", using the verification memory mat 104, the value becomes "10 10 10 00 10 11". It is found that the value is consistent with the key data as the input data. That is, the control circuit 105 compares the output data that is the key data from the verification memory mat 104 and the input data, confirms correctness, and then outputs the entry address.

FIG. 43(*b*) illustrates a case in which the key data "1859" as the search data has been input. The key data "1859" as the search data is expressed by "01 11 01 00 00 11", and is divided into six pieces of key data by two bits by the control circuit 105. The divided key data is used respectively as addresses for accessing the "location with which an entry address is registered" allocated to the y axis of the six-separated search memory mat 102. The control circuit 105 reads data of the first separate memory 102*a* using the first divided key data "01" as an address. However, an address collision has been caused in the data. Thus, the "not-considering (don't care)" processing is performed. Further, when reading data from the second separate memory 102*b* using the second divided key data "11" as an address, the control circuit 105 can read the entry address "10". Further, when reading data from the third separate memory 102*c* using the third divided key data "01" as an address, the control circuit 105 can obtain the entry address "10".

Note that accesses to the separate memories 102*d*, 102*e*, and 102*f* using respectively the fourth divided key data "00", the fifth divided key data "00", and the sixth divided key data "11" as addresses become excluded from the search by the "not-considering (don't care)" processing.

As illustrated in FIG. 43(*b*), values read from the search memory mat 102 by the key data "1859" as the search data result in the entry address "10" that is an output from the second separate memory 102*b*, and the entry address "10" that is an output from the third separate memory 102*c*.

When a value of the key data accessed using the entry address "10" as an address is read using the verification memory mat 104, the value becomes "01 11 01 00 00 11", and it is found that the value is consistent with the key data as the search data. That is, the control circuit 105 confirms that the output data as the key data from the verification memory mat 104 is correct as compared with the search data, and then outputs the entry address.

FIG. 43(*c*) illustrates a case in which "2691" has been input as the key data as the search data. The key data "2691" as the search data is expressed by "10 10 10 00 00 11" in binary. The control circuit 105 divides the binary data of the key data "2691" into six pieces of key data by two bits. Each of the divided key data is used as addresses for accessing the "locations with which an entry address is registered" allocated to the y axis of the six-separated search memory mat 102. When data is read from the first separate memory 102*a* using the first divided key data "10" as an address, the "not-considering (don't care)" processing is performed. Further, when data of each of the separate memories 102*b*, 102*c*, 102*d*, 102*e*, and 102*f* is read using the second divided key data "10", the third divided key data "10", the fourth divided key data "00", the fifth divided key data "00", and the sixth divided key data "11" as addresses, the "not-considering (don't care)" processing is performed, and the data becomes excluded from the search. That is, in the example illustrated in FIG. 43(*c*), an address collision has been caused in all division digits that are division of the key data.

In this case, the control circuit 105 first reads the entry addresses written into the addresses from the addresses of the separate memories 102*a* to 102*f* treated as addresses "not to be considered (don't care)". That is, even if a collision is caused, one entry address has been written into the separate memories 102*a* to 102*f*, together with the collision flag. The control circuit 105 reads the entry address written together with the collision flag from each of the separate memories 102*a* to 102*f* in advance. Then, the control circuit 105 sequentially refers to the verification memory mat 104 illustrated in FIG. 43(*e*) using the entry address written together with the collision flag. In the example illustrated in FIG. 43(*e*), the entry addresses in a collision state are "00" and "01". When the control circuit 105 first reads a value of the key data corresponding to the entry address "00" from the verification memory mat 104, it is found that the value is "10 10 10 00 10 11". This key data "10 10 10 00 10 11" is not consistent with the key data input as the data to be searched. Therefore, the control circuit 105 determines that "00" is not an entry address that the control circuit 105 seeks. Next, when the control circuit 105 reads a value of the key data corresponding to the entry address "01" of the verification memory mat 104, it is found that the value is "10 10 10 00 00 11". The key data "10 10 10 00 00 11" is consistent with the key data input as the data to be searched. Therefore, the control circuit 105 can determine that "01" is the entry address that the control circuit 105 seeks. Then, the control circuit 105 outputs the entry address "01" as a search result. In this way, even if all the divided search data is in the collision state, the control circuit 105 sequentially refers to the verification memory mat 104 with the entry address in the collision state, and can thereby extract the key data consistent with the key data.

That is, in the example of the present invention, when a collision of addresses is caused at the time of the processing of writing an entry address, the "not-considering (don't care)" processing is performed. In the "not-considering (don't care)" processing, either (1) stopping the writing operation of the entry address, or (2) performing processing of overwriting the already-written entry address with another entry address is performed. Therefore, the search memory mat 102 is in a state where the first-written entry address has been written in the former case (1), while the search memory mat 102 is in a state where the finally-written entry address has been written in the latter case (2). Therefore, even if the collision is caused in the address, there is a possibility that the address include an entry address to be searched. Therefore, the example of the present invention focuses on the possibility, and extracts the entry address included in the address in which the collision has been caused, so as to increase the possibility that the entry address to be searched can be found. Accordingly, in the example of the present invention, even if a collision state is caused in all columns of the search data input at the time of search, a search result can be output if an entry address to be searched is included in the search data.

Example 6

First, as a premise, at least the following numbers are required when a search memory mat 102 is separated, as described above.

$$N = L/\log_2 \cdot M \qquad \text{(Expression)}$$

L: key data length

M: Total number of entries

N: The number of separations of the search memory mat (the minimum number of the separate memories)

For example, when the key data length is 32 bits, and the total number of entries of the search memory mat is 8 bits and 256 words, four separate memories, which is the minimum number of separate memories, are required. Further, when the key data length is the same, if the total number of entries of the search memory mat is increased, the minimum necessary number of separations is decreased. However, if the number of separate memories is decreased, distribution of information becomes small, and the collision probability tends to increase. Therefore, in the present example, the number of separate memories is increased to decrease the collision frequency, as described below. Note that, in a case of the data length of 12 bits, each bit is normally identified by 1st to 12th bit. However, hereinafter, for convenience description will be given where each bit is called 0th to 11th bit.

Figure 44:
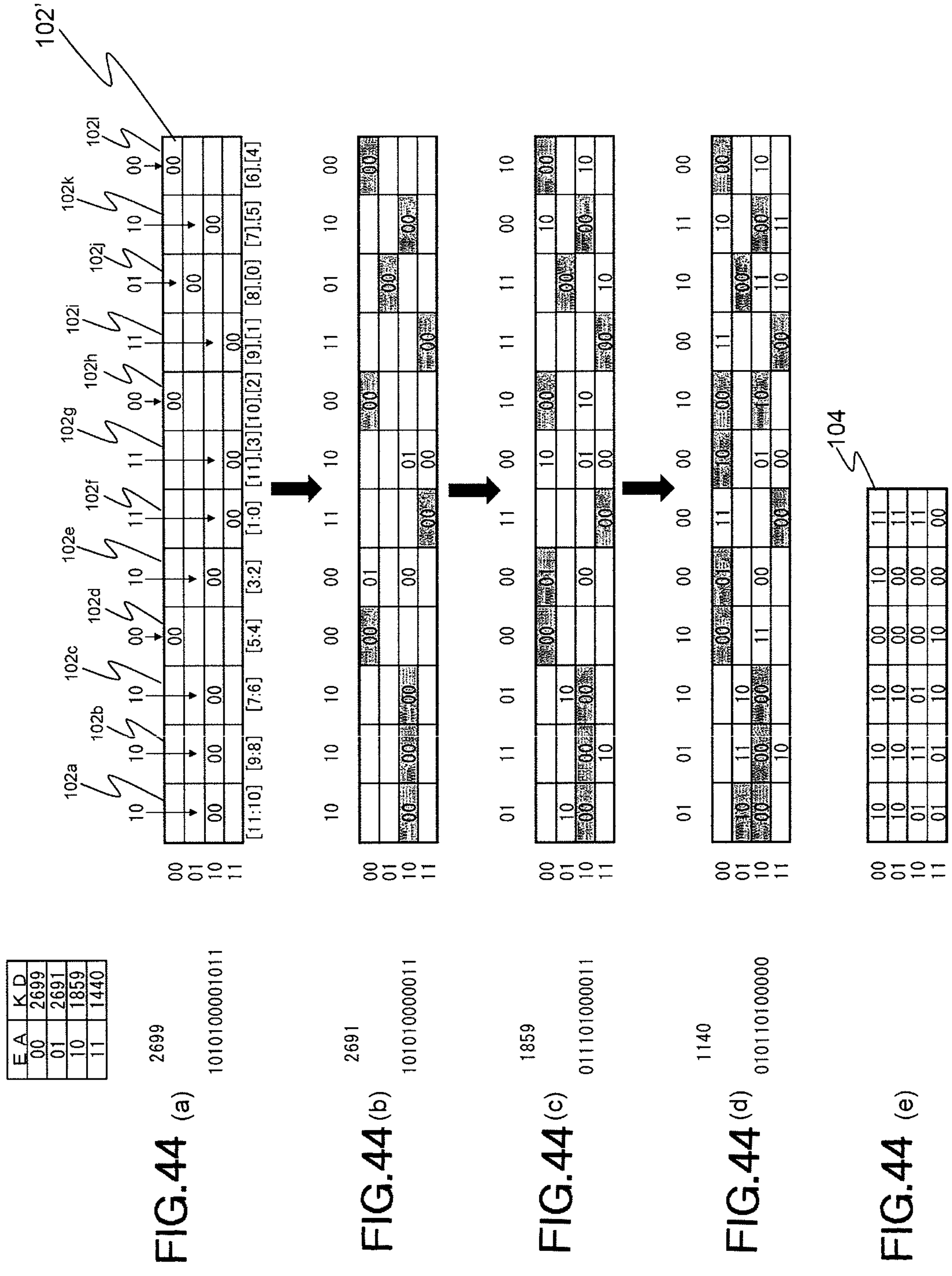
FIGS. 44(*a*) to 44(*e*) are diagrams illustrating a writing operation of the SRAM-CAM illustrating the fourth example of the present invention.

FIGS. 44(*a*) to 44(*e*) are diagrams illustrating a writing operation of a search memory mat illustrating a sixth example of the present invention. A writing operation with respect to the search memory mat 102 in the present invention will be described with reference to FIGS. 44(*a*) to 44(*e*). Note that in the present example a case is assumed in which an entry address is two bits and four words, and the key data length is 12 bits. In this case, the minimum necessary number of separate memories is six according to the above expression. FIGS. 44(*a*) to 44(*e*) illustrate a case in which the search memory mat 102 is separated into six separate memories 102*a* to 102*f*, and further includes six additional separate memories 102*g* to 102*l*, so that there are twelve separate memories. That is, in the present example, the number of separations of the search memory mat 102 is twice the number of separations in [Example 1]. Further, in the present example a case is assumed in which "2699""2691""1859""1440" are written into entry addresses "00""01""10""11" as key data.

Note that, prior to description of a specific operation on writing data in the search memory mat 102, data to be written into the additional separate memories 102*g* to 102*l* will be described.

In FIG. 44(*a*), the numerals such as [1:0] illustrated in a lower part of the search memory mat 102 mean a "key data selection bit". The "key data selection bit" here is information for selecting, for each of the plurality of separate memories 102*a* to 102*f*, a bit number of key data to be stored in each separate memory. For example, in the example illustrated in FIG. 44(*a*), the "key data selection bit" indicates, among binary data of input 12-bit key data, the 0th bit and the 1st bit are to be stored in the sixth separate memory 102*f*, the 2nd bit and the 3rd bit are to be stored in the fifth separate memory 102*e*, the 4th bit and the 5th bit are to be stored in the fourth separate memory 102*d*, the 6th bit and the 7th bit are to be stored in the third separate memory 102*c*, the 8th bit and the 9th bit are to be stored in the second separate memory 102*b*, and the 10th bit and the 11th bit are to be stored in the first separate memory 102*a*.

Further, as illustrated in FIG. 44(*a*), the "key data selection bit" is set such that, among the 12-bit key data, the 4th bit and the 6th bit are to be stored in the twelfth separate memory 102*l*, the 5th bit and the 7th bit are to be stored in the eleventh separate memory 102*k*, the 0th bit and the 8th bit are to be stored in the tenth separate memory 102*j*, the 1st bit and the 9th bit are to be stored in the ninth separate memory 102*i*, the 2nd bit and the 10th bit are to be stored in the eighth separate memory 102*h*, and the 3rd bit and 11th bit are to be stored in the seventh separate memory 102*g*.

As described above, in the present example, the input 12-bit key data is expanded to 24 bits, and is distributed and stored in the twelve separate memories as a total including the additional separate memories. Therefore, in the six additional separate memories, the bit data to be stored in the six separate memories are duplicated to be stored. Note that the duplication of the bit data can be set to a desired value, and thus, the number of additional SRAMs can be arbitrarily set.

Next, a writing operation with respect to the memory mat 102 will be described in detail.

When the key data "2699" input as the data to be written into the entry address "00" is expressed in binary data, it becomes "10 10 10 00 10 11". Then, as described above, the bit data to be stored in the additional separate memories is duplicated to be added to the input key data according to the "key data selection bit". That is, 12-bit data is added to the 12-bit key data as lower-order bits. Accordingly, the added key data is made to be "10 10 10 00 10 11 11 00 11 01 10 00" (24 bits). Data is written into the search memory mat 102 using this value as an address of a y axis of the twelve-separated search memory mat 102. At this time, the data written into the search memory mat is "00" input as the entry address of the key data "2699".

As illustrated in FIG. 44(*a*), 12 bits according to the key data selection bit are added to a lower order of the 12-bit key data "2699". Therefore, the key data "2699" is expressed in 24 bits. Then, the data is divided into twelve pieces of data and is expressed by "10""10""10""00""10""11""11""00""11""01""10""00". The control circuit 105 writes the entry address "00" in the twelve-separated mats 102*a* to 102*l* using these twelve pieces of divided key data as addresses. That is, the entry address "00" is written in the first separate memory 102*a* using the first divided key data "10" as an address. Next, the entry address "00" is written into the second separate memory 102*b* using the second divided key data "10" as an address. Further, the entry address "00" is written into the third separate memory 102*c* using the third divided key data "10" as an address. Similarly, the entry address "00" is written into the fourth to sixth separate memories 102*d* to 102*f* using the fourth to sixth divided key data "00""10""11" as addresses. Further, similarly, the entry address "00" is written into the six additional separate memories of the seventh to twelfth separate memories 102*g* to 102*l* using the seventh to twelfth divided key data "11""00""11""01""10""00" as addresses.

This results in that the entry address "00" has been written into the search memory mat 102 designated by the key data "2699".

Similarly, when the key data "2691" input as the data to be written into the entry address "01" is expressed in binary, it becomes "10 10 10 00 00 11". Then, as described above, the bit data to be stored in the additional separate memories is duplicated to be added to the input key data according to the key data selection bit. That is, 12-bit data is added to the 12-bit key data as lower-order bits. The added key data becomes "10 10 10 00 00 11 10 00 11 01 10 00" (24 bits). The 24-bit key data is divided into twelve pieces of divided key data. Then, data is written into the search memory mat 102 using the divided key data as addresses for accessing the y axis of the twelve-separated search memory mat 102. At this time, the data written into the search memory mat 102 is "01" input as the entry address.

In FIG. 44(*b*), 12 bits are added to a lower order of the key data "2691" according to the key data selection bit as described above, and then, the key data is divided into twelve pieces of key data, and is expressed by "10""10""10""00""00""11""10""00""11""01""10""00". The entry address "01" is written into the separated search memory mat 102 using the divided key data as addresses. That is, the entry address "01" is written into the first separate memory 102*a* using the first divided key data "10" as an address. At this time, the entry address "00" has been already written into the address of the separate memory 102*a* by the writing of the key data "2699", and an address collision is caused. The filled portions in FIG. 44(*b*) are portions where the collision has been caused, and in these portions where the collision has been caused, the divided key data is processed as data "not to be considered (don't care)". In FIG. 44(*b*), further, the entry address "01" is written into the second separate memory 102*b* using the second divided key data "10" as an address. Further, the entry address "01" is written respectively into the third to sixth separate memories 102*c*, 102*d*, 102*e*, and 102*f* using the third to sixth divided key data "10""00""00""11" as addresses. However the second to fourth, and sixth addresses have been already used in the writing of the key data "2699", and are thus processed as addresses "not to be considered (don't care)". Following that, the entry address "01" is written into the seventh to twelfth six additional separate memories 102*g* to 102*l* using respectively the seventh to twelfth divided key data "10""00""11""01""10""00" as addresses. However, the eighth to twelfth addresses have been already used by the writing of the divided key data "2699", and are thus processed as addresses "not to be considered (don't care)".

This results in that the entry address "01" has been written into the separate memories designated by the key data "2691". Similarly, the entry addresses "10""11" are written into the search memory mat 102 using the key data "1859""1440" as addresses. As illustrated in FIG. 44(*c*), there are address collisions in the fourth to sixth, and ninth separate memories by the writing of the key data "1859". Further, as illustrated in FIG. 44(*d*), in the key data "1440", there are address collisions in the first, third, fifth, seventh, eighth, and twelfth separate memories.

FIG. 44(*e*) illustrates a writing state of a verification memory mat (SRAM) 104.

As illustrated in FIG. 44(*e*), in the verification memory mat, the binary data of the key data "2699" is written into the entry address "00", the binary data of the key data "2691" is written into the entry address "01", the binary data of the key data "1859" is written into the entry address "10", and the binary data of the key data "1440" is written into the entry address "11".

Figures 45A, 45B, 45C, 45D:
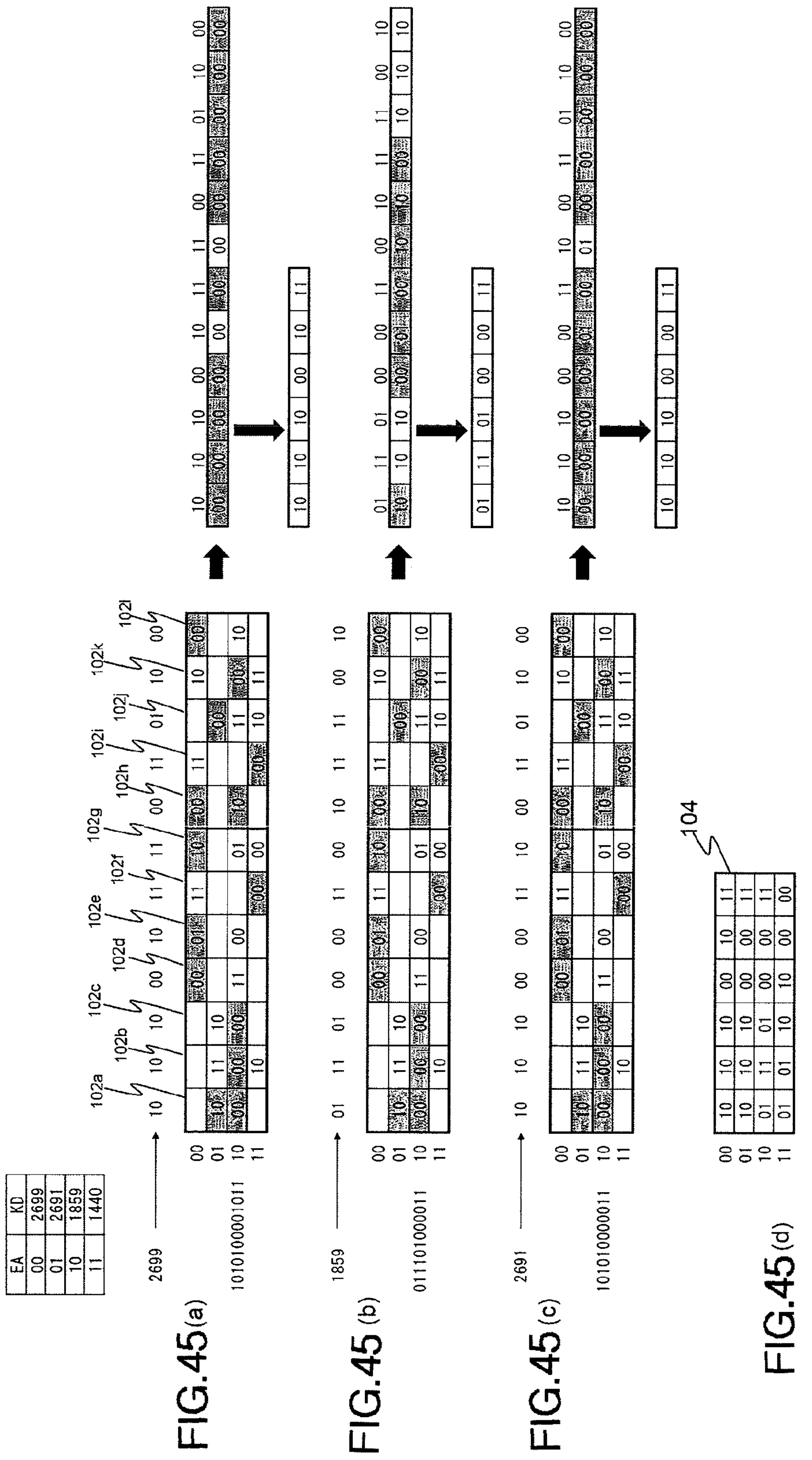
FIGS. 45(*a*) to 45(*d*) are diagrams illustrating a search operation of the SRAM-CAM illustrating the fourth example of the present invention.

FIGS. 45(*a*) to 45(*d*) illustrate a search operation of the search memory mat 102 in [Example 6] of the present invention. FIGS. 45(*a*) to 45(*d*) illustrate whether or not the input data is correctly searched when the portions illustrated in FIGS. 44(*a*) to 44(*e*), in which addresses overlap with each other, that is, the dark-shaded entries, are treated as entries "not to be considered (don't care)".

FIG. 45(*a*) illustrates a case in which the key data "2699" has been input as the search data. The key data "2699" is expressed by "10 10 10 00 10 11" in binary data. Then, as illustrated in FIGS. 44(*a*) to 44(*e*), the 12-bit data is added to the 12-bit key data as lower-order bits according to the key data selection bit. The added key data becomes "10 10 10 00 10 11 11 00 11 01 10 00" (24 bits). Each of the divided key data is used as addresses for accessing the "locations with which an entry address is registered" allocated to the y axis of the twelve-separated search memory mat 102. When the entry address that is the data of the first separate memory 102*a* is read using the first divided key data "10" as an address, an address collision has been caused, and thus, the "not-considering (don't care)" processing is performed. Therefore, the data read from the separate memory 102*a* becomes excluded from the search. Similarly, the entry addresses are read from the search memory mat 102 using the second and subsequent divided key data as addresses. Here, when data is read from the fifth separate memory 102*e* using the fifth divided key data "10" as an address, the entry address "00" is read. Further, the seventh separate memory 102*g* is read using the seventh divided key data "11" as an address, the entry address "00" is obtained. As for other divided key data, the data becomes excluded from the search by the "not-considering (don't care)" processing.

As illustrated in FIG. 45(*a*), the data to be used for the search among the data read from the search memory mat 102 by the key data "2699" as the search data results in the entry address "00" that is outputs of the fifth separate memory 102*e* and the seventh separate memory 102*g*.

When a value of the key data accessed using the entry address "00" as an address is read using the verification memory mat 104, the value becomes "10 10 10 00 10 11", and it is found that the value is consistent with the key data as the search data. That is, the control circuit 105 compares the key data as the output data from the verification memory mat 104 and the search data, confirms that the key data is consistent with the search data, and then outputs the entry address.

FIG. 45(*b*) illustrates a case in which the key data "1859" has been input as the search data. The key data "1859" is expressed by "01 11 01 00 00 11". As illustrated in FIGS. 44(*a*) to 44(*e*), the 12-bit data is then added to the 12-bit key data as lower-order bits according to the key data selection bit. The added key data becomes "01 11 01 00 00 11 00 10 11 11 00 10" (24 bits). Each of the divided key data is used as addresses for accessing the "locations with which an entry address is registered" allocated to the y axis of the twelve-separated search memory mat 102. Data of the first separate memory 102*a* is read using the first divided key data "01" as an address. However, an address collision has been caused. Therefore, a state has been made where the "not-considering (don't care)" processing is to be performed. Therefore, the first divided key data becomes excluded from the search. When data is read from the second separate memory 102*b* using the second divided key data "11" as an address, the entry address "10" is read. When data is read from the third separate memory 102*c* using the third divided key data "01" as an address, the entry address "10" is obtained.

Accesses to each of the separate memories using the fourth "00", the fifth "00", the sixth "11", the seventh "00", the eighth "10", and the ninth "11" as addresses become excluded from the search by the "not considering (don't care)" processing. Further, when data is read from the tenth separate memory 102*j* using the tenth divided key data "11" as an address, the entry address "10" is read. When data is read from the eleventh separate memory 102*k* using the eleventh divided key data "00" as an address, the entry address "10" is read. Further, when data is read from the twelfth separate memory 102*l* using the twelfth divided key data "10" as an address, the entry address "10" is obtained.

As illustrated in FIG. 45(*b*), the value read from the search memory mat 102 by the key data "1859" as the search data results in the entry address "10" that is outputs of the second separate memory 102*b*, the third separate memory 102*c*, the tenth separate memory 102*j*, the eleventh separate memory 102*k*, and the twelfth separate memory 102*l*.

When a value of the key data accessed by the entry address "10" is read using the verification memory mat 104, the value becomes "01 11 01 00 00 11", and it is found that the value is consistent with the key data as the search data. That is, the control circuit 105 compares the key data that is the output data from the verification memory mat 104 and the search data, confirms that the key data is consistent with the search data, and then outputs the entry address.

FIG. 45(*c*) illustrates a case in which "2691" has been input as the key data as the search data. The key data "2691" as the search data is expressed by the binary data "10 10 10 00 00 11". Then, as described in FIGS. 44(*a*) to 44(*e*), the 12-bit data is added to the 12-bit key data as lower-order bits according to the key data selection bit. The added key data becomes "10 10 10 00 00 11 10 00 11 01 10 00" (24 bits). Each of the divided key data is used as addresses for accessing the "locations with which an entry address is registered" allocated to a y axis of a twelve-separated search memory mat 102'. When data of the first separate memory 102*a* is read using the first divided key data "10" as an address, there is an address collision, and thus the "not-considering (don't care)" processing is performed. When data of each of the separate memories 102*b*, 102*c*, 102*d*, 102*e*, and 102*f* is read using the second "10", the third "10", the fourth "00", the fifth "00", and the sixth "11" as addresses, there are address collisions, and thus the "not-considering (don't care)" processing is performed.

Following that, when data is read from the seventh separate memory 102*g* using the seventh divided key data "10" as an address, the entry address "01" is read. Meanwhile, when data of each of the separate memories is read using the eighth "00", the ninth "11", the tenth "01", the eleventh "10", and the twelfth "00" as addresses, there are address collisions. Thus, the "not-considering (don't care)" processing is performed, and the data becomes excluded from the search.

As described in FIG. 45(*c*), the value read from the search memory mat 102 by the key data "2691" as the search data results in the entry address "01" that is an output of the seventh separate memory 102*g*.

When a value of the key data accessed by the entry address "01" is read using the verification memory mat 104, the value becomes "10 10 10 00 00 11", and it is found that the value is consistent with the key data as the search data. That is, the control circuit 105 compares the key data that is output data from the verification memory mat 104 and the search data, confirms that the key data is consistent with the search data, and outputs the entry address.

Here, a case is considered with reference to FIG. 45(*c*), in which the search memory mat 102 is tentatively separated into six separate memories 102*a* to 102*f*. In this case, when the key data "2691" as the search data is input, the "2691" is expressed by "10 10 10 00 00 11" in binary. Each of the divided key data is used as addresses for accessing the "locations with which an entry address is registered" allocated to the y axis of the six-separated search memory mat. When data of each of the separate memories is read using the first "10", the second "10", the third "10", the fourth "00", the fifth "00", and the sixth "11" as addresses, there are address collisions in all data. Therefore, the "not-considering (don't care)" processing is performed. Therefore, in this condition, it is insufficient that the search memory mat 102 is separated into the six separate memories 102*a* to 102*f* only, and a search result cannot be output from the search memory mat.

Therefore, according to the present example, the collision frequency can be decreased by an increase in the number of separate memories as described above. Further, according to the present example, a possibility that a search result can be output can be enhanced.

While the present invention has been described according to the examples, the present invention is not limited to the examples described above, and includes various modifications. That is, the examples have described the content of the present invention in detail for making the invention easy to understand. Therefore, the present invention is not limited to one that includes all of the configurations described above.

For example, while an example in which the semiconductor device of the present invention is configured with the SRAM has been described, the present invention can be similarly realized by another memory circuit. Especially, as the present invention, a high-speed non-volatile memory, for example, an MRAM can be favorably used.

REFERENCE SIGNS LIST

101: Proximity cash memory mat
102, 1002: Search memory mat
102*a*, 102*b*, 102*c*, . . . 102*l*: Separate memory
103: Comparison and latch circuit
104, 1004: Verification memory
105: Control circuit
105*l*: Input unit
1052: Division unit
1053: Writing unit
1054: Collision information storage unit
1055: Reading unit
1056: Verification unit
1057: Output unit
106: Encoding circuit

The invention claimed is:

1. A semiconductor device, comprising:
a search memory mat configured such that a location with which an entry address is registered is allocated in a y-axis direction, and key data is allocated in an x-axis direction; and
a control circuit connected to the search memory mat, wherein the search memory mat includes a plurality of separate memories configured such that a region to which the key data is allocated is separated into a plurality of regions along the y-axis direction, and
the control circuit includes
an input to which key data is input,
a divider that divides the key data input to the input into a plurality of pieces of key data, and
a writer that allocates each of divided key data by the divider to the plurality of separate memories using the divided key data as an address, and writes an entry address corresponding to each of the divided key data into the plurality of separate memories.

2. The semiconductor device according to claim 1,
wherein the control circuit further includes
a collision information storage that writes information indicating a collision of the entry addresses into the plurality of separate memories, when a plurality of entry addresses is written into the same address of the plurality of separate memories by the writer.

3. The semiconductor device according to claim 2,
wherein the control circuit further includes
when key data as data to be searched is input to the input, and the divider divides the key data as data to be searched into a plurality of pieces of key data, a reader accesses the plurality of separate memories using each of the divided key data by the divider as an address, and reads an entry address corresponding to each of the divided key data from the plurality of separate memories.

4. The semiconductor device according to claim 3,
wherein when the information indicating a collision has been written into the plurality of separate memories when the reader accesses the plurality of separate memories using the divided key data by the divider as an address, the reader does not read an entry address corresponding to the divided key data and processes the divided key data as data not to be considered.

5. The semiconductor device according to claim 4, further comprising:
a verification memory mat that stores each entry address and each key data in association with each other,
wherein the control circuit further includes a verifier which reads, from the verification memory mat, key data corresponding to an entry address read by the reader, and confirms whether or not the key data is consistent with the key data as data to be searched input to the input.

6. The semiconductor device according to claim 1, further comprising:
an encoding circuit that encodes key data according to predetermined processing, and outputs the encoded key data to the input of the control circuit.

7. The semiconductor device according to claim 4,
wherein when the information indicating a collision has been written into all of the separate memories when the reader accesses the plurality of separate memories using each of the divided key data by the divider as an address, the reader reads entry addresses already written into the all of the plurality of separate memories, and
the verifier sequentially refers to the verification memory mat using the entry addresses read by the reader, and after extracting a key address consistent with the key data as data to be searched from the verification memory mat, outputs an entry address corresponding to the extracted key data.

8. A method of writing an entry address corresponding to key data in a semiconductor device comprising a search memory mat configured such that a location with which the entry address is registered is allocated in a y-axis direction, and key data is allocated in an x-axis direction, and the search memory mat comprising a plurality of separate memories configured such that a region to which the key data is allocated is separated into a plurality of regions along the y-axis direction, wherein the method comprises:

inputting key data to a control circuit of the semiconductor device;

dividing, by the control circuit, the input key data into a plurality of pieces of key data; and allocating, by the control circuit, each of divided key data to the plurality of separate memories using the divided key data as an address, and writing, by the control circuit, an entry address corresponding to each of the divided key data in the plurality of separate memories.

9. A method of reading the entry address written into the semiconductor device according to claim 8, further comprising:

inputting, to the control circuit, key data as data to be searched;

dividing, to the control circuit, the input key data as data to be searched into a plurality of pieces of key data; and accessing, by the control circuit, the plurality of separate memories using each of divided key data as an address, and reading, by the control circuit, an entry address corresponding to each of the divided key data from the plurality of separate memories.

* * * * *